United States Patent [19]

Kawahara et al.

[11] Patent Number: 6,091,640
[45] Date of Patent: Jul. 18, 2000

[54] SEMICONDUCTOR INTEGRATED CIRCUIT WITH MULTIPLE WRITE OPERATION MODES

[75] Inventors: Takayuki Kawahara, Higashiyamato; Hiroshi Sato, Ome; Atsushi Nozoe, Ome; Keiichi Yoshida, Ome; Satoshi Noda, Ome; Shoji Kubono, Akishima; Hiroaki Kotani, Ome; Katsutaka Kimura, Akishima, all of Japan

[73] Assignees: Hitachi, Ltd.; Hitachi ULSLI Engineering Corp., both of Tokyo, Japan

[21] Appl. No.: 08/941,676

[22] Filed: Sep. 30, 1997

[30] Foreign Application Priority Data

Sep. 30, 1996 [JP] Japan ................................. 8-258215

[51] Int. Cl.[7] .................................................. G11C 11/34
[52] U.S. Cl. ................................ 365/185.28; 365/185.22
[58] Field of Search ......................... 365/185.24, 185.19, 365/185.22

[56] References Cited

U.S. PATENT DOCUMENTS

| | | | |
|---|---|---|---|
| 5,218,569 | 6/1993 | Banks | 365/189.01 |
| 5,412,601 | 5/1995 | Sawada et al. | 365/185 |
| 5,440,509 | 8/1995 | Momodomi et al. | 365/185 |

FOREIGN PATENT DOCUMENTS 9601907  7/1996  WIPO .

OTHER PUBLICATIONS

Torelli et al. "An improved method for programming a word-erasable EEPROM", Alta Frequenza, vol. LII–N. 6, Nov.–Dec. 1983, pp. 487–494.

Tanaka et al, "High–Speed Programming and Program–Verify Methods Suitable for Low–Voltage Flash Memories", 1994 Symposium on Circuits, Digest of Technical Papers.

*Primary Examiner*—David Nelms
*Assistant Examiner*—M. Tran
*Attorney, Agent, or Firm*—Antonelli, Terry, Stout & Kraus, LLP

[57] ABSTRACT

A control of a flash memory includes control for supplying a pulse-shaped voltage to each of non-volatile memory cells until a threshold voltage of the non-volatile memory cell having a first threshold voltage is changed to a second threshold voltage. The control involves a first write mode (coarse write) in which the amount of change in threshold voltage of each non-volatile memory cell, which is varied each time the pulse-shaped voltage is applied, is relatively rendered high, and a second write mode (high-accuracy write) in which the amount of change in threshold voltage thereof is relatively rendered low. As compared with the high-accuracy mode, the number of pulses required to change the threshold voltage of each memory cell is smaller than that in the coarse write mode. Therefore, the number of verify operations at the time that the coarse write mode is used, is small and hence the entire write operation can be speeded up.

40 Claims, 65 Drawing Sheets

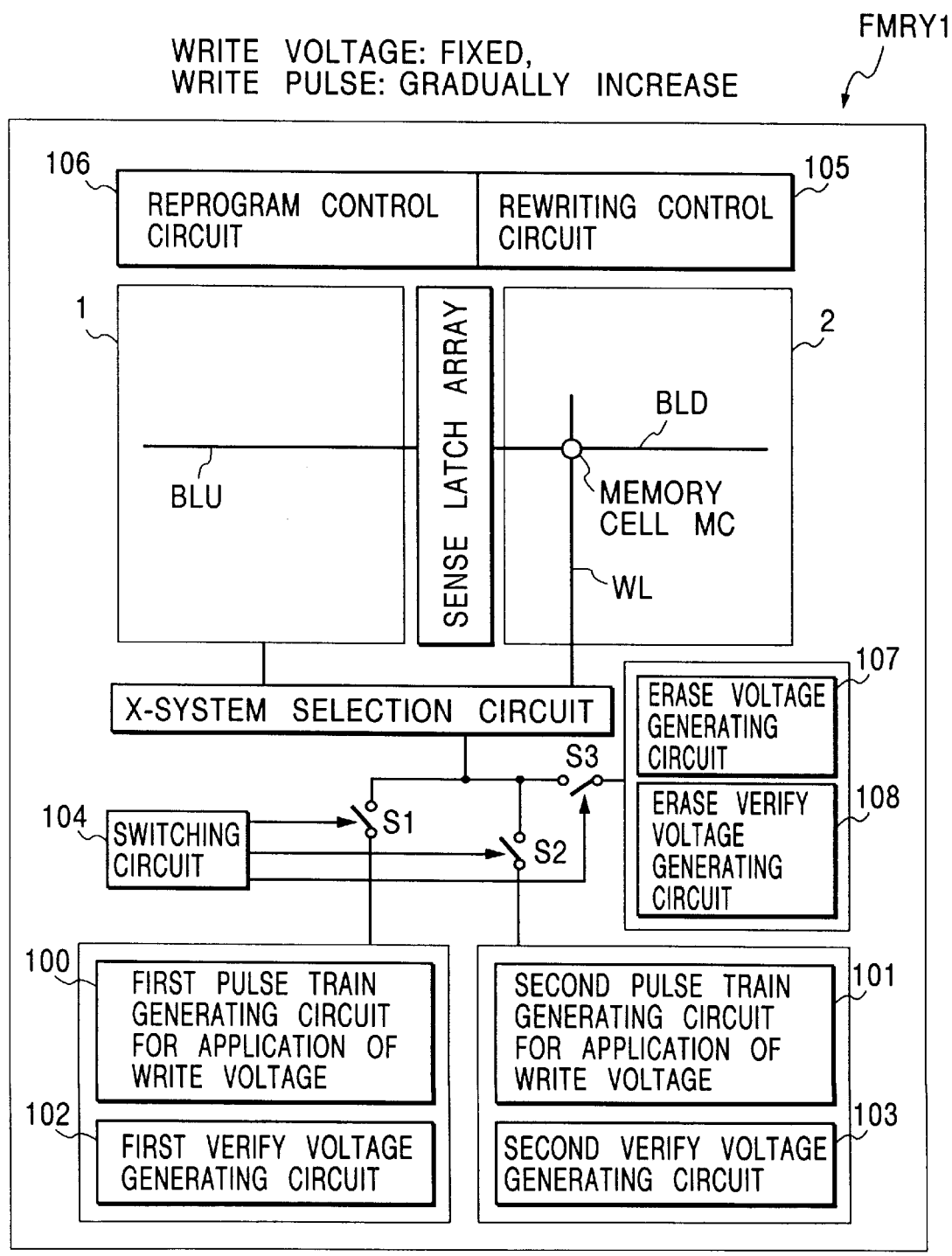

WRITE CHARACTERISTIC

WRITE CHARACTERISTIC

THRESHOLD VOLTAGE DISTRIBUTION

CHARACTERISTIC OBTAINED BY FIRST PULSE TRAIN GENERATING MEANS FOR APPLICATION OF WRITE VOLTAGE

THRESHOLD VOLTAGE DISTRIBUTION

CHARACTERISTIC OBTAINED BY SECOND PULSE TRAIN GENERATING MEANS FOR APPLICATION OF WRITE VOLTAGE

WRITE CHARACTERISTIC

ΔVth1

WRITE CHARACTERISTIC

ΔVth2

THRESHOLD VOLTAGE DISTRIBUTION

Vt1 — ERASE
Vt2
Vt3 — WRITE
Vt4

CHARACTERISTIC OBTAINED BY FIRST WRITE VOLTAGE TRAIN GENERATING MEANS

THRESHOLD VOLTAGE DISTRIBUTION

Vt5 — ERASE
Vt6
Vt7 WRITE
Vt8

CHARACTERISTIC OBTAINED BY SECOND WRITE VOLTAGE TRAIN GENERATING MEANS

FIG. 8

| MEANS TO BE USED | FIRST PULSE TRAIN GENERATING MEANS FOR APPLICATION OF WRITE VOLTAGE (FIRST WRITE MODE) | SECOND PULSE TRAIN GENERATING MEANS FOR APPLICATION OF WRITE VOLTAGE (SECOND WRITE MODE) |
|---|---|---|
| THRESHOLD VOLTAGE DISTRIBUTION | 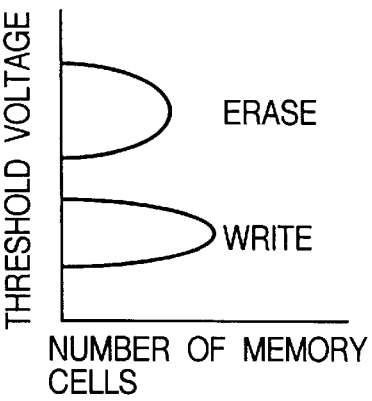 | 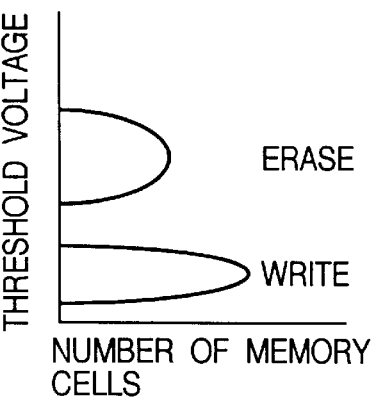 |
| EXAMPLE OF SWITCHING CONDITION | TILL RELOADED NUMBER OF TIMES CORRESPONDING TO TEN THOUSAND TIMES | RELOADED NUMBER OF TIMES CORRESPONDING TO TEN THOUSAND TIMES OR MORE |
| | HOLD DATA FOR ONE MONTH | HOLD DATA FOR TEN YEARS |
| | SECTOR A | SECTOR B |
| | BLOCK A | BLOCK B |
| | CHIP A | CHIP B |

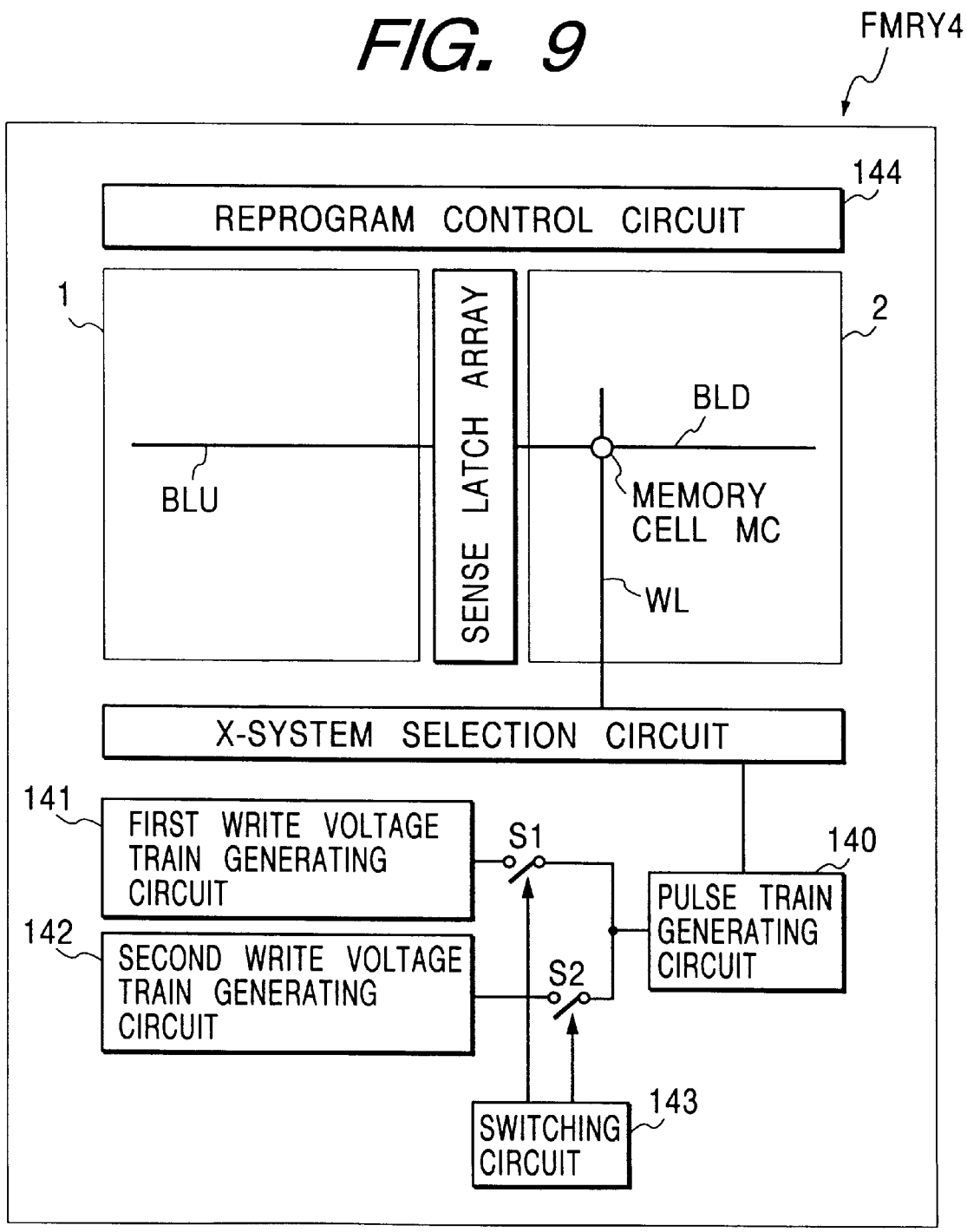

WRITE CHARACTERISTIC

WRITE CHARACTERISTIC

WRITE CHARACTERISTIC

WRITE CHARACTERISTIC

THRESHOLD VOLTAGE DISTRIBUTION

CHARACTERISTIC BY FIRST WRITE VOLTAGE

THRESHOLD VOLTAGE DISTRIBUTION

CHARACTERISTIC BY SECOND WRITE VOLTAGE

BINARY MODE

MULTIVALUE MODE

READ DATA (BINARY) ON WL1, STORE DATA IN BUFFER

READ DATA (BINARY) ON WL2, STORE DATA IN BUFFER

CONVERT DATA INTO MULTIVALUED DATA, STORE DATA IN SENSE LATCH AND WRITE DATA INTO MEMORY CELL ON WL3 (MULTIVALUE)

EXAMPLE OF CONVERSION FROM BINARY DATA TO MULTIVALUED DATA

DIAGRAM SHOWING EXAMPLE OF CONVERSION
FROM BINARY DATA TO MULTIVALUED DATA

| NUMBER | 1 | 2 | 3 | 4 | 5 | 6 | 7 | 8 | 9 | 10 | .... |
|---|---|---|---|---|---|---|---|---|---|---|---|
| DATA OF BUFFER 152 | 0 | 1 | 1 | 0 | 1 | 0 | 1 | 1 | 0 | 0 | .... |
| DATA OF BUFFER 153 | 1 | 1 | 0 | 0 | 1 | 1 | 1 | 0 | 0 | 1 | .... |

WRITE DATA: THOSE OBTAINED BY ALTERNATERY ARRANGING DATA
OF BUFFERS 152 AND 153 AND DELIMITING DATA TWO BY TWO 0 1 1 1 1 0 0 0 1 1 0 1 1 1 1 0 0 0 0 1 ····

0 1 1 1 1 0 0 0 1 1 0 1 1 1 1 0 0 0 0 1 ····

REWRITING FROM BINARY TO MULTIVALUE (ERASED STATE)

REWRITING FROM BINARY TO MULTIVALUE (VERIFY VOLTAGE = Vt11)

REWRITING FROM BINARY TO MULTIVALUE (COMPLETION)

WRITE CHARACTERISTIC

WRITE CHARACTERISTIC

THRESHOLD VOLTAGE DISTRIBUTION

EXAMPLE OF AND MEMORY CELL

THRESHOLD VOLTAGE DISTRIBUTION

EXAMPLE OF NAND MEMORY CELL

FIRST THRESHOLD VOLTAGE DISTRIBUTION

FIRST THRESHOLD VOLTAGE DISTRIBUTION

SECOND THRESHOLD VOLTAGE DISTRIBUTION

SECOND THRESHOLD VOLTAGE DISTRIBUTION

THIRD THRESHOLD VOLTAGE DISTRIBUTION

AND MEMORY CELL

THIRD THRESHOLD VOLTAGE DISTRIBUTION

NAND MEMORY CELL

CHIP A

CHIP B

CHIP A

CHIP B

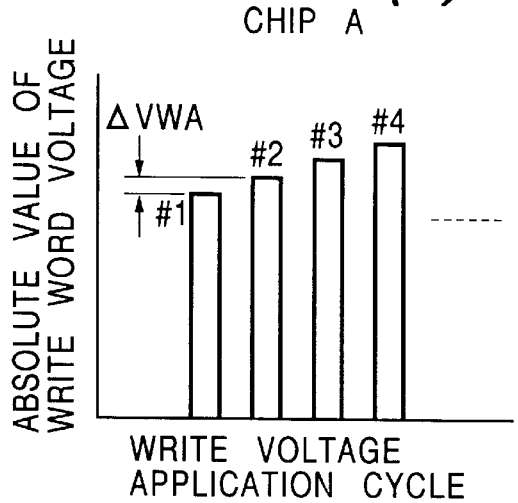
FIG. 35(a) CHIP A
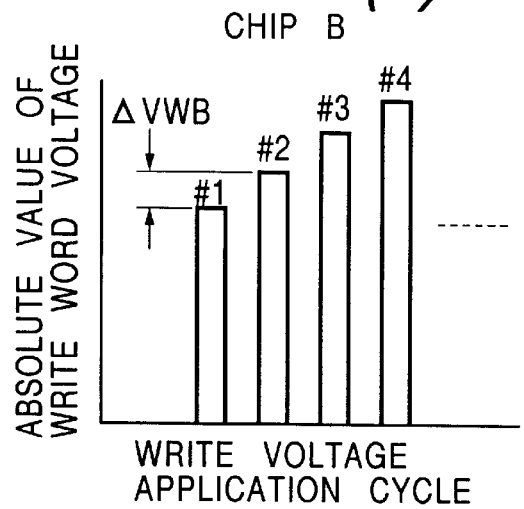
FIG. 35(b) CHIP B
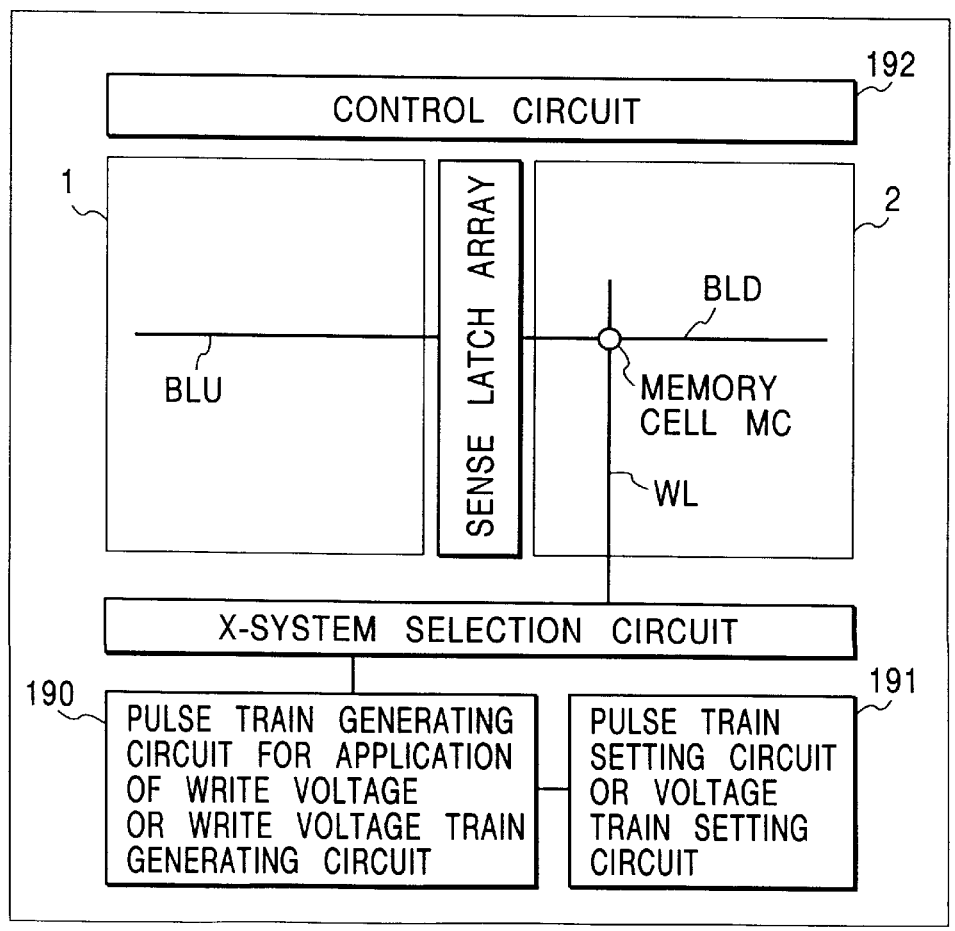
FIG. 36

EXAMPLE OF WRITE CHARACTERISTIC

EXAMPLE 1 OF APPLICATION OF WRITE VOLTAGE PULSE

EXAMPLE 2 OF APPLICATION OF WRITE VOLTAGE PULSE

EXAMPLE OF CAMERA USING THIS INVENTION

CLOSED STATE OF LENS COVER

EXAMPLE OF MEANS IN CAMERA

FIG. 56

| | NAND MEMORY CELL | |
|---|---|---|
| LAYOUT | (layout diagram showing SELECT GATE, CONTACT WITH M1 (DRAIN), CONTROL GATE, MEMORY cells 1, 2, ... m, SELECT GATE, DIFFUSED LAYER (SOURCE), with X and Y cross-section markers; Y cross-section shows CONTROL GATE, M1:B.L, FLOATING GATE) | X (cross-section) |
| CIRCUIT DIAGRAM | (circuit diagram showing BL, BL, SOURCE LINE, SELECT MOS, WL, WL, MEMORY, WL, SELECT MOS; • CONTACT, ○ OTHER CONNECTIONS) | |
| S.L MATERIAL | DIFFUSED LAYER+METAL (+MEMORY) | |

FIG. 57

| | NOR MEMORY CELL |
|---|---|
| LAYOUT | (layout diagram with MEMORY, DIFFUSED LAYER OR Poly-Si (THIRD LAYER) (SOURCE), CONTROL GATE, CONTACT WITH M1 (DRAIN), X-X cross-section; Y cross-section showing CONTROL GATE, M2: WORD SHUNT, M1: B.L, FLOATING GATE) |
| CIRCUIT DIAGRAM | (array of MEMORY cells with WL, BL, SOURCE LINE; • CONTACT ○ OTHER CONNECTIONS) |
| S.L MATERIAL | DIFFUSED LAYER+METAL |

FIG. 58

| | DINOR MEMORY CELL |
|---|---|
| LAYOUT | *(layout diagram showing SELECT GATE, MEMORY 1, 2, ...m, SEPARATE GATE MEMORY, CONTACT WITH M1 (DRAIN), CONTROL GATE, DIFFUSED LAYER (SOURCE), Poly-Si (THIRD LAYER) SUB B.L; cross sections along X and Y showing Poly-Si CONTROL GATE, M2: SUB DECODER SELECT, M1: B.L, FLOATING GATE)* |
| CIRCUIT DIAGRAM | *(circuit showing SELECT MOS, WL, WL, MEMORY, WL, BL, BL, SOURCE LINE, SUB B.L; • CONTACT, ○ OTHER CONNECTIONS)* |
| S.L MATERIAL | DIFFUSED LAYER+METAL |

FIG. 59

VOLTAGE APPLIED TO MEMORY

|  |  | READ | PROGRAM | ERASE |
|---|---|---|---|---|
| SELECTION | Vg | Vcc | −10V | 12V |
|  | Vd | 1V | 4V | −4V |
|  | Vs | 0V | OPEN | −4V |
| NON-SELECTION | Vg | 0V/OPEN | Vcc/0V | 0V/0V |
|  | Vd | 1V/OPEN | 0V/OPEN | −4V/OPEN |
|  | Vs | 0V/OPEN | OPEN/OPEN | −4V/OPEN |

(SELECTED BLOCK / NON-SELECTED BLOCK)

ESSENTIAL CIRCUITS OF MEMORY ARRAY AND SENSE LATCH

RELATIONSHIP BETWEEN WRITE VERIFY WORD LINE VOLTAGE
AND THRESHOLD VOLTAGE OF MEMORY CELL

EXAMPLE OF VOLTAGES APPLIED TO WORD LINE AT WRITING

WRITTEN QUATERNARY DATA AND MEMORY CELL

THRESHOLD VOLTAGE OF MEMORY CELL PRIOR TO WRITING (ERASED STATE)

CHANGE IN THRESHOLD VOLTAGE OF MEMORY CELL AT "WRITE 1"

CHANGE IN THRESHOLD VOLTAGE OF MEMORY CELL AT "WRITE 2"

CHANGE IN THRESHOLD VOLTAGE OF MEMORY CELL AT "WRITE 3"

"WRITE 1" WRITE PULSE WIDTH : w11<w12<⋯<w1n
"WRITE 2" WRITE PULSE WIDTH : w21<w22<⋯<w2n
"WRITE 3" WRITE PULSE WIDTH : w31<w32<⋯<w3n

"WRITE 1" WRITE PULSE VOLTAGE : Vw11<Vw12<⋯<Vw1n
"WRITE 2" WRITE PULSE VOLTAGE : Vw21<Vw22<⋯<Vw2n
"WRITE 3" WRITE PULSE VOLTAGE : Vw31<Vw32<⋯<Vw3n

CIRCUIT FOR SEPARATING BINARY WRITTEN DATA INTO EVEN-NUMBERED AND ODD-NUMBERED BITS

SEPARATION OF BINARY WRITTEN DATA STRING (1,1) INTO EVEN-NUMBERED AND ODD-NUMBERED BITS

EIGHTH EMBODIMENT OF THIS INVENTION
WRITE DATA SYNTHESIS CIRCUIT

FIG. 76(A)

RESULT OF SYNTHESIS OF WRITTEN
DATA AT "WRITE 1" (MWD1:"1")

| WOT | WET | W1T |
|---|---|---|
| 0 | 0 | 0 |
| 0 | 1 | 1 |
| 1 | 0 | 1 |
| 1 | 1 | 1 |

↓
IOT

| WOB | WEB | W1B |
|---|---|---|
| 1 | 1 | 1 |
| 1 | 0 | 0 |
| 0 | 1 | 0 |
| 0 | 0 | 0 |

↓
IOB

FIG. 76(B)

RESULT OF SYNTHESIS OF WRITTEN
DATA AT "WRITE 2" (MWD2:"1")

| WOT | WET | W2T |
|---|---|---|
| 0 | 0 | 0 |
| 0 | 1 | 0 |
| 1 | 0 | 1 |
| 1 | 1 | 1 |

↓
IOT

| WOB | WEB | W2B |
|---|---|---|
| 1 | 1 | 1 |
| 1 | 0 | 1 |
| 0 | 1 | 0 |
| 0 | 0 | 0 |

↓
IOB

FIG. 76(C)

RESULT OF SYNTHESIS OF WRITTEN
DATA AT "WRITE 3" (MWD3:"1")

| WOT | WET | W3T |
|---|---|---|
| 0 | 0 | 0 |
| 0 | 1 | 0 |
| 1 | 0 | 0 |
| 1 | 1 | 1 |

↓
IOT

| WOB | WEB | W3B |
|---|---|---|
| 1 | 1 | 1 |
| 1 | 0 | 1 |
| 0 | 1 | 1 |
| 0 | 0 | 0 |

↓
IOB

NINTH EMBODIMENT OF THIS INVENTION

RELATIONSHIP BETWEEN READ WORD VOLTAGE
AND THRESHOLD VOLTAGE OF MEMORY CELL

VOLTAGES APPLIED TO WORD LINE AT READING

WRITTEN QUATERNARY DATA AND MEMORY CELLS

THRESHOLD VOLTAGE OF MEMORY CELL AND READ BINARY DATA AT "READ 1"

THRESHOLD VOLTAGE OF MEMORY CELL AND
READ BINARY DATA AT "READ 2"

THRESHOLD VOLTAGE OF MEMORY CELL AND
READ BINARY DATA AT "READ 3"

EMBODIMENT OF READ DATA SYNTHESIS CIRCUIT

FIG. 84
OUTPUT RESULTS OF READ DATA SYNTHESIS CIRCUIT
CONVERSION ON THE IOT SIDE
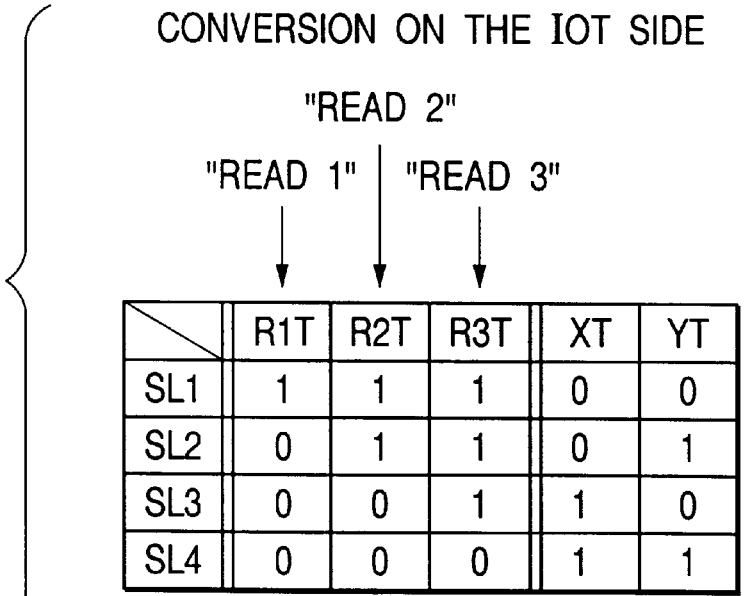
CONVERSION ON THE IOB SIDE
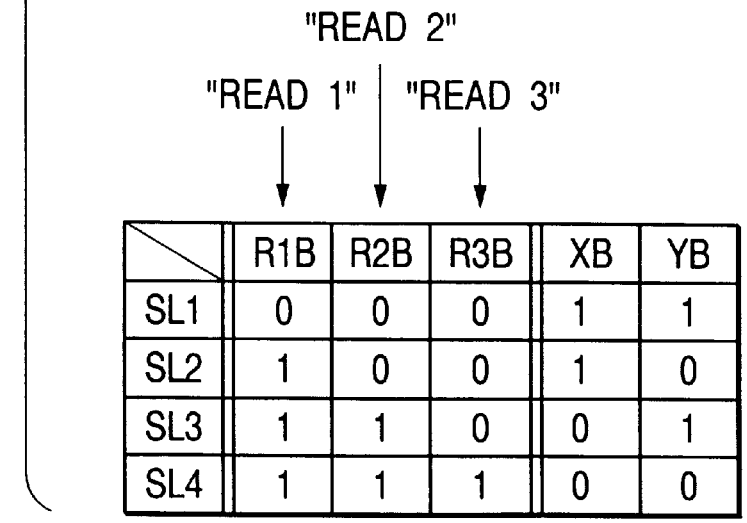

EMBODIMENT OF CIRCUIT FOR ALTERNATELY OUTPUTTING HIGH-ORDER AND LOW-ORDER BITS

SEMICONDUCTOR INTEGRATED CIRCUIT WITH MULTIPLE WRITE OPERATION MODES

BACKGROUND OF THE INVENTION

This invention relates to a semiconductor integrated circuit device, such as a flash memory or the like, and to a data processing system, such as a digital still camera, in which such a semiconductor integrated circuit device is employed.

An example of a flash memory device has been disclosed in the 1994 Symposium on VLSI Circuits, Digest of Technical Papers, pp. 61–62.

In this flash memory, a state in which the threshold voltage of each of the memory cells included in the flash memory is high, and a state in which the threshold voltage thereof is low, can be defined as, for example, an erased state and a written programmed) state, respectively. In this case, writing can be performed after erase operations have been performed collectively in word line units, for example. Upon completion of erase and write operations, the application of pulse-shaped voltages and a verify operation are repeatedly performed until a desired threshold voltage is acquired so that a change in threshold voltage is not increased undesirably.

When the application and transition of the voltage from the threshold voltage in the erased state to the threshold voltage in the written state has been completed, it is difficult to vary the threshold voltage as the threshold voltage approaches the written state. Therefore, the application of the same pulse width will lead to a state in which only the verify operation is being performed even though the threshold voltage changes very little. Therefore, when it is desired to perform writing using a fixed write voltage level, the pulse width is made long as the threshold voltage approaches the written state. The voltage may be gradually increased as an alternative to the gradual increase in pulse width.

High-accuracy writing has heretofore been realized so that a write level (equivalent to a verify word line voltage at writing) is set as, for example, 1.5V with respect to a power source voltage Vcc of, for example, 3.3V, and a write pulse or the threshold voltage of each memory cell varies over a range from 0.1V to 0.2V.

SUMMARY OF THE INVENTION

With respect to a power source voltage of, for example, 3.3V, a write level has heretofore been set practically to, for example, 1.5V, corresponding to about one half the power source voltage. One obtained by adding a difference in threshold voltage, for obtaining a current difference required to detect the voltage using a sense amplifier, to the voltage is defined as the minimum or lowest voltage (Vev) in an erased state. Upon erasing, the application of an erase pulse is controlled by detecting whether or not the threshold voltage of each memory cell has reached above Vev. A low voltage operation and high reliability can be achieved by lowering the write voltage and thereby reducing Vev to as low a level as possible.

However, the actual circumstances or fact is that the characteristic of each memory cell is varied by about three digits in the time required to reach a threshold voltage leading from an erased state to a written state when voltages to be applied upon writing are the same. When the writing of data into the corresponding memory cell is performed under such a condition, there may be cases where the threshold voltage results in 0V or less according to memory cells in the case of normal variations in characteristic of each memory cell unless a change in threshold voltage of the memory cell is set as a write pulse (width or voltage) that reaches 0.2V or less. The 3-digit variation results in about 3V if converted into a variation in equivalent threshold voltage. Thus, since the amount of change in threshold voltage per write pulse is equivalent to a change of 0.2V until the threshold voltage of a memory cell latest in written state reaches a written state, since the threshold voltage of a memory cell shortest in time required to bring it into the written state has led to the written state, it is necessary to apply a pulse 15 times if calculated simply. It is necessary to perform a verify operation for making a decision as to whether the threshold voltage has reached a desired value for each pulse. This has led to a lengthy overhead during the write time.

An object of the present invention is to speed up a write operation made to a non-volatile memory cell.

Another object of the present invention is to make the speeding up of a write operation made to a non-volatile memory cell compatible with a high reliability ot data retention.

The above and other objects, and novel features of the present invention will become apparent from the description of the present specification and the accompanying drawings.

Summaries of typical features disclosed in the present application will be described briefly as follows.

Namely, a semiconductor integrated circuit, such as a flash memory device, has a plurality of electrically erasable and programmable non-volatile memory cells and includes a control means for supplying a pulse-shaped voltage to each non-volatile memory cell until a threshold voltage of the non-volatile memory cell having a first threshold voltage is changed to a second threshold voltage. The control means has a first operating mode in which the amount of change in threshold voltage of each non-volatile memory cell, which varies each time the pulse-shaped voltage is applied thereto, is relatively large, and a second operating mode in which the amount of change in threshold voltage thereof is relatively small.

The amount of change in threshold voltage of each memory cell per pulse in a write voltage pulse or write voltage pulse train in a first operating mode (coarse write) and the amount of change in threshold voltage per pulse in a second operating mode (high-accuracy write) are defined as $\Delta Vth1$ and $\Delta Vth2$, for example, respectively. considering at this time where the difference (cell window) in voltage between the minimum threshold corresponding to an erased state in a threshold voltage distribution of a non-volatile memory cell and the maximum threshold corresponding to a written state in the threshold voltage distribution is fixed, then the number of pulses required to change the threshold voltage of each memory cell at $\Delta Vth1$ is smaller than that at $\Delta Vth2$. Therefore, the number of verify operations at the time that the first operating mode ($\Delta Vth1$) is used, is smaller than when the second operating mode ($\Delta Vth2$) is used. The time required to perform writing corresponds to the sum of the time required to change the threshold voltage of each memory cell itself and an overhead time,such as the time required to perform the verify operation. Thus, since a decrease in the number of verify operations results in a reduction in overhead, the write operation is speeded up as a whole.

It is desirable for the level (threshold voltage) to be written into a memory cell in the first operating mode to be higher than that in the second operating mode. Namely, a threshold voltage distribution in a written state, at ΔVth1 in which the amount of change in threshold voltage is relatively large, becomes greater than a threshold voltage distribution in a written state at ΔVth2 in the second operating mode. Thus, doing so is desired to avoid depleting. In other words, it is desired that a write verify voltage in the first operating mode (coarse write) be set higher than a write verify voltage in the second operating mode (high-accuracy write). Even if the cell window in the first operating mode is not set equal to that in the second operating mode, an erase level written into a memory cell in the first operating mode has a tendency to become higher than an erase level written into a memory cell in the second operating mode. Thus, the electric field between a floating gate and a semiconductor substrate of the memory cell written in the second write operating mode is lower than that ot the memory cell written in the first operating mode at the time of information retention. Further, the information retention time of the memory cell written in the second write operating mode is longer than that of the memory cell written in the first operating mode. Namely, the memory cell written in the second operating mode exhibits an excellent information retention performance. In this sense, the second operating mode can be placed or defined as a high-accuracy write mode.

The control means can be provided with a rewrite control means for rewriting data written in the first operating mode in the second operating mode. Namely, after the data has been written into each memory cell in the first operating mode of short write time, it is renewed or rewritten in the second operating mode capable of narrowing the distribution of the threshold voltage of the memory cell. With respect to rewriting, the data is read from the corresponding memory cell and latched in its corresponding sense latch, and the latched data is defined as data to be written in the second operating mode.

The coarse write based on the first operating mode and the high-accuracy write based on the second operating mode can be controlled by switching according to conditions, such as address areas, the number of cumulatings for reprogramming, etc. as well as switching control on the rewriting executed in the first and second operating modes.

A memory mat exclusive to the coarse write and a memory mat exclusive to the high-accuracy write can be also dedicated.

The data to be written in the first operating mode may be set as binary data and the data to be written in the second operating mode may be set as multivalued data. At this time, the rewrite control means is capable of rewriting the binary data written in the first operating mode to the multivalued data in the second operating mode.

A semiconductor integrated circuit is able to have only the coarse write executed in the first operating mode as a writing mode. Namely, the semiconductor integrated circuit has a plurality of electrically erasable and programmable non-volatile memory cells and includes a control means for supplying a pulse-shaped voltage to each non-volatile memory cell until a threshold voltage of the non-volatile memory cell having a first threshold voltage is changed to a second threshold voltage. At this time, the control means controls the second threshold voltage to a voltage that falls within a range lower than or equal to a power source voltage and higher than or equal to one half the power source voltage.

According to another aspect or viewpoint of the semiconductor integrated circuit having only the coarse write mode as a writing mode, the control means controls the second threshold voltage to a voltage ranging from below 3.3V to above 2V when the power source voltage is in the neighborhood of 3.3V.

At this time, the control means can set the amount of change in threshold voltage per pulse-shaped voltage to above 0.4V. According to a further aspect of the semiconductor integrated circuit, the control means can control the amount of change in threshold voltage per pulse-shaped voltage to above one third the difference between the first threshold voltage and the second threshold voltage.

According to a still further aspect of a semiconductor integrated circuit having only a rough or coarse write mode as a writing mode, the semiconductor integrated circuit having a memory array configuration, which is typified by a NAND type, has a plurality of electrically erasable and programmable non-volatile memory cells and a control means for supplying a pulse-shaped voltage to each non-volatile memory cell until a threshold voltage of the non-volatile memory cell having a first threshold voltage is changed to a second threshold voltage, whereby a control voltage for turning on a non-selected non-volatile memory cell is supplied to the non-selected non-volatile memory cell at the time of a read operation. At this time, the control means controls the second threshold voltage so as to reach a voltage lying within a range in which the difference between the second threshold voltage and the control voltage is lower than or equal to the control voltage and is higher than or equal to one half the power source voltage. Alternatively, the control means controls the second threshold voltage so as to reach a voltage that falls within a range in which the difference between the second threshold voltage and the control voltage is lower than or equal to 3.3V and is higher than or equal to 2V.

As described above, the characteristic of each memory cell is varied by about three digits in the time required to reach the threshold voltage leading from the erased state to the written state when the voltages to be applied upon writing are the same. When the writing of data into the corresponding memory cell is performed under such a condition, it is considered that there may be cases where the threshold voltage results in 0V or less according to memory cells in the case of normal variations in characteristic of each memory cell unless a change ΔVth1 in threshold voltage of the memory cell is set as a write pulse (width or voltage) that reaches 0.2V or less. In order to write data at high speed at this time, the amount of change ΔVth1 per write pulse is increased by making the pulse width long or by raising the voltage. However, the memory cell is apt to deplete due to this increase. The write level is rendered high to avoid this. If the threshold voltage in the written state is set to about 2.0V when the power source voltage is about 3.3V, for example, then ΔVth1 can be set to 0.4V. Since the 3-digit variation referred to above is equivalent to a threshold voltage variation of 3V, assuming the existence of the 3-digit variation, the pulse may be applied eight times. Since the number of verify operations is reduced as much, the data can be written at high speed. Namely, the write level was intended to fall below ½ the power source voltage in the art, whereas it is set so as to fall above one half the power source voltage herein.

The semiconductor integrated circuit can adopt a trimming means capable of trimming the minimum value (determining a period in which the initial write voltage in the write operation is supplied) of the pulse width of the pulse-shaped voltage. Further, the trimming means is capable of trimming the rate of gradual increase in pulse width of the pulse-shaped voltage. When the initial write voltage is applied to one semiconductor integrated circuit chip in the same pulse width as that in another semiconductor integrated circuit chip, needless write and verify operations in which the threshold voltage substantially remains unchanged virtually, must be done many times, so that the efficiency of writing might be reduced greatly. If the minimum write voltage pulse width can be trimmed, then the differences in characteristic between memory cells due to process variations can be rendered uniform or optimized between semiconductor integrated circuit chips like flash memory chips. Namely, the amounts of shifts of threshold voltages of memory cells are considered to subtly differ from each other due to the process variations or the like even if the write voltages are the same. Allowing adjustments to the difference in such characteristic in an inspection process, such as a wafer process of a semiconductor integrated circuit like a flash memory chip, is important to make high-speed write possible.

Incidentally, a trimming means for trimming or adjusting the minimum value of the pulse-shaped voltage or the rate of gradual increase in pulse-shaped voltage can be adopted according to the form of the memory cell array.

A semiconductor integrated circuit, such as a flash memory device, can be applied to a data processing system used to constitute a digital still camera. Namely, the data processing system includes an image sensing means, the semiconductor integrated circuit, and a mode control means for providing instructions for allowing the semiconductor integrated circuit to sequentially store image data obtained by the image sensing means in a first operating mode and for causing the semiconductor integrated circuit to rewrite the image data stored in the semiconductor integrated circuit in the first operating mode to multivalued data in a second operating mode, using a period in which an imaging process of the image sensing means is brought to a halt.

A semiconductor integrated circuit, such as a flash memory device, also can be applied to a data processing system for constituting a PC card. Namely, the data processing system for constituting the PC card includes the semiconductor integrated circuit, like a flash memory, and a mode control means for setting a write operation for the semiconductor integrated circuit as a first operating mode upon supply of an external power source to the PC card and allowing the semiconductor integrated circuit to rewrite data written into the semiconductor integrated circuit in the first operating mode to multivalued data in a second operating mode in response to the cutoff of the supply of the external power source to the PC card.

This type of data processing system is capable of implementing the writing of data into each of the non-volatile memory cells of a semiconductor integrated circuit, like a flash memory, at high speed and is capable of improving the reliability of retention of the data stored therein.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description, taken in connection with the accompanying drawings, in which:

FIG. 1 is a block diagram showing one embodiment of a flash memory having a coarse write mode and a high-accuracy write mode;

FIG. 8 is a diagram for describing one example of operation switching conditions in FIG. 7;

FIG. 9 is a block diagram showing a still further flash memory in which a first write mode and a second write mode are identical in write voltage pulse width to each other, whereas write voltages are set as fixed voltages different from each other between the first write mode and the second write mode;

FIGS. 35(a) and 35(b) are diagrams for describing trimming of gradually-increased widths of write voltage values to be subjected to another trimming in FIG. 33;

FIG. 36 is a block diagram showing a still further flash memory provided with means capable of changing gradually-increased widths or the like of threshold voltages in the course of their increasing;

FIG. 56 is a diagram depicting one example of a layout configuration of a NAND memory cell;

FIG. 57 is a diagram showing one example of a layout configuration of a NOR memory cell;

FIG. 58 is a diagram illustrating one example of a layout configuration of a DINOR memory cell;

FIG. 59 is a diagram for describing states of voltages to be applied to each memory cell according to a memory operation;

FIGS. 76(A) to (C) are diagrams for describing examples of results synthesized by the write data synthesis circuit shown in FIG. 75 in association with [write 1] to [write 3];

FIG. 84 is a diagram for describing examples of results outputted from the read data synthesis circuit;

DETAILED DESCRIPTION OF THE PREFERRED EMBODIMENTS

Prior to the description of the characteristic features of individual flash memories according to embodiments of the present invention, the configuration of each flash memory will first be described diagrammatically in order of [the configuration of the flash memory with a sense latch as the central figure], [an AND memory cell array], [the mode of application of voltages to memory cells], and [a chip configuration of the flash memory].

[1.1. Configuration of flash memory with sense latch as the central figure]

Figure 53:
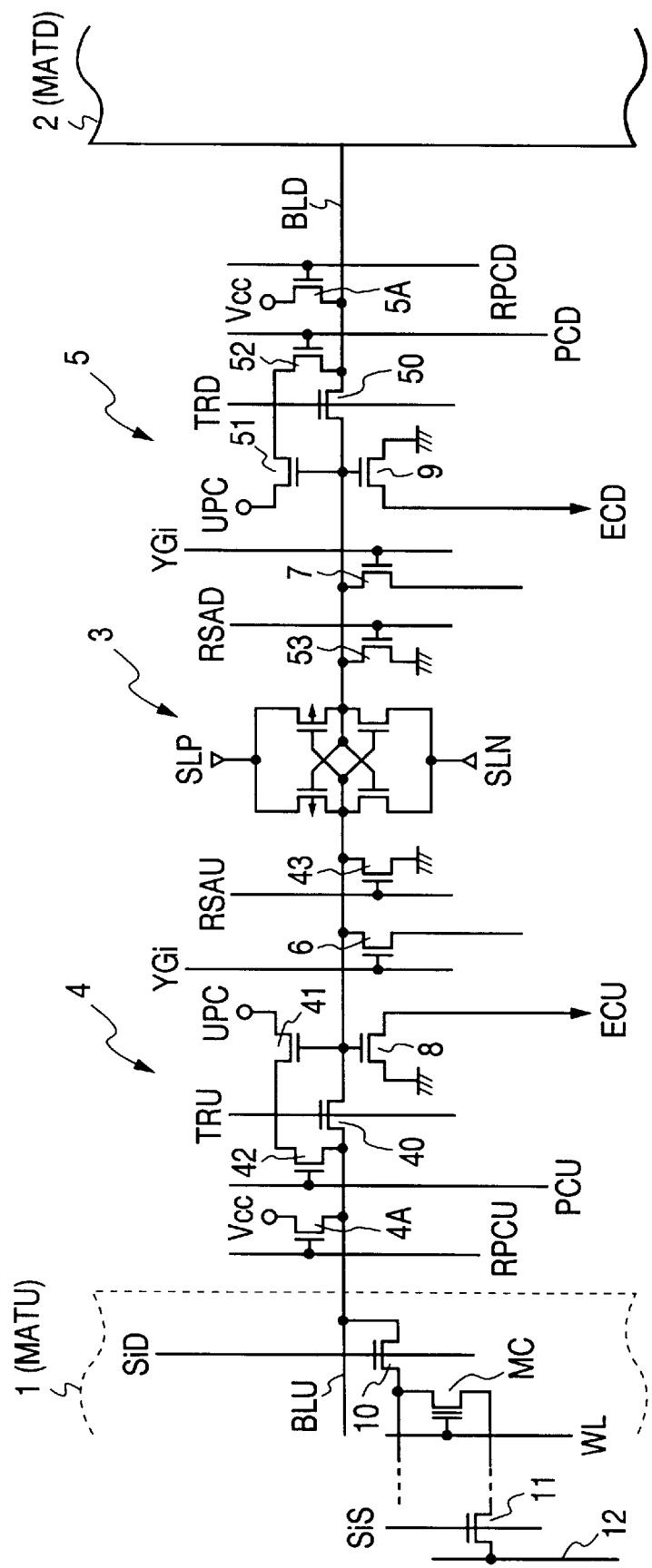
FIG. 53 is a circuit diagram illustrating a configuration of a flash memory with a sense latch and a precharge circuit defined as principal.

FIG. 53 shows the configuration of a flash memory with a sense latch and a precharge circuit defined as principal elements. Reference numerals 1 and 2 indicate memory mats, respectively. The memory mats 1 and 2 have a plurality ot electrically erasable and programmable or electrically reprogrammable memory cells MCs (one being typically shown in the drawing) respectively. One memory cell comprises one electrically reprogrammable transistor (memory cell transistor) having a control gate, a floating gate, a source and a drain. Although a layout of the structure of each memory cell MC is not limited to a particular type, a so-called AND type will be described as an example. In the AND-type construction, a plurality of the memory cell transistors are arranged in parallel through their diffusion or diffused layers (semiconductor regions) constituting sources and drains common to them. Each diffused layer constituting the drain is electrically connected to a bit line BLU through a select transistor 10, whereas each diffused layer constituting the source is electrically connected to a source line 12 through a select transistor 11. The AND-type memory cell structure will be described in detail later. SiS indicates a switch control signal used for the select transistor 11 and SiD indicates a switch control signal used for the select transistor 10. WL indicates a word line electrically connected to a corresponding control gate of each memory cell MC.

In FIG. 53, the bit lines BLU and BLD included in the individual memory mats are shown as typical ones, respectively. Correspondingly, one sense latch 3 shared between the left and right bit lines BLU and BLD is typically illustrated. Although not restricted in particular, a structure related to the left and right bit lines BLU and BLD corresponding to one sense latch 3 is defined as a mirror symmetric structure with the sense latch 3 as the center. Reference numerals 4 and 5 indicate precharge circuits connected to the bit lines BLU and BLD respectively.

The sense latch 3 is made up of a static latch composed of one pair of CMOS inverters, i.e., a circuit in which an input terminal of one CMOS inverter is mutually connected to an output terminal of the other CMOS inverter. The output of one CMOS inverter is electrically connected to its corresponding bit line BLU through the precharge circuit 4, whereas the output of the other CMOS inverter is electrically connected to its corresponding bit line BLD through the precharge circuit 5. Power supplies to activate the sense latch 3 are defined as SLP and SLN. The sense latch 3 latches written data supplied from column select gate transistors 6 and 7 therein or latches initial data according to the states of set MOS transistors 43 and 53 in the event ot a read or verity operation. Further, the sense latch 3 performs a sense operation or the like according to the states of the left and right bit lines BLU and BLD.

The precharge circuit 4 (5) has a transfer MOS transistor 40 (50) interposed in the course of a signal transmission path for connecting the bit line BLU (BLD) and the sense latch 3 to each other. A feedback MOS transistor 41 (51) whose gate is electrically connected to an input/output terminal of the sense latch 3 with the MOS transistor 40 (50) interposed between the bit line and the sense latch 3, and a MOS transistor 42 (52) whose source is electrically connected to the bit line BLU (BLD) with the MOS transistor 40 (50) interposed therebetween are placed in series. The drain of the feedback MOS transistor 41 (51) is supplied with a voltage UPC.

When the MOS transistor 40 (50) is in an off state, the MOS transistor 41 (51) is by-switch controlled according to the level of the input/output terminal of the sense latch 3. The MOS transistor 42 (52) is by-conductance controlled according to the level of a signal PCU (PCD) so as to supply a level corresponding to it to the bit line BLU (BLD) based on the voltage UPC.

The precharge circuits 4 and 5 respectively precharge the levels on the bit lines BLU and BLD to desirable levels prior to read, erase verify and program or write verify operations. MOS transistors 4A and 5A are transistors for supplying a reference level for the sense latch 3 to the bit lines BLU and BLD.

Referring to FIG. 53, reference numerals 8 and 9 indicate MOS transistors for determining a written or erased state. The gates of the MOS transistors 8 and 9 are electrically connected to their corresponding bit lines, whereas the sources thereof are respectively connected to a ground potential. The structure related to the bit lines BLU and BLD with one sense latch 3 typically shown in FIG. 53 provided as the center actually exists in large numbers. The drains of the transistors 8 provided on the left side of FIG. 53 with the sense latch 3 interposed between the bit lines are all commonly connected to each other. Further, each of the drains thereof produces a current ECU corresponding to the state (level) of the left-side bit line typified by the bit line BLU. Similarly, the drains of the transistors 9 provided on the right side of FIG. 53 with the sense latch 3 interposed therebetween are all commonly connected to each other. Further, each of the drains thereof generates a current ECD corresponding to the state (level) of the right-side bit line typified by the bit line BLD. Although not shown in the drawing in particular, a current sense-type amplifier is provided which, based on a change in current ECU (ECD), detects whether all the bit lines BLU (BLD) on the left (right) side of the sense latch 3 are brought to the same state. This amplifier is used to detect whether all the memory cells subjected to the erase verify operation or write verify operation are brought to a predetermined threshold voltage.

Incidentally, P channel MOS transistors are shown in the drawings attached to the present specification as distinguished from N channel MOS transistors by arrows affixed on basic gates of the former transistors.

Figure 54:
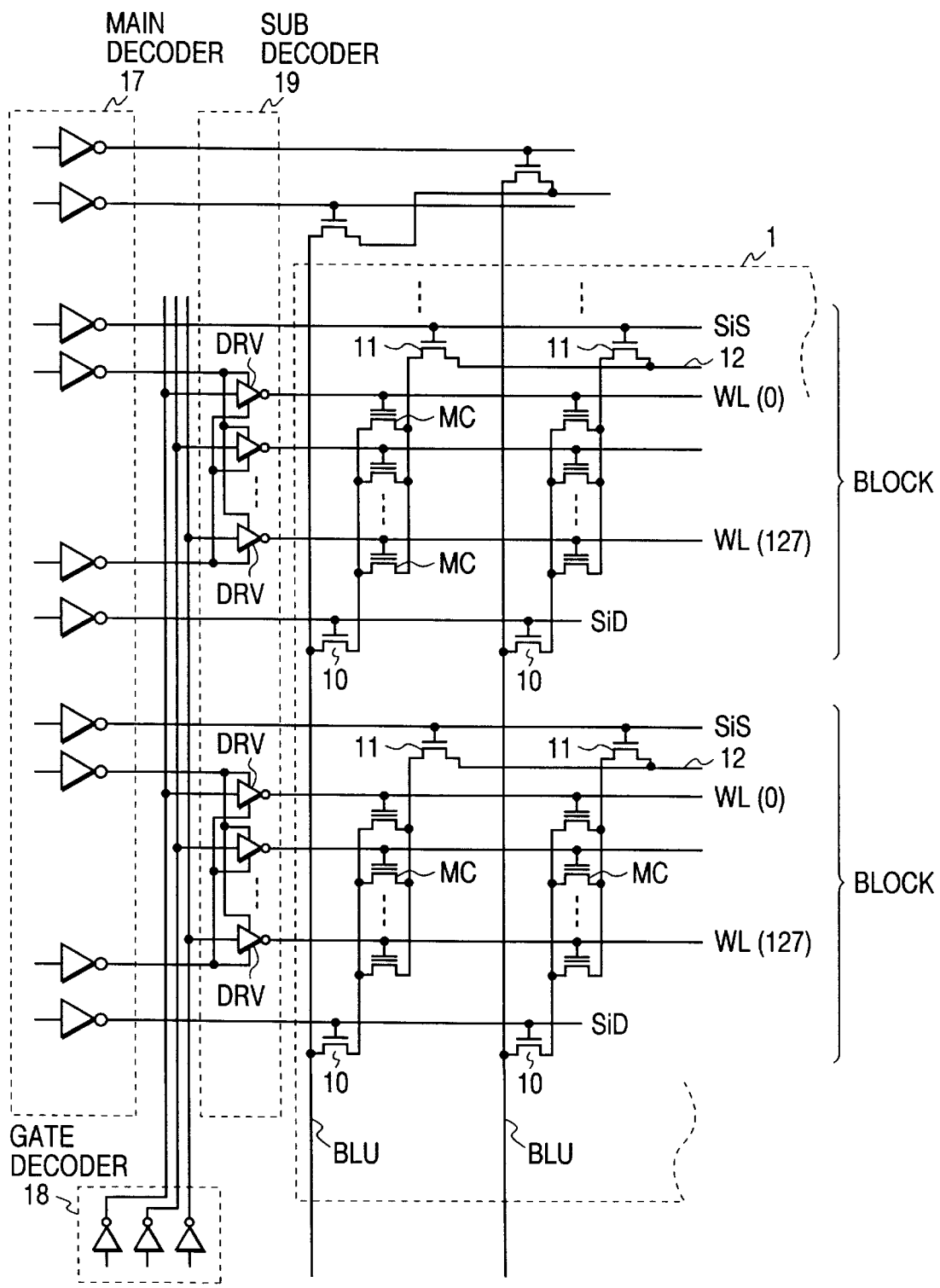
FIG. 54 is a circuit diagram showing the details of a memory mat and one example of its X-system selection circuit.

FIG. 54 shows the details of the memory mat 1 and an example of an X-system selection circuit thereof. For example, the memory mat 1 is divided into a plurality of blocks with 128 word lines WL(0) through WL(127) defined as one unit. In the respective blocks, select MOS transistors 11 are by-switch controlled by a common control signal SiS and select MOS transistors 10 are by-switch controlled by a common select signal SiD. Although not shown in the drawing, the memory mat 2 is configured in the same manner as described above. The X-system selection circuit comprises a main decoder 17, a gate decoder 18 and a sub decoder 19. The sub decoder 19 is provided for each of the memory mats 1 and 2 and has drivers DRV provided in one-to-one correspondence with the word lines. Power supplies to activate or operate the drivers DRV are supplied from the main decoder 17 in block units. The main decoder 17 supplies the operating power supply to the driver DRV corresponding to one block exclusively in accordance with an address signal supplied thereto. At the same time, the main decoder 17 controls the select MOS transistors 11 and 10 in each block associated with the driver DRV to supply the operating power supply thereto to an on state. The gate decoder 18 supplies a signal for selecting one word line in each block in accordance with an address signal supplied thereto to its corresponding driver of the sub decoder 19. The X-system selection circuit selects one block and is capable of driving one word line in the selected block to a select level. The driven level at that time is determined according to the operating power supply of each output circuit in the main decoder 17. An X-system selection circuit of the memory mat 2 is configured in the same manner as described above.

Either one of the X-system selection circuits for the memory mats 1 and 2 is exclusively selected and operated. Either one of the main decoder 17 for the memory mat 1 and the main decoder 17 for the memory mat 2 can be activated in accordance with, for example, the least significant bit or the most significant bit of an address signal supplied from the outside.

[1-2. AND memory cell array]

Figure 55:
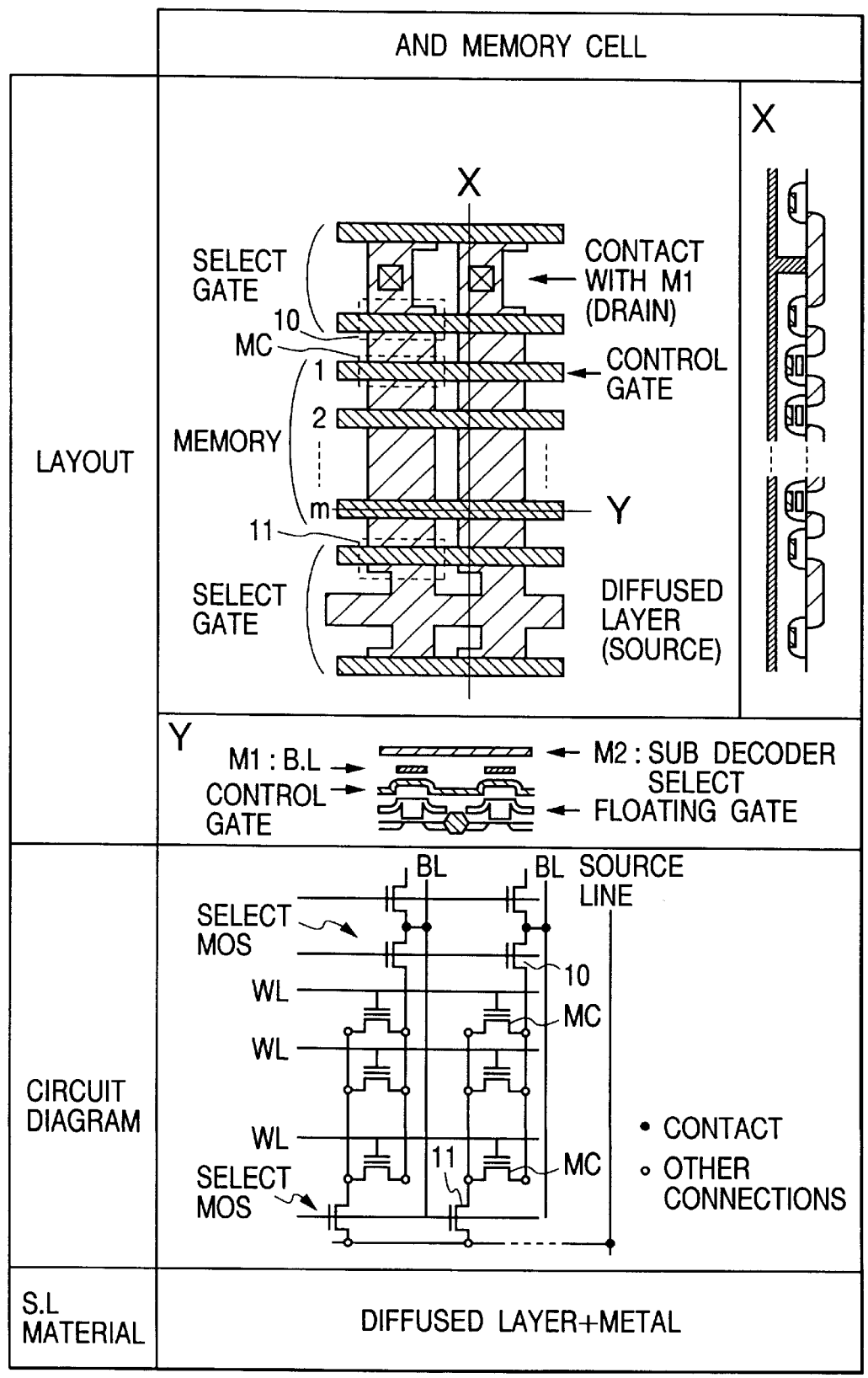
FIG. 55 is a diagram illustrating one example of a layout configuration of an AND memory cell.

FIG. 55 shows an example of a layout configuration of the aforementioned AND memory cell. The memory cell shown in the same drawing has a structure formed in accordance with a process, using metal interconnection layers corresponding to two layers. Memory cells MC and select MOS transistors 10 and 11 are respectively formed at positions where longitudinally-extending diffused layers arranged in parallel and transversely-extending control gates made of polysilicon or the like intersect. Each memory cell MC of a flash memory is defined as an N channel MOS transistor formed on a P-type substrate. The memory cell MC is capable of holding information therein according to the presence or absence of an electrical charge in each floating gate. When, for example, the electrical charge is introduced into the floating gate, the threshold voltage of each memory cell increases. No memory current flows by increasing the threshold voltage to above a voltage value applied to each control gate. Further, the discharge of the electrical charge from the floating gate allows a reduction in threshold voltage of each memory cell. The memory current flows by setting the threshold voltage so as to be lower than the voltage value applied to the control gate. For example, the state of a current flow and the state of a non-current flow can be assigned to a "0" information holding state (e.g., written state) and a "1" information holding state (e.g., erased state) respectively. This is set from the standpoint of definition. Even if the reverse definition is given, no problem occurs.

Although the memory cells of the flash memory described as an illustrative example in the present specification are AND types, the memory cell structure is not limited to this and may adopt or take other structures, such as a NAND type as shown in FIG. 56, a NOR type as shown in FIG. 57, a DINOR type as shown in FIG. 58, etc. Even in the case of any other structure, the memory cells in the flash memory are basically identical in configuration to each other. However, when the memory cells are disposed in array form as shown in FIGS. 55 through 58, their characteristics are exhibited. Since the NOR type needs contacts with the bit lines (metal interconnection layers) of all memories, it is difficult to reduce its occupied area. However, since the NAND type, DINOR type and AND type may place contacts with bit lines of every block, their occupied areas can be reduced.

[1-3. Mode for application of voltage to memory cell]

FIG. 59 shows examples of states of voltages to be applied to each memory cell according to a memory operation. The memory operation is roughly divided into read, program or write and erase operations. The terms program or write verify and erase verify are substantially identical to read. Vg indicates a voltage (control gate voltage) applied to a control gate, Vd indicates a voltage (drain voltage) applied to a drain, and Vs indicates a voltage (source voltage) applied to a source.

In the event of a read operation, a read potential (Vcc) is applied to the control gate of each memory cell. Thus, data stored in each memory cell is determined depending on whether a current flows in the memory cell by the application of the read potential to the control gate. The read operation will be explained in accordance with the construction shown in FIG. 53. When it is desired to perform reading on each memory cell MC included in the memory mat 1 (MATU), for example, the set MOS transistor 53 on the non-selected memory mat 2 (MATD) side is turned on to activate the sense latch 3, thereby latching a high level into the bit line BLU side of the sense latch 3. Further, RPCU is controlled to 1V+Vth so as to precharge the bit line BLU to 1V. On the non-selected memory mat 2 side on the other hand, RPCD is controlled to 0.5V+Vth so as to precharge the bit line BLD to 0.5V, which is defined as a reference level for a sense operation of the sense latch 3. After the selecting operation of the corresponding word line, the transfer MOS transistors 40 and 50 are turned on. At this time, the sense latch 3 senses whether the level of the bit line BLU is higher or lower than 0.5V and latches therein data read from the memory cell MC.

In the event of an erase operation, a positive voltage (12V) is applied to the control gate of each memory cell and a negative voltage (−4V) is applied between the drain and source thereof. It is thus possible to inject an electrical charge into the floating gate by the tunnel effect. As a result, the threshold voltage of the memory cell MC increases. For example, the erase operation is performed until the above state of application of the voltage is executed intermittently and the threshold voltage of the memory cell exceeds a word line potential for the erase verify. In the construction shown in FIG. 54, the erase operation is performed in word line units, for example. The same drain and source voltages are respectively applied to the memory cells in the block including the word lines, which are subjected to the erasing, through the select MOS transistors 10 and 11. Accordingly, Vg=0V and Vd=Vs=−4V are applied to the non-selected memory cells included in the selected block. Since the select MOS transistors 10 and 11 in the non-selected block are kept in an off state, the drain and source of each memory cell included in the non-selected block is brought to a floating state, i.e., it is rendered open so that the control gate voltage is brought to 0V. The erase verify operation is substantially idential to the read operation except that the word line voltage for the verity operation is simply different from that of the read operation.

In the event of a write operation, a negative potential (−10V) is applied to the control gate of each memory cell, a positive potential (4V) is supplied to the drain thereof and the source thereof is brought to a floating state. 0V is applied to the drain of a memory cell to be written and the drain of a memory cell to be non-written, which shares the use of the word line. Thus, the electrical charge is discharged only from the memory cell whose drain is supplied with the positive voltage. As a result, the threshold voltage of the memory cell decreases. The write operation is executed until the threshold voltage of a desired memory cell is lower than or equal to a word line potential for the write verify operation. The write operation will be explained in accordance with the construction shown in FIG. 53. After the written data inputted from the column select gates 6 and 7 have been latched in the sense latch 3, PCU and PCD are controlled to a high level, so that the bit line (e.g., BLU) connected to the input/output nodes on the high level side of the sense latch 3 is precharged to a high level. Further, when the transfer MOS transistors 40 and 50 are turned on, the bit line BLU precharged to the high level is supplied with a write drain voltage from the sense latch 3. The select MOS transistors 10 for connecting the bit lines to the drains of the memory cells MC are all in a cut-off state on the write non-selected mat side by the signal SiD. Thus, the threshold voltage of each memory cell supplied with the write voltage through the bit line, of the memory cells connected to the control gates each supplied with the write voltage on the write selected mat side, is reduced. The subsequent write verify operation is also performed in the same manner as the read operation.

[1-4. Chip configuration of flash memory]

Figure 60:
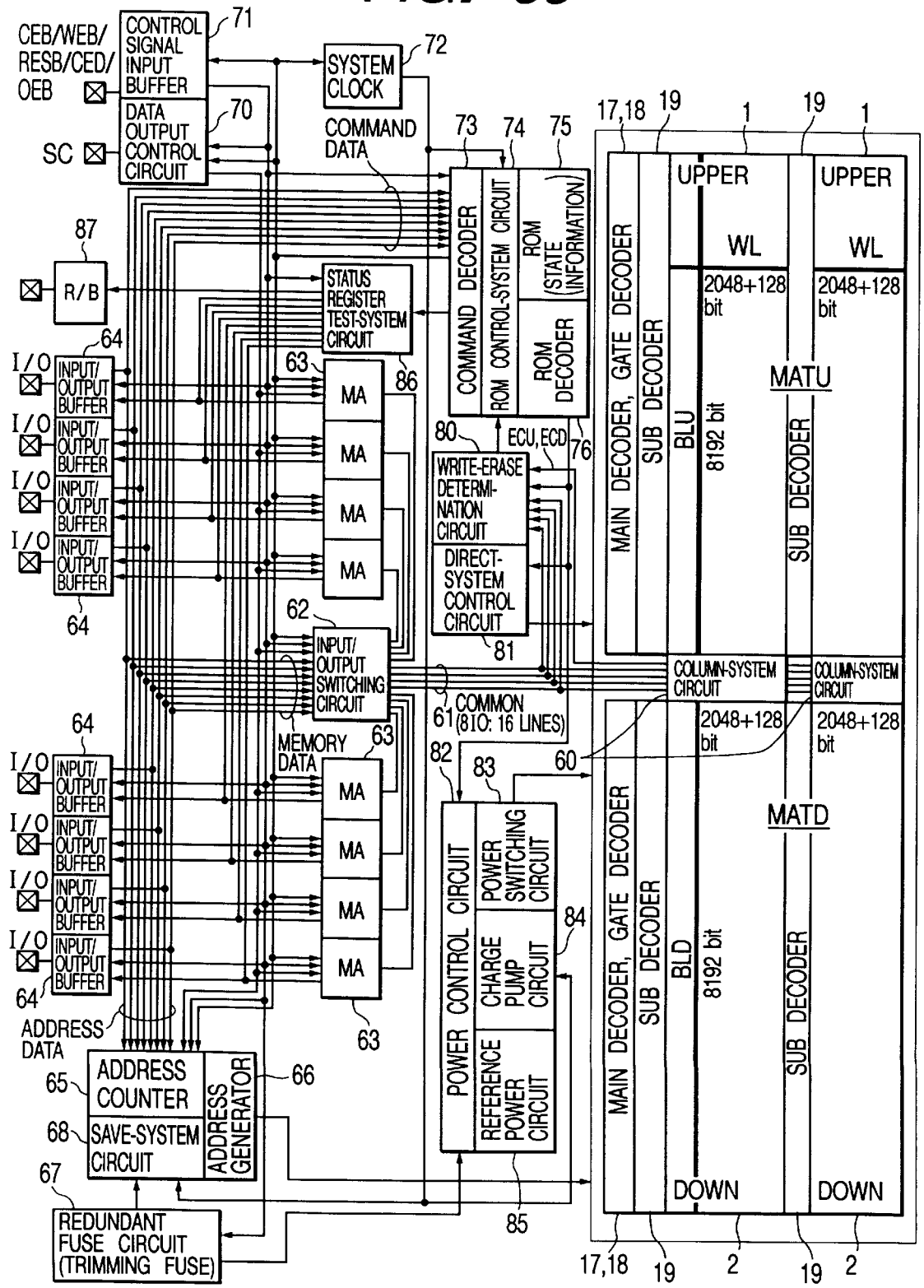
FIG. 60 is a general block diagram of a still further flash memory.

FIG. 60 is a block diagram showing the overall configuration of the flash memory referred to above. The invention is not limited to the flash memory shown in the drawing in particular, which is formed on a single semiconductor substrate like monocrystal silicon by a known semiconductor integrated circuit manufacturing technique.

Referring to FIG. 60, MATU constitutes the memory mat 1 and MATD constitutes the memory mat 2. In order to distribute the load capacity of one word line to the individual memory mats 1 and 2, the word line disposed at the same address is divided into two to which sub decoders 19 are assigned respectively. Although the invention is not restricted in particular, the flash memory is defined as a flash memory effective for application to a disc-device compatible ATA file memory. Each word line located at the same address has memory cells of (2048+128)×2 bits, which corresponds to a sector of 512 bytes and a sector management area of 16 bytes. Of these, the 16-byte area is used for redundancy.

In FIG. 60, reference numeral 60 indicates a column-system circuit. The column-system circuit 60 is defined as a circuit block including the column-system circuit shown in FIG. 53 having the sense latch 3, precharge circuits 4 and 5, column select gates 6 and 7, etc., and a column decoder for by-switch controlling the column select gates. The column select gates 6 and 7 interface to eight pairs of common data lines 61 and the column decoder controls continuity or conduction between the eight pairs of common data lines 61 and bit lines BLU and BLD in accordance with a column address signal or the like. The common data lines 61 are respectively electrically connected to main amplifiers (MA) 63 and input/output buffers 64 through an input/output switching circuit 62. Each of the input/output buffer 64 interfaces to the outside through an external connecting electrode (I/O) like a bonding pad.

The input/output buffer 64 is shared between the input and output of memory data, the input of address data and the input of command data. Data to be written into each memory cell is supplied to its corresponding pair of common data lines 61 through the input/output switching circuit 62. Data read from each memory mat is supplied via the input/output switching circuit 62 to the corresponding main amplifier 63 where it is amplified, followed by its supply to a corresponding input/output buffer 64.

The address data supplied to the input/output buffer 64 is supplied to an address counter 65. Further, the address data is supplied to a main decoder 17, a gate decoder and the column decoder and the like through an address generator 66. In the address counter 65, although the invention is not restricted in particular, initial values are preset as the address data and successively subjected to an incrementing or the like according to operating modes given to the flash memory by commands. Each address subjected to incrementing or the like is outputted from the address generator 66. Each of the memory mats 1 and 2 has spare bits placed in 16-byte form at the data lines. A save-system circuit 68 replaces an address having a defective bit by a redundant address in accordance with a programmed state of a redundant fuse circuit 67 and supplies or inputs it to the address generator 66, whereby the defective bit is replaced by a corresponding spare bit. The address generator 66 forms or produces an internal complementary address signal in response to its input and assigns it to the main decoder 17, the gate decoder 18 and the column decoder or the like.

Reference numeral 86 indicates a status register and test-system circuit, which is capable of outputting an internal state of the flash memory to the outside through the corresponding input/output buffer 64 and outputting a ready/busy status to the outside through a buffer 87.

A data input/output control circuit 70 supplied with a serial clock signal SC from the outside synchronizes inputs and outputs transferred between the corresponding main amplifiers 63, the input/output switching circuit 62 and the address counter 65, and the corresponding input/output buffer 64 with the serial clock signal SC.

External control signals are supplied to a control signal input buffer 71. The external control signals include a write enable signal WEB for providing instructions for the input of information to the flash memory, a chip enable signal CEB for providing instructions for the operation of the flash memory, an output enable signal OEB for providing instructions for the output of information from the flash memory, a signal CED for providing instructions as to whether information to be supplied to the flash memory is a command or data, and a reset signal RESB. An internal operation of the flash memory is synchronized with a clock signal outputted from a clock generator 72.

Commands supplied from the input/output buffers 64 are supplied to a command decoder 73. The commands are ones related to a read, high-precision or -accuracy program or a write and coarse program or write, and erase, etc. Contents instructed by the program and erase commands also include verify. Internal control based on the commands is divided into a so-called microprogram control system and a control system similar to this. Namely, a ROM 75 has a control code (state information) series for defining processes corresponding to the commands, for every command. The result of decoding of each command by a command decoder 73 is defined as the leading address within the ROM 75 having the control code series associated with the command. When the result of decoding of the command is supplied to the ROM 75, a control code at the head of the control code series associated with the command is read from the ROM 75. A ROM decoder 76 decodes the read control code and supplies an operation control signal to a write-erase determination circuit 80, a direct-system control circuit 81 and a power control circuit 82. A ROM control-system circuit 74 specifies second and later control codes of the control code series, based on a ROM address for the leading control code. When the division of the order of execution of the control codes into conditions is taken into consideration, the control code may be set so as to hold a ROM address corresponding to the next control code in a manner similar to the microprogram.

The power control circuit 82 controls the supply of an operating power source or supply to various circuits necessary for the read, program and erase operations. The operating power source is formed by a reference voltage generating circuit 85 for generating a reference voltage, based on a band gap or the like of silicon, for example, a charge pump circuit 84 for generating a power of −10V or so, using the reference voltage produced from the reference voltage generating circuit 85, and a power switching circuit 83 for performing switching between power supplies to activate various circuits such as the main decoders, etc. according to the read, erase and program operations, for example. The write-erase determination circuit 80 is a circuit for determining based on ECU and ECD described in FIG. 53 whether the program or write operation or erase operation is completed. The result of the determination is supplied to the ROM control-system circuit 74 where it is reflected on the contents of control in a control step next to a series of write operations or erase operations. The direct-system control circuit 81 controls word line selecting timing and column selecting timing.

Operations implemented by supplying the control information decoded by the ROM decoder 76 to the write-erase determination circuit 80, the direct-system control circuit 81 and the power control circuit 82 or the like include control operations for carrying out a write or program operation, a rewrite operation, etc. according to operating modes to be described below. This control may be implemented by hard-wired logic.

Flash memories having several characteristic contents will next be explained with the above-described flash memory whose schematic configuration has been made apparent, as the basis.

[2. Coarse write mode and high-accuracy write mode]

A flash memory FMRY1 shown in FIG. 1 has a coarse program or write mode and a high-accuracy write mode. Namely, the flash memory FMRY1 has operating modes different from each other in the amount of change in threshold voltage per pulse of a write pulse or write pulse train.

At the time of the write operation, the above-described write voltage is applied to a memory cell to be written. However, since the threshold voltage of a memory cell placed in a written state is determined with comparatively high accuracy or a variation in the threshold voltage of the memory cell kept in the written state is less reduced, the write voltage is applied to a selected word line for each time (high-level cycle or period) defined by the write pulse until the threshold voltage of the memory cell reaches a predetermined threshold voltage. As a matter of course, verify is performed each time the write voltage is applied to the word line. When the value of a write word line voltage is fixed and supplied to the corresponding word line as shown in FIG. 43(*a*), the write pulse width is rendered long in sequence so that the amount of change in the threshold voltage of the memory cell is approximately constant by one writing. When the write pulse width is fixed as shown in FIG. 43(*b*), the write word line voltage increases in sequence. Both the write voltage and the write pulse width may be varied as shown in FIG. 43(*c*).

Figure 43A:
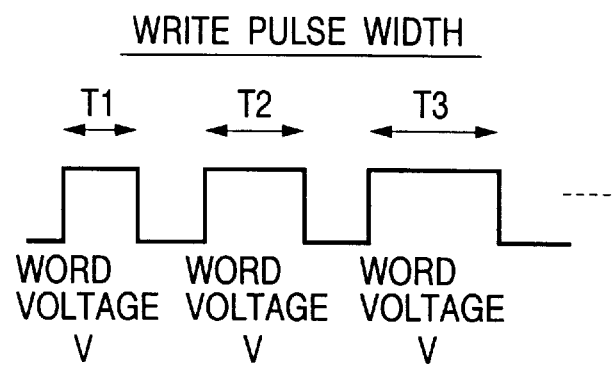
FIGS. 43(a) to 43(c) are diagrams for describing the basic principle of the technique of changing threshold voltages every write voltage pulses.
Figure 43B:
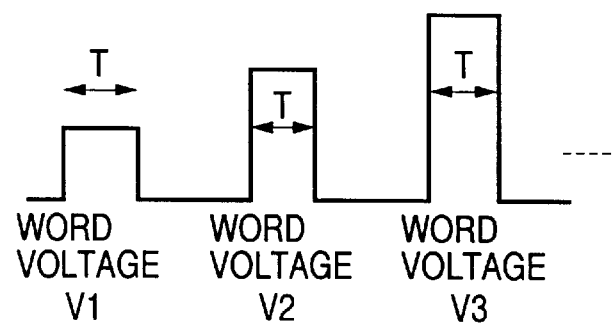
Figure 43C:
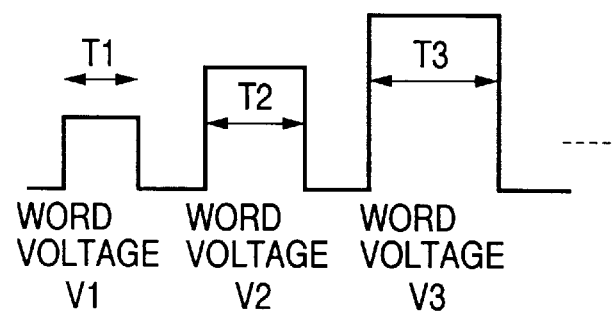

In FIG. 43(*a*), the word line voltage V is defined as −13V, and the pulse width is changed to 800 ns at T1, 960 ns at T2 and 1152 ns at T3. In FIG. 43(b), the pulse width T is defined as 800 ns and the word line voltage is changed to −9V at V1, −11V at V2 and −13V at V3. In FIG. 43(c), the pulse widths T1 through T3 change as illustrated in FIG. 43(a) and the word line voltages V1 through V3 change as shown in FIG. 43(b).

For example, the flash memory FMRY1 shown in FIG. 1 is intended to fix each write word line voltage so as to correspond to FIG. 43(a), for example and to increase each write pulse width (time) in sequence. Therefore, the flash memory FMRY1 has a first pulse train generating circuit 100 for application of the write voltage, which is used for a first write mode (coarse write) in which the amount of change in threshold voltage of each memory cell per write pulse is ΔVth1 (0.4V), and a second pulse train generating circuit for application of the write voltage, which is used for a second write mode (high-accuracy write) in which the amount of change in threshold voltage is ΔVth2 (0.2V). The operation for verifying the threshold voltage is done between the write pulse and the write pulse.

Figure 2A:
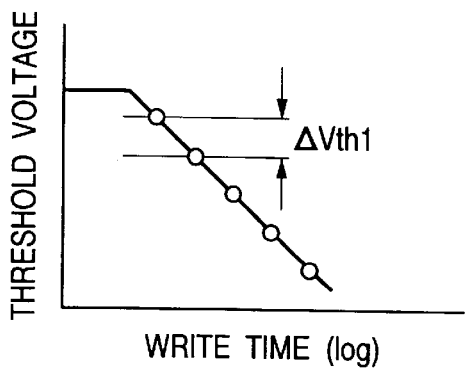
FIGS. 2(a) to 2(d) are diagrams for describing a first write characteristic and a second write characteristic.
Figure 2B:
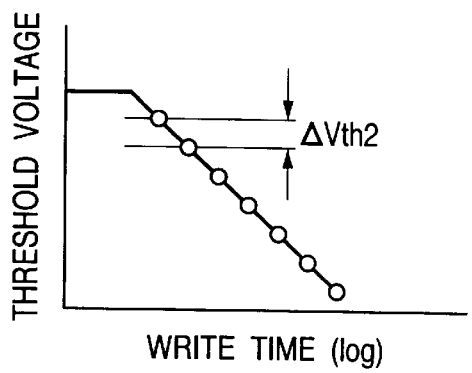

FIGS. 2(a) and 2(b) show a first write characteristic and a second write characteristic respectively. In the present specification, the scales of time axes are all defined as log. As described above, the write pulse widths are respectively rendered longer as the write operation proceeds.

Figure 2C:
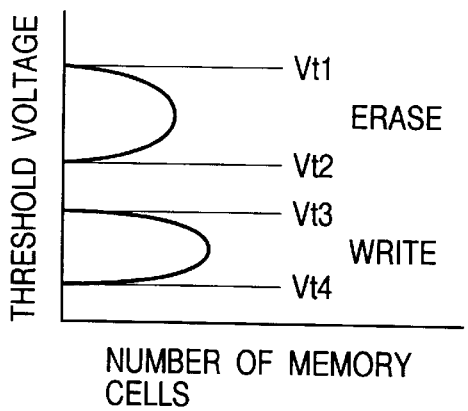
Figure 2D:
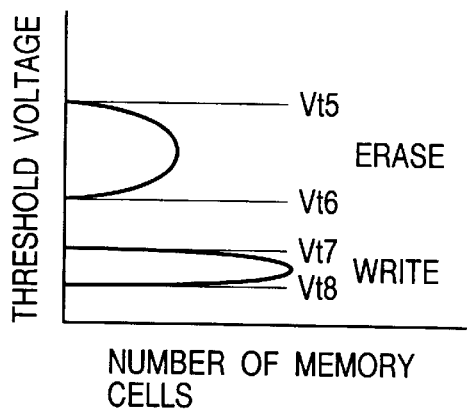

FIGS. 2(c) and 2(d) respectively show threshold voltage distributions of each memory cell MC at the first writing and the second writing.

When the threshold voltage of the memory cell ranges from Vt1 (5V) to Vt2 (3.3V) in FIG. 2(c), the memory cell is kept in an erased state. On the other hand, when the threshold voltage of the memory cell ranges from Vt3 (2V) to Vt4 (1.4V), the memory cell is brought to a written state. When the threshold voltage of the memory cell ranges from Vt5 (4.8V) to Vt6 (3.1V), the memory cell is in an erased state. On the other hand, when the threshold voltage thereof ranges from Vt7 (1.8V) to Vt8 (1.4V), the memory cell is placed in a written state.

Now consider where the difference (cell window) between the minimum threshold voltage Vt2 or Vt6 at the erased state and the maximum threshold voltage Vt3 or Vt7 at the written state is fixed. In this case, the number of pulses required to change the threshold voltage of the memory cell MC at ΔVth1 is fewer than that at ΔVth2. Therefore, the number of times that the verify operation is performed when the first pulse train generating circuit 100 for the application of the write voltage (the amount of change in threshold voltage: ΔVth1) is used, is smaller than when the second pulse train generating circuit 101 for the application of the write voltage (the amount of change in threshold voltage: ΔVth2) is used. A write or program time results in the sum of the time required to vary the threshold voltage of each memory cell itself and an overhead time such as the time required to perform verify. Thus, since the overhead time is short if the number of times that the verify operation is performed is few, the write time becomes short.

Although not shown in the drawing in particular, each of the first and second pulse train generating circuits 100 and 101 uses a carrier-transfer type binary counter, which is capable of controlling the width of each pulse according to the time required to bring the result of counting of data preset thereto to the whole bit "1". At this time, the first and second pulse train generating circuits 100 and 101 may be constructed of separate hardware respectively. However, when it is unnecessary to perform the first write and the second write in parallel, the use of such a binary counter can be shared between the two. Decreasing widths of preset data successively set according to the operating modes may be controlled so as to differ from each other. If its configuration is placed in correspondence with the configuration shown in FIG. 60, then each of the preset data is outputted from the ROM decoder 76. The value of each preset data is determined according to the first write mode or the second write mode judged by decoding the command with the command decoder 73. The binary counter is included in the power control circuit 82. In accordance with a write pulse produced therefrom, the power switching circuit 83 supplies a write word line voltage to the X-system selection circuit for each time defined by the write pulse.

The flash memory FMRY1 includes a first verify voltage generating circuit 102 used upon writing by the first pulse train generating circuit (also called "first pulse train generating means") for the application of the write voltage, and a second verify voltage generating circuit 103 used upon writing by the second pulse train generating circuit (also called "second pulse train generating means") for the application of the write voltage. In order to utilize either one of the two circuits, a switching circuit 104 controls the switching between switches S1 and S2 according to whether a command is used to specify the first write mode or the second write mode. The write voltage generating circuit connected to the X-system selection circuit by either one of the switches S1 and S2 supplies a word line drive voltage to the X-system selection circuit according to the operating modes.

Further, the flash memory FMRY1 has an erase voltage generating circuit 107 for applying an erase voltage in an erase mode and an erase verify voltage generating circuit 108 for verifying whether erasing has been done. These circuits are electrically connected to the X-system selection circuit when a switch S3 is turned ON by the switching circuit 104.

When the amount of change in threshold voltage is ΔVth1, the threshold voltage distribution at the written state ranges from Vt3 to Vt4 as shown in FIGS. 2(c) and 2(d). This is because, since this range becomes larger than the range from Vt7 to Vt8 indicative of the threshold voltage distribution at the written state, it is advisable to divide the verify voltage into a verify voltage used for the first write and a verify voltage used for the second write. The verify voltage might not be divided according to the characteristic of each memory cell MC or the cell window voltage.

Particularly, when the verify voltage is classified according to the first write and the second write as described above, it is desirable to set the verify voltage at writing to Vt3 (first verify voltage)>Vt7 (second verify voltage) for purposes of avoiding its depletion. If the present configuration is associated with the configuration shown in FIG. 60, then such first and second verify voltages are formed or produced by the charge pump circuit 84. Whether either one of the first and second write verify voltages should be used, is controlled by the power switching circuit 83 in accordance with instructions given from the ROM decoder 76 on the basis of the result of decoding of either a first write command or a second write command.

Although the invention is not restricted in particular, erase operations are also carried out so that the threshold voltage of each memory cell is raised in a stepwise form using an erase pulse train. However, the amount of change in threshold voltage per pulse in the erase pulse train at this time is not selected as in the case of the write operating modes. For the erase operation at the first write mode, an erase verify potential like Vt2 is supplied to the corresponding word line. Further, for the erase operation at the second write mode, an erase verify potential like Vt6 is supplied to the corresponding word line. Since the normal writing is done in the first write mode and the subsequent rewriting is done in the second write mode, such control is made possible. Namely, in order to rewrite each memory cell on the same word line, the memory cell on the word line needs to be kept in an erased state once. At this time, the erase verify potential is changed to control its threshold voltage distribution to a range from Vt5 to Vt6.

As is understood from the above description, an electric field between a floating gate at the retention of information and a semiconductor substrate is low and the information holding time is long when the writing is done through the second write mode. In other words, it can be said that the performance of retention of stored information or its retention period is excellent when the writing is done through the second write mode.

Word line selection levels at a read operation may be used in common in consideration of the width of the cell window, the difference between Vt3 and Vt7, the difference between Vt2 and Vt6, etc. When memory locations or areas, to which the first write mode and the second write mode are applied, are being physically divided into desired areas, the word line selection levels at the read operation may be made different from each other most suitably every memory areas.

Figure 3:
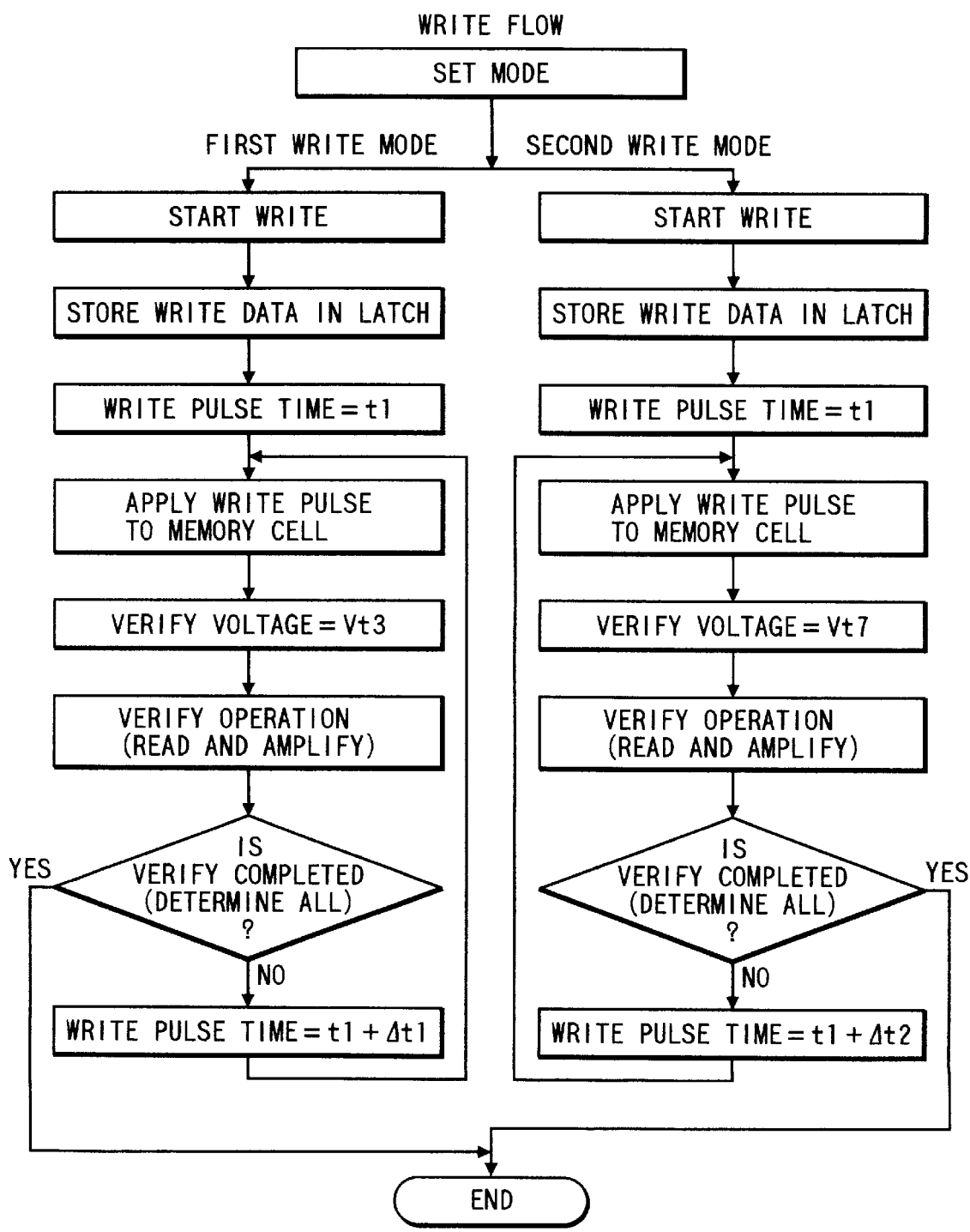
FIG. 3 is a flowchart for describing examples of write operations in a first write mode and a second write mode.

FIGS. 3(a) and 3(b) are flowcharts for explaining examples of the write operations in the first and second write modes. Namely, when a write command is input, the command decoder 73 decodes the input command and determines based on the result of decoding whether either one of the first and second write modes has been used. An increment ($\Delta t1$, $\Delta t2$) of a write pulse time and a verify voltage (Vt3, Vt7) applied to a word line are determined according to a signal decoded by the ROM decoder 76. In the first write mode, the increment of the writ pulse time is set to $\Delta t1$ and the verify voltage is set to Vt3. In the second write mode, the increment of the write pulse time is set to $\Delta t2$ and the verify voltage is set to Vt7. The verify voltages Vt3 and Vt7 are illustrated as described in FIGS. 2(c) and 2(d). The increments $\Delta t1$ and $\Delta t2$ of the write pulse time are set so as to satisfy $\Delta t1 > \Delta t2$. The amount of change in threshold voltage during a first write pulse cycle or period in the first write mode is set so as to be larger than that in the second write mode. Other operations are the same between the first and second write operations. As is apparent from this description, it will be understood that even if there are two types of write mode, the physical circuit scale due to the provision of the two types of write modes is increased very little. With respect to the increments of the write pulse time, as described above, the counter values that will cause the increments, may be varied according to the write modes. Further, the verify voltage can be selectively controlled by turning on and off the switches S1 and S2 for respectively selecting one of the voltages at a plurality of voltage output nodes of one voltage generating circuit. Alternatively, the verify voltage may be controlled by varying the voltage itself generated from the voltage generating circuit.

As described above, the write operation in the first write mode is faster than that in the second write mode but the second write mode is superior to the first write mode in reliability (data holding period) of written data. When this is taken into consideration, the flash memory FMRY1 shown in FIG. 1 has a control means (rewrite control means) 105 for rewriting data written by the first pulse train generating circuit 100 for the application of the write voltage, using the second pulse train generating circuit 101 for the application of the write voltage. Namely, the data is rewritten in the second write mode capable of narrowing the distribution of the threshold voltage after the data has been written in the first write mode in a short write time. With respect to the rewriting, the data is first read from the memory cell MC and then inverted and stored in the sense latch 3, whereby the rewriting may be done based on the data in the second write mode.

Figure 4A:
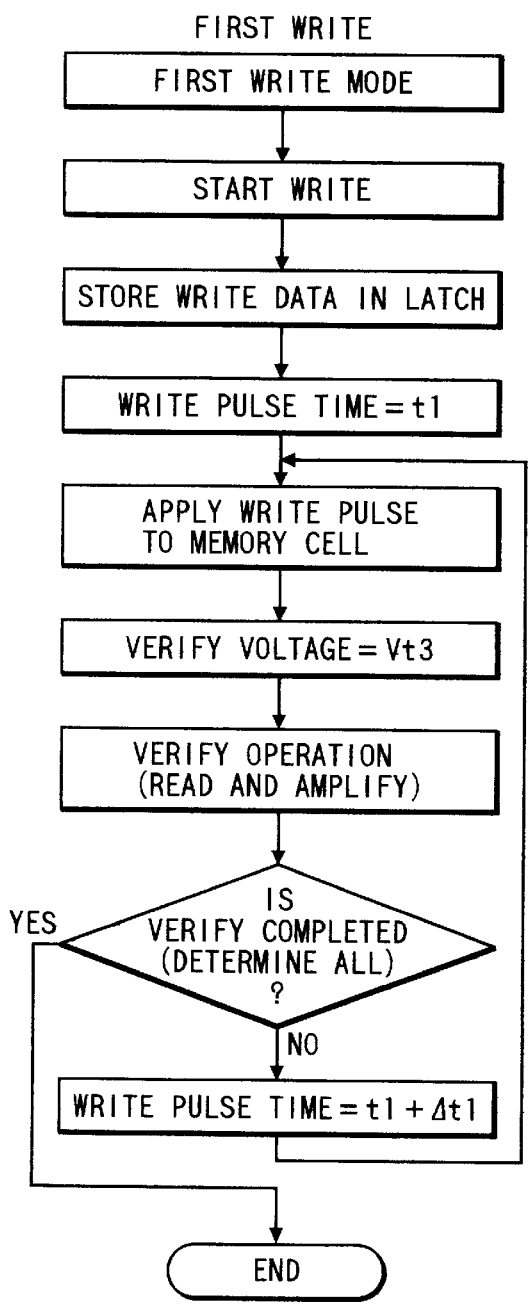
FIGS. 4(a) and 4(b) are flowcharts for describing one example of a rewrite operation.
Figure 4B:
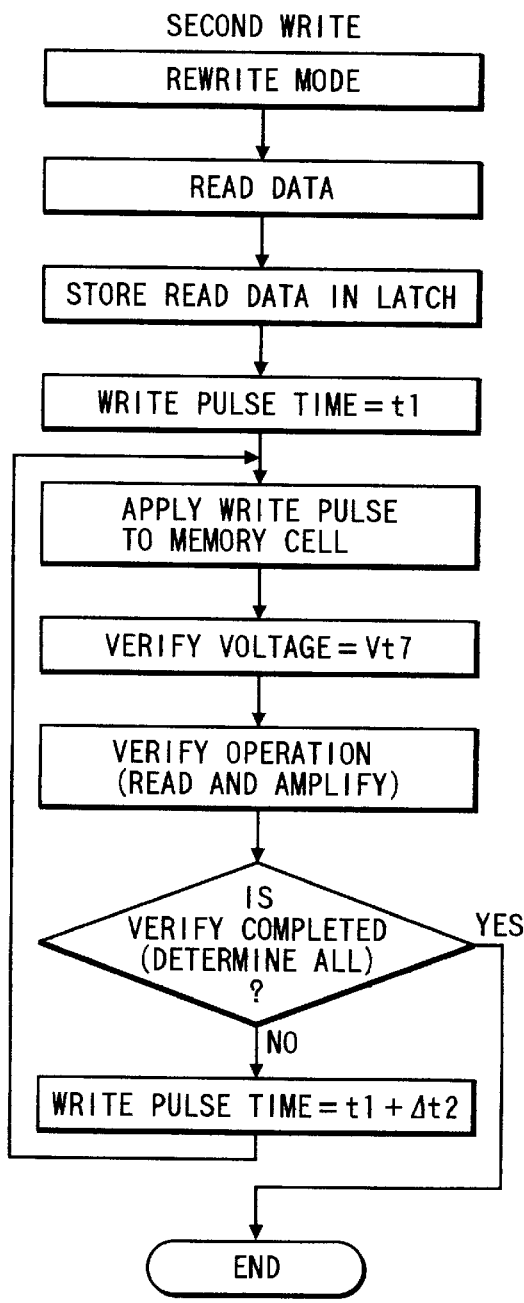

FIGS. 4(a) and 4(b) are flowcharts for describing one example of the rewrite operation. For the first write mode, the written data is loaded and latched in the sense latch 3. The initial write pulse width is defined as t1. The verify voltage is defined as Vt3. The pulse width is increased $\Delta t1$ by $\Delta t1$ until the verify is determined to be OK. While the write pulse is being updated, the write or program and verify operations are repeated. In the relationship between the threshold voltage of the memory cell MC and the write time expressed in log, $\Delta t1$ is set so that the amount $\Delta Vth1$ of change in threshold voltage becomes constant per one write pulse. Thus, a high-speed write operation can be completed.

The rewrite mode is an operating mode for rewriting data written in the first write mode in the second write mode. In the rewrite mode, the data written in the first write mode is read into the sense latch 3. This is identical to the normal read operation. Since data amplified by and latched in the sense latch 3 after the normal read operation assumes a voltage that works in reverse for writing, it is necessary to invert the data. The initial write pulse width is set to t1. The verify voltage is set to Vt7. The pulse width is increased $\Delta t2$ by $\Delta t2$ and the write pulse is repeatedly applied until the verify is determined to be OK. In the relationship between the threshold voltage of the memory cell and the write time expressed in log, $\Delta t2$ is set so that the amount $\Delta Vth2$ of change in threshold voltage becomes constant per one write pulse. Since Vt3>Vt7 and $\Delta Vth1 > \Delta Vth2$, the second writing is slower than the first writing in speed. However, the electric field at the retention of data is small, the time required to hold the data becomes long and the reliability of retention of the written data is improved.

The switching circuit 104, the switches S1, S2 and S3, the reprogram control circuit 106 and the rewrite control circuit 105 shown in FIG. 1 are composed of the ROM control-system circuit 74, the ROM 75, the ROM decoder 76, the write-erase determination circuit 80, the power switching circuit 83 and the power control circuit 82 or the like. Further, the erase voltage generating circuit 107 and the erase verify voltage generating circuit 108 is composed of the charge pump circuit 84.

Figure 5:
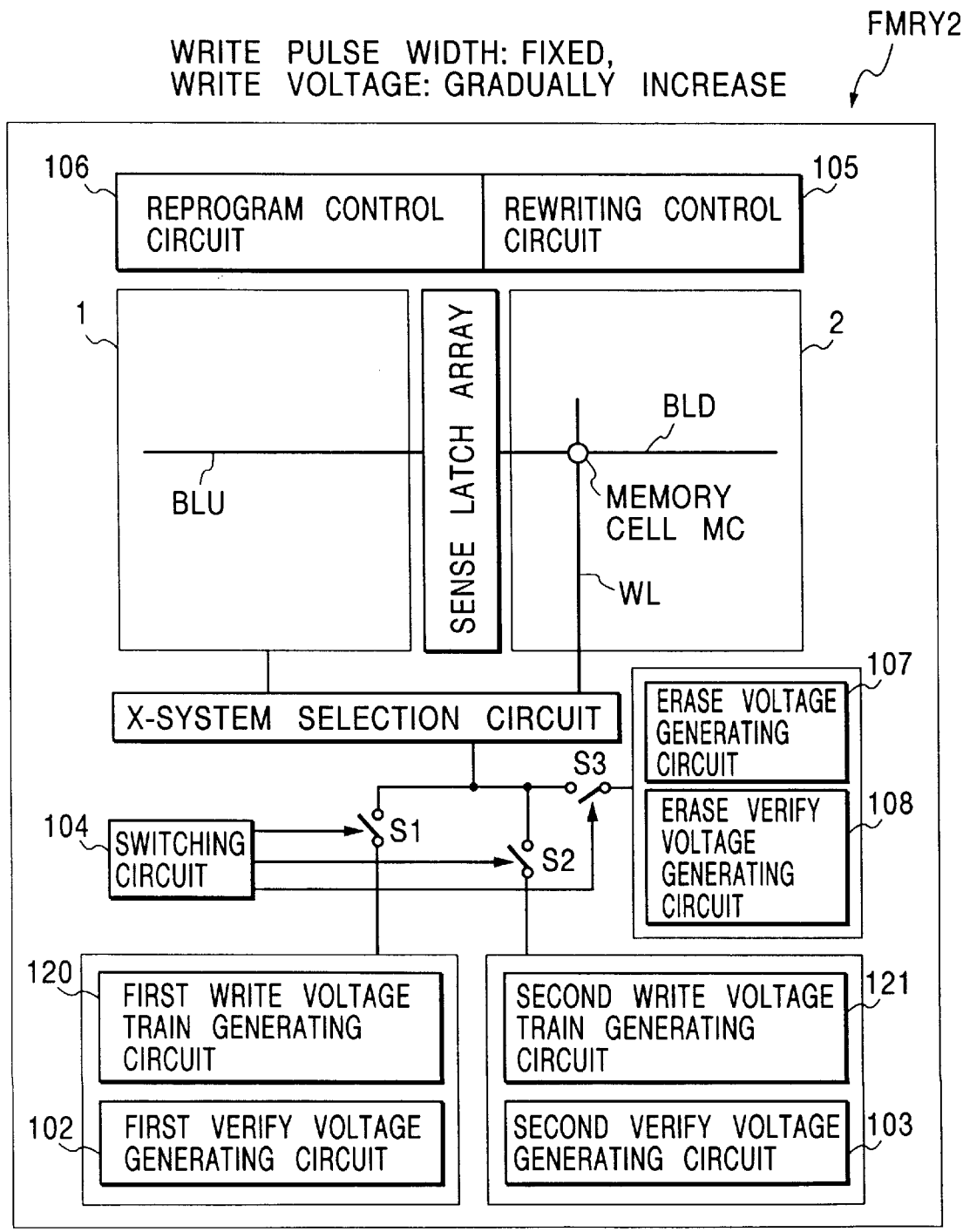
FIG. 5 is a block diagram showing another flash memory having a coarse write mode and a high-accuracy write mode.

FIG. 5 is a block diagram showing a flash memory of a type for fixing each write pulse width and successively raising write word line voltages on an absolute value basis to thereby perform writing, which applies the first write mode and the second write mode thereto.

The flash memory FMRY2 shown in FIG. 5 has also a coarse write mode (first write mode) and a high-precision write mode (second write mode), which are defined as operating modes different from each other in the amount of change in threshold voltage per pulse in a write pulse or write pulse train. FIG. 5 is different from FIG. 1 in that writing is done by fixing write pulse widths and successively raising write word line voltages on an absolute value basis as shown in FIG. 43(b). Therefore, the flash memory FMRY2 shown in FIG. 5 is provided with a first write voltage train generating circuit 120 used for first write (coarse write) in which the amount of change in threshold voltage of a memory cell per one write pulse is defined as $\Delta Vth1$, and a second write voltage train generating circuit (high-accuracy write) 121 used for second write (high-accuracy write) in which the amount of change in threshold voltage is defined as ΔVth2.

Figure 6A:
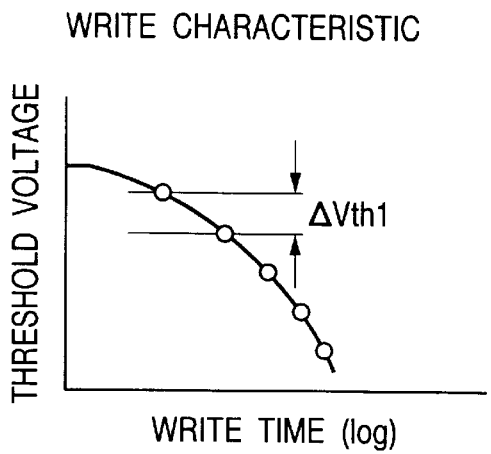
FIGS. 6(a) to 6(d) are diagrams for describing a first write characteristic and a second write characteristic of the flash memory shown in FIG. 5.
Figure 6B:
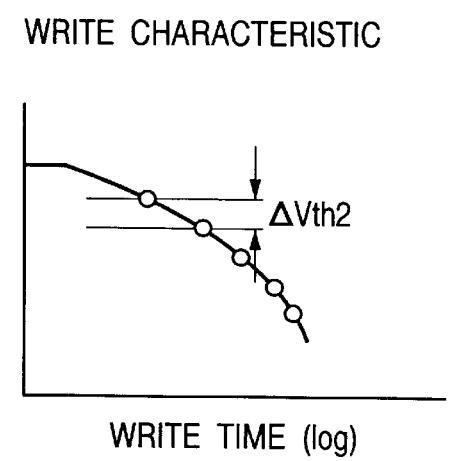

FIGS. 6(a) and 6(b) show a first write characteristic and a second write characteristic respectively. As described above, the individual write pulse widths (write times) are constant and each write voltage gradually increases as the write operation progresses.

Figure 6C:
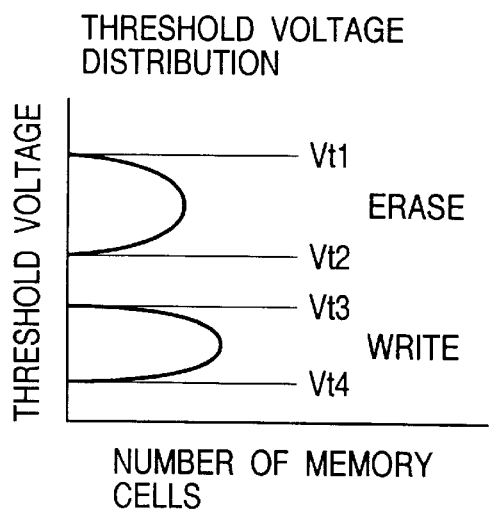
Figure 6D:
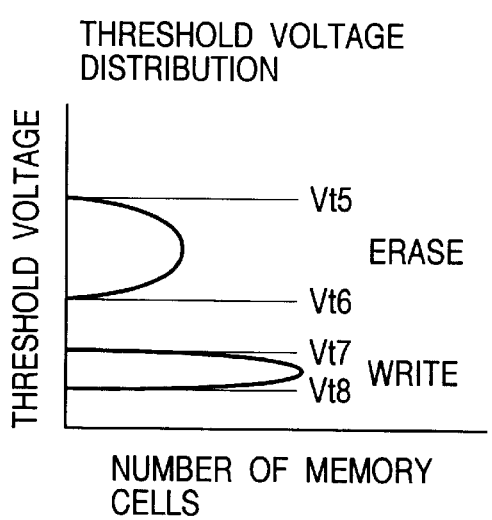

FIGS. 6(c) and 6(d) show threshold voltage distributions of each memory cell at the time of the first write and the second write respectively.

In the same manner as in FIG. 1, the flash memory FMRY2 has also a first verify voltage generating circuit 102 used upon the write operation by the first pulse train generating circuit, and a second verify voltage generating circuit 103 used upon the write operation by the second pulse train generating circuit. They are switched by a switching circuit 104 according to a write mode specified by a command in the same manner as described above.

If an increase in absolute value of the write voltage is changed in place of the change in increment of each write pulse time in the flowcharts described in FIGS. 3(a), 3(b) and 4(a), 4(b), then the flash memory FMRY2 is capable of performing the same control as described above. Since the correspondence of the configuration of FIG. 5 and the configuration of FIG. 60 is similar to FIG. 1, its description will be omitted.

Figure 7:
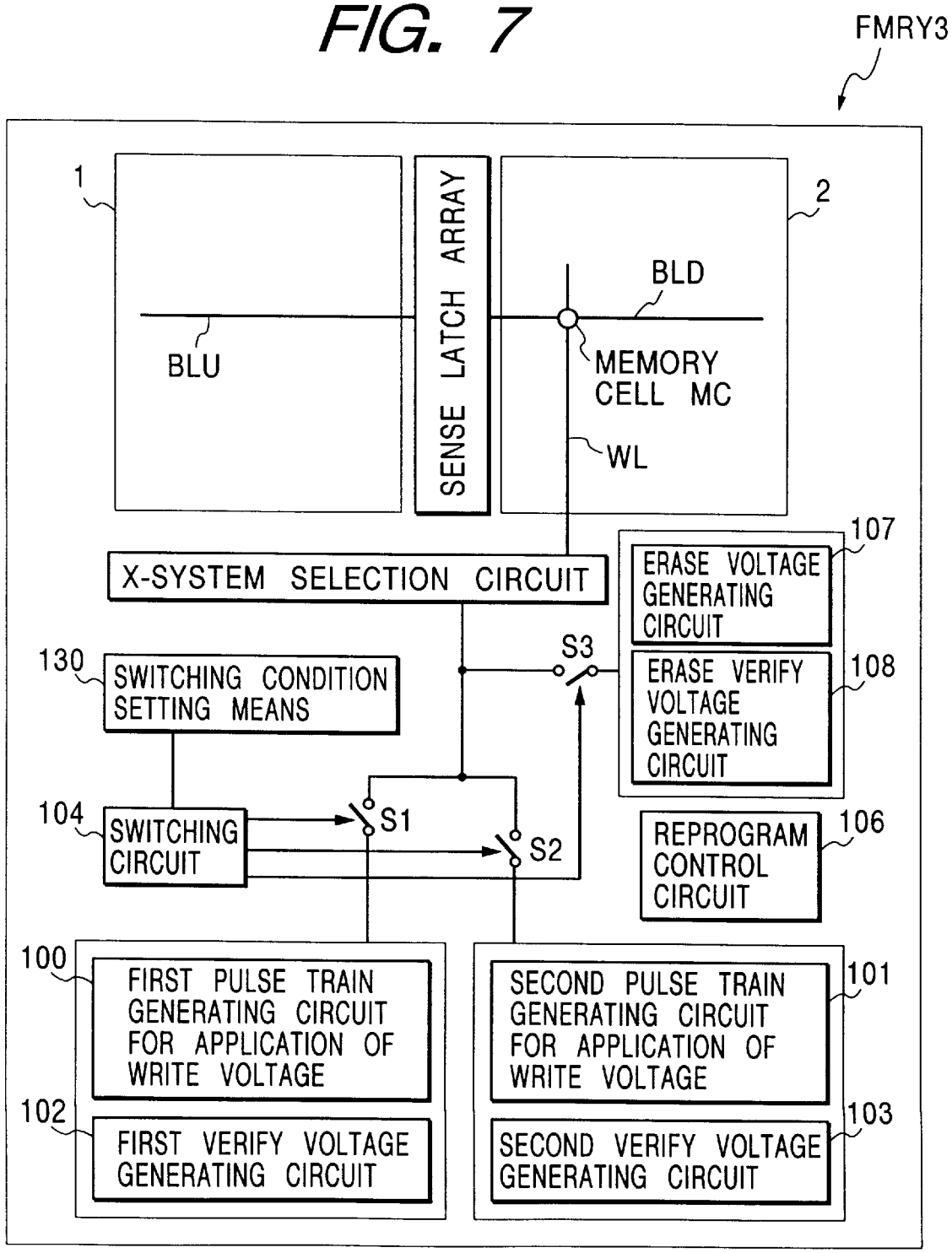
FIG. 7 is a block diagram illustrating a further flash memory having means for setting conditions for specifying a first write mode and a second write mode.
Figure 12A:
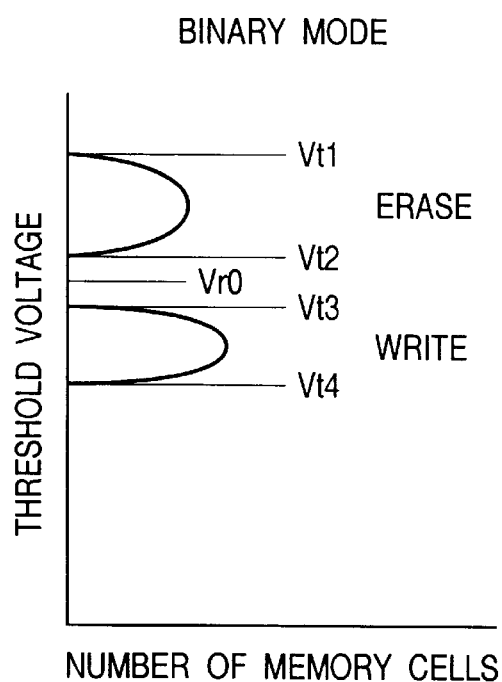
FIGS. 12(a) and 12(b) are diagrams for describing examples of threshold voltage distributions of memory cells at binary writing and multivalue writing.
Figure 12B:
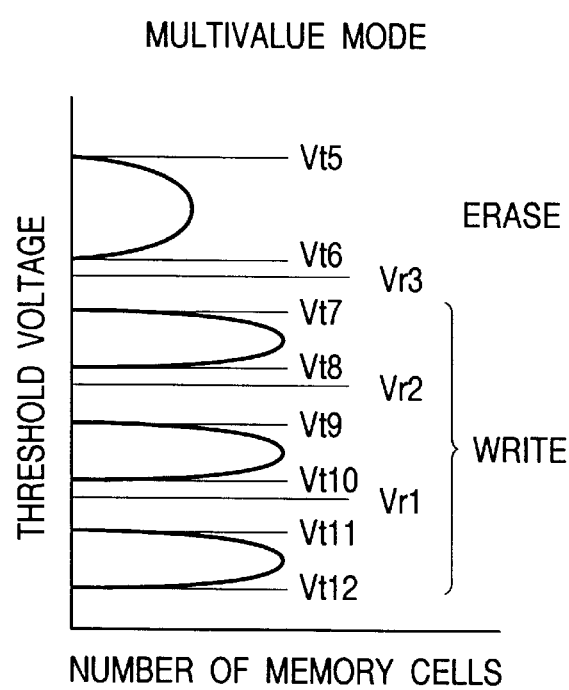

FIG. 7 is a block diagram showing a flash memory FMRY3 having means for setting conditions for specifying a first write mode and a second write mode. Namely, a mode of ΔVth1 (coarse and first write mode) and a mode of ΔVth2 (high-accuracy and second write mode) may be used by switching under specific conditions in place of the method of first coarsely writing data in the first write mode and thereafter rewriting it in the second write mode with high accuracy when the flash memory FMRY3 has the first write mode and the second write mode, as typified by the rewrite mode described in FIG. 4. The conditions are set to a switching condition setting means 130. Referring to FIG. 12(b), for example, a region ranging from V+9 to V+10 in voltage is defined as an erased state in a multivalue mode to be described later. In doing so, the writing of data into a region ranging from V+5 to V+6 in voltage is done in the first write mode. The writing of data into regions ranging from V+7 to V+8 in voltage and V+11 to V+12 in voltage is carried out in the second write mode.

FIG. 8 show switching conditions in a binary data write mode by way of example. Up to the number of reprogrammings corresponding to ten thousands or so, in which the degree of degradation in characteristic of a memory cell MC, for example, is considered not to be so developed, top priority is assigned to a write operation as the first write mode and the subsequent write operation is set as the second write mode in consideration of the influence of the degradation in characteristic of each memory cell. To this end, the switching condition setting means 130 sets the number of reprogrammings at the time of the execution of switching. At this time, the number of times that the reprogramming is done, is stored in, for example, a management region assigned in a memory mat. A switching circuit 104 regularly determines through a timer or the like whether the number of reprogrammings exceeds a set condition. If the number of reprogrammings is found to have exceeded it, then the switching circuit 104 switches the write mode from the first write mode to the second write mode when the write mode is specified or designated from the outside. The write mode may be switched according to a data holding period using the timer or the like. Further, storage areas such as a block, a sector (e.g., storage area for each word line), etc. can be set as designated or specified conditions. The conditions can be given by memory addresses in these areas. In this case, the switching circuit compares a written address with the set condition address to thereby select either first write or second write. In order to set each address, a fuse program circuit can be adopted for the switching condition setting circuit 130. Alternatively, the conditions can be set according to a chip unit of the flash memory. For example, a chip specified by the first write mode performs writing in the first write mode when the write operation is directed from the outside. As the switching condition switching means 130 in this case, a type such as an aluminum master slice conditionset according to a change in wiring pattern mask in a manufacturing process is efficient.

FIG. 9 shows a flash memory in which a first write mode and a second write mode are identical in write voltage pulse width to each other, whereas write voltages are defined as fixed voltages different from each other between the first write mode and the second write mode. Namely, the flash memory is provided with a pulse train generating circuit 140 shared between the first write mode and the second write mode, a first write voltage generating circuit 141, and a second write voltage generating circuit 142. A constant first write voltage VA outputted from the first write voltage generating circuit 141 and a second write voltage VA generated from the second write voltage generating circuit 142 are selected by a switching circuit 143 through switches S1 and S2. The selected write voltage is supplied to the pulse train generating circuit 140. The pulse train generating circuit 140 outputs a given voltage pulse train to an X-system selection circuit as a write voltage.

In the first write mode, the absolute value of the write voltage is represented as VB, whereas in the second write mode, the absolute value of the write voltage is represented as VA (VA>VB).

Figure 10A:
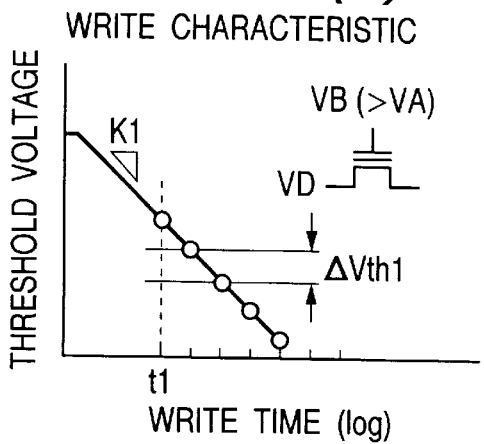
FIGS. 10(a) to 10(f) are diagrams for describing write characteristics related to the flash memory shown in FIG. 9.
Figure 10B:
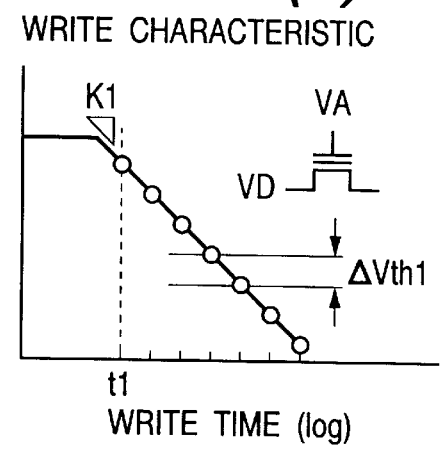

Now consider write characteristics at this time in which as shown in FIGS. 10(a) and 10(b), the inclination of a change in threshold voltage with respect to a write time (log scale) remains unchanged as K1 for the two. Since VB>VA at this time, the amount of change in threshold voltage per first write pulse in the first write mode becomes larger than that in the second write mode. Thus, the first write mode is smaller than the second write mode in the number of times that the write pulse up to the intended threshold voltage is applied. Namely, the write operation can be speeded up.

Figure 10C:
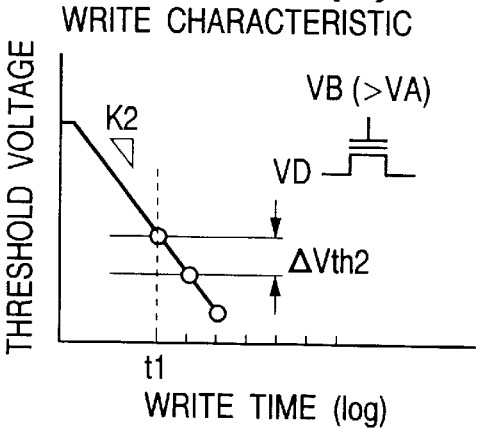
Figure 10D:
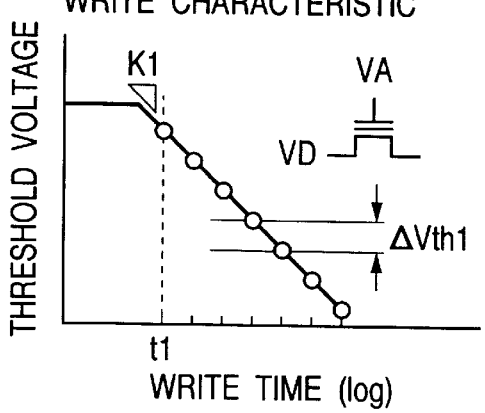

Now consider where,as shown in FIGS. 10(c) and 10(d), the inclination of change in threshold voltage with respect to the write time (log scale) in the first write mode becomes larger than that in the second write mode (K2>K1). In practice, the inclination is generally considered to virtually lead to such a case in terms of a physical characteristic of the memory cell MC. When the write voltage is VB, the inclination results in K2 in the first write mode, whereas the inclination at the time that the write voltage is VA, is represented as K1 different from K2 in the second write mode. When K1>K2 and VB>VA, the change in threshold voltage per first write pulse voltage in the first write mode becomes greater than that in the second write mode. Further, the amount of change in threshold voltage per one write pulse voltage is brought to ΔVth2 at VB, which is greater than ΔVth1 at VA. Therefore, the first write mode is smaller than the second write mode in the number of times that the write pulse up to the intended threshold voltage is applied. Namely, the write operation can be speeded up.

Figure 10E:
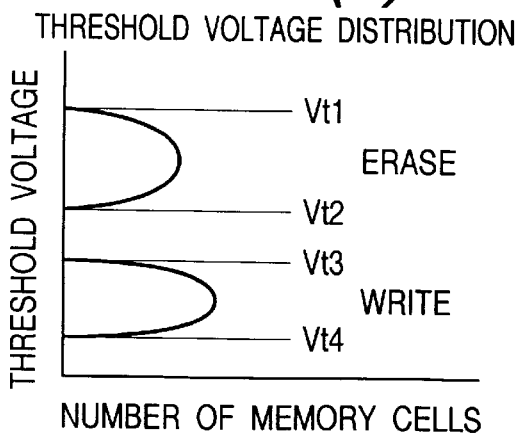
Figure 10F:
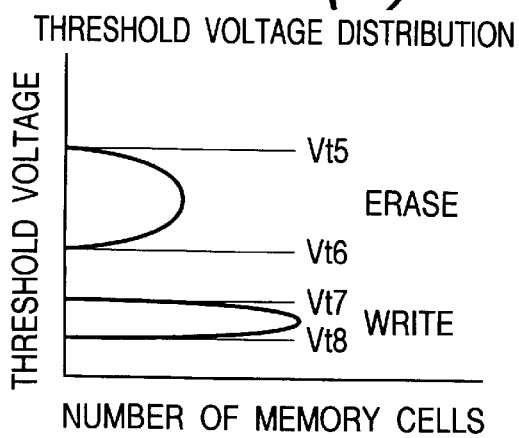

Threshold voltage distributions shown in FIGS. 10(e) and 10(f), which are obtained by the configuration of FIG. 9 have the same tendency as those by the configuration of FIG. 1.

In the configuration shown in FIG. 9, the first write voltage generating circuit 141 and the second write voltage generating circuit 142 are implemented by the charge pump circuit 84 employed in the configuration shown in FIG. 60. The switching circuit 143 and the pulse train generating circuit 140 can be constructed of the power switching circuit 83 and the power control circuit 82, and the command decoder 73, the ROM control circuit 74, the ROM 75 and the ROM decoder 76 for controlling the two circuits 83 and 82.

When writing is carried out in the form in which each write voltage is gradually increased with the write pulse widths as fixed as described in FIGS. 5 and 6(a) to 6(d), although its illustration is omitted, write voltage trains can be made identical to one another in the first and second write modes and pulse voltage widths can be rendered different from each other in the first and second write modes. In this case, the tendency of the write operation is similar to that in FIG. 10.

Figure 11:
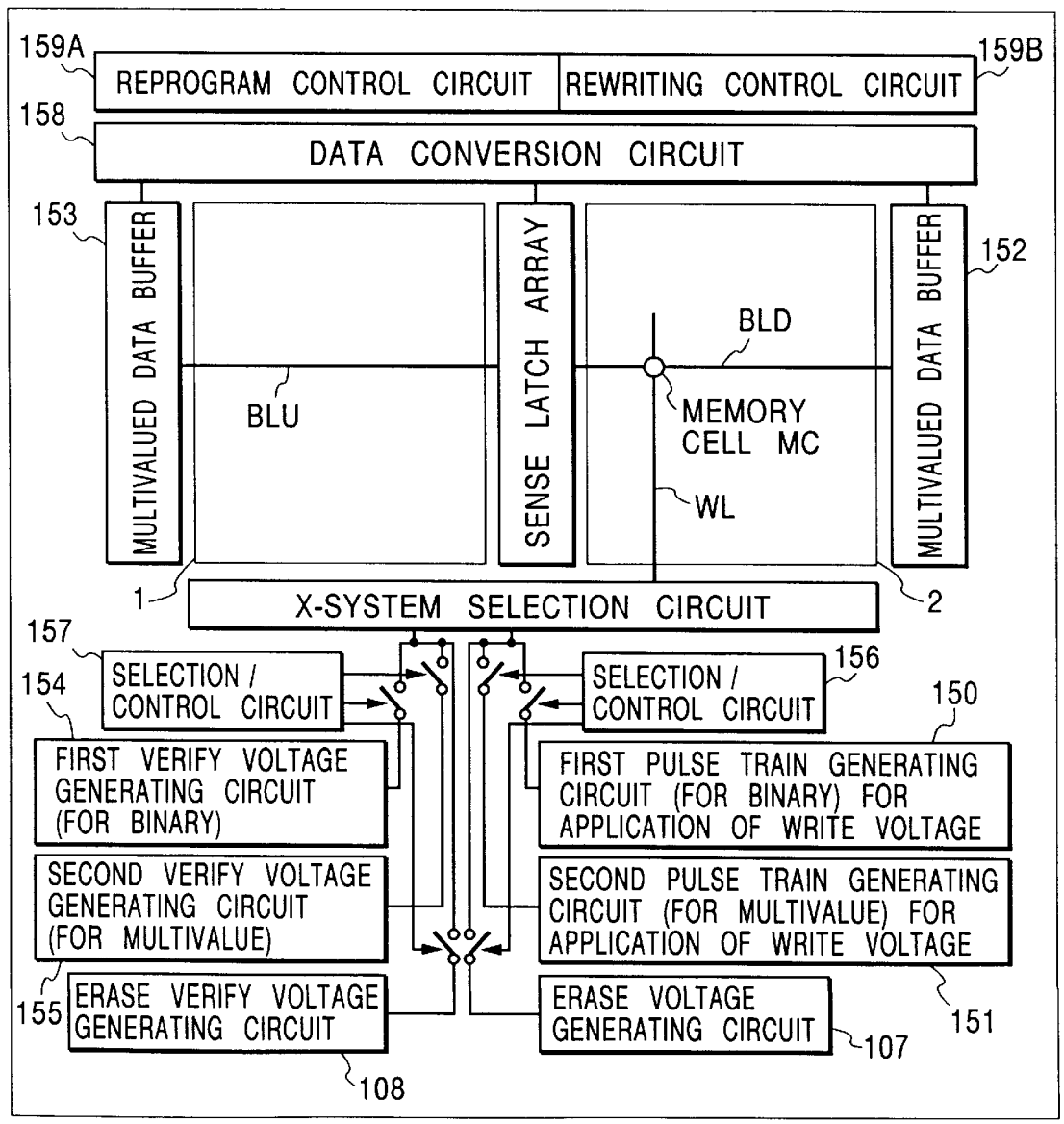
FIG. 11 is a block diagram showing a still further flash memory in which high-accuracy writing placed in a second write mode is defined as multivalue writing.

FIG. 11 shows one example of a flash memory of a type wherein the high-accuracy write in the second write mode is set as multivalue write. FIGS. 12(a) and 12(b) illustrate threshold distributions of each memory cell at binary write and multivalue write.

In the flash memory FMRY5 shown in FIG. 11, a first pulse train generating circuit 150 for application of a write voltage generates a write pulse voltage for coarsely writing data in the same manner as the first write mode described in FIGS. 1 and 2. Data to be written based on the write pulse voltage is defined as binary in the same manner as that already described in FIG. 1 or the like. At this time, an erase level ranges from Vt1 to Vt2 and a write level ranges from Vt3 to Vt4. A second pulse train generating circuit 151 for application of a write voltage generates a write pulse voltage for writing data with high accuracy in the same manner as the second write mode described in FIGS. 1 and 2. Data to be written in this case is defined as a multivalue, e.g., four values or quaternary. In FIG. 11, multivalued data buffers 152 and 153 are provided at ends of bit lines for purposes of multivalue writing. In a threshold voltage distribution of a multivalue-written memory cell, an erase level falls within a range from Vt5 to Vt6 and a write level is defined as three values, which fall within ranges from Vt7 to Vt8, Vt9 to Vt10 and Vt11 to Vt12 respectively.

A first verify voltage generating circuit 154 generates a verify voltage for the binary write in a first write mode. A second verify voltage generating circuit 155 generates a verify voltage for the multivalue write in the second write mode.

When a binary write command is supplied to the flash memory FMRY5, the flash memory FMRY5 is brought to the first write mode. Upon the binary write, the write pulse voltage outputted from the first pulse train generating circuit 150 is selected by a selection/control circuit 156. On the other hand, when a multivalue write command is supplied thereto, the flash memory FMRY5 is brought to the second write mode. Upon the multivalue write, the write pulse voltage outputted from the second pulse train generating circuit 151 is selected by the selection/control circuit 156. A selection/control circuit 157 selects a verify voltage outputted from the first verify voltage generating circuit 154 upon the binary write in the first write mode. Upon the multivalue write in the second write mode, the selection/control circuit 157 selects a verify voltage outputted from the second verify voltage generating circuit 155.

There may be cases in which Vt2 in the binary write mode is equal to Vt6 in the multivalue write mode and Vt3 is equal to Vt7. The binary write mode is defined as a first write mode for coarsely writing data. To make rough or coarse writing possible, only Vt3 to Vt4 may be provided within Vt7 to Vt12 in the multivalue mode. Since the multivalue mode needs to narrow a threshold voltage distribution, it is necessary to reduce the amount of change in threshold voltage per pulse in a write pulse or write pulse train. Although the write operation is slow, the storage capacity is obtained in double form.

The details of the multivalue write will be described later. However, when data stored in one memory cell is defined as four values or quaternary, for example, two bits indicative of binary data constitute quaternary data stored in one memory cell. Thus, upon writing, 2-bit data is decoded and whether the writing should be continued with the objective of determining which level of Vt7, Vt9 and Vt11 should be selected, is controlled in accordance with the result of decoding of the data. Correspondingly, one write verify voltage is also selected from, for example, Vt7, Vt9 and Vt11 in accordance with the result of decoding. Upon reading, a word line level is switched to voltages (Vr3, Vr2 and Vr1) between Vt6 to Vt7, Vt8 to Vt9 and Vt10 to Vt11. Read data obtained based on the respective voltages are encoded and converted into 2-bit data represented in binary form, respectively. The multivalued data buffers 152 and 153 serve as latch circuits for saving the previous read data upon reading one memory cell three times. Their control is done by a reprogram control circuit 159A and both decoding and encoding are carried out by a data conversion circuit 158.

Further, either the multivalue write or the binary write can arbitrarily be specified by a command as described above. The rewrite control circuit 159B is also capable of selecting the operation of rewriting the data first written at high speed in binary form into multivalue form. Upon writing binary data, written data is latched in a sense latch array. Namely, the multivalued data buffers 152 and 153 are not used upon writing the binary data. Upon writing multivalued data, written data are stored in the sense latch array and the multivalued data buffers 152 and 153 respectively.

Figure 13A:
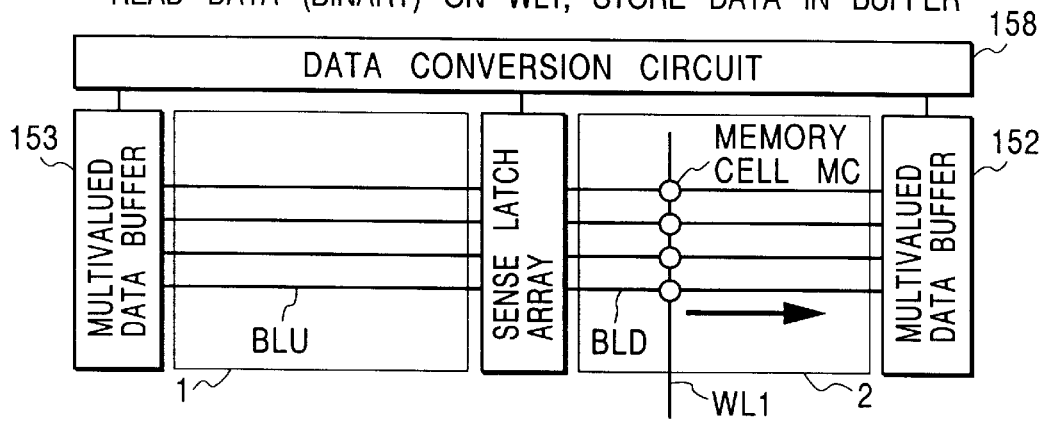
FIGS. 13(a) to 13(c) are diagrams for describing one example of a rewrite operation of binary-written data into multivalued data.
Figure 13B:
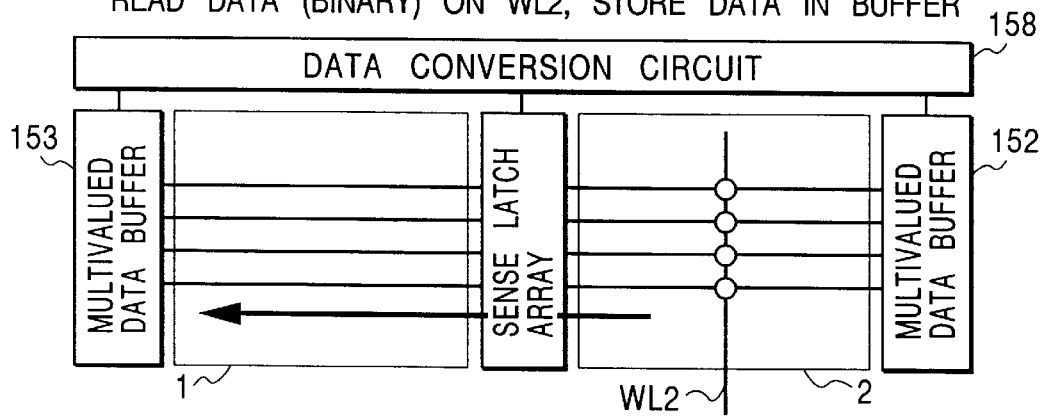
Figure 13C:
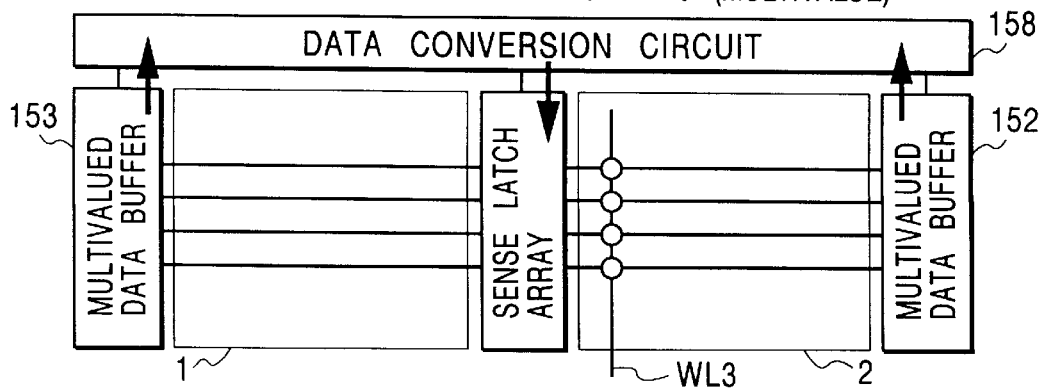

FIGS. 13(a) to 13(c) show examples of the operating of rewriting the data written in binary form into multivalue form. For example, the binary data stored in a memory cell on a word line WL1 is read and temporarily held in the buffer 152. Next, the data is read from a memory cell on a word line WL2 and then the read data is held in the other buffer 153. Thus, when the 2-bit data represented in binary form are respectively latched in the data buffers 152 and 153, the 2-bit data are decoded by the corresponding data conversion circuit 158 to generate data to be written for quaternary writing, followed by supply to the sense latch. Thereafter, the decoded information is stored in a predetermined memory cell on a word line WL3 under the control of the reprogram control circuit 159A, i.e., its data is written therein as one logical value of four values. It is natural that write non-selection might be done depending on the result of the 2-bit decoding.

Figure 14:
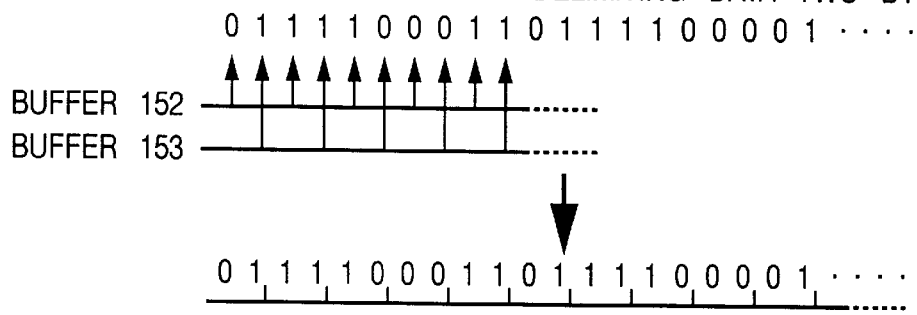
FIG. 14 is a diagram for describing another way of converting binary data into multivalued data.

FIG. 14 shows another example of the conversion of binary data into multivalued data. In FIGS. 13(a) to 13(c), the 2 bits held in the two adjacent memory cells on the same word line were converted into the quaternary data. In FIG. 14, data in a buffer 153 are arranged behind all the data stored in a buffer 152. Next, each data string is separated or partitioned two by two from the beginning and the individual partitioned 2 bits are successively converted into quaternary data respectively.

Figure 15:
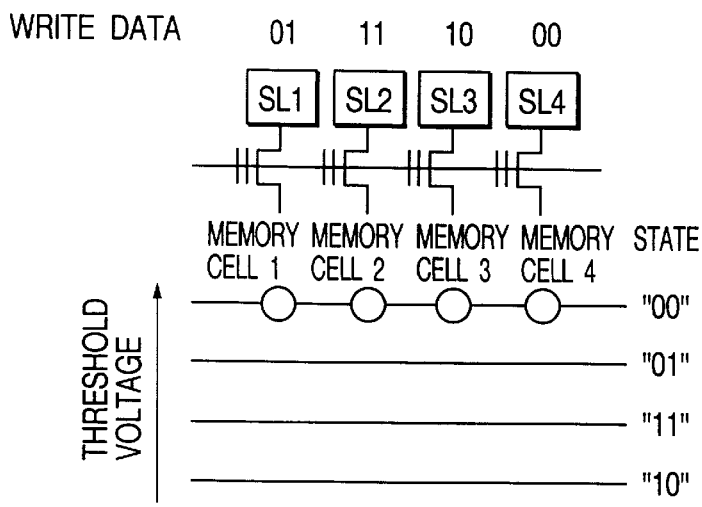
FIG. 15 is diagram for describing an initial state of each memory cell placed under a rewrite operation of its stored information from binary to multivalue.
Figure 16:
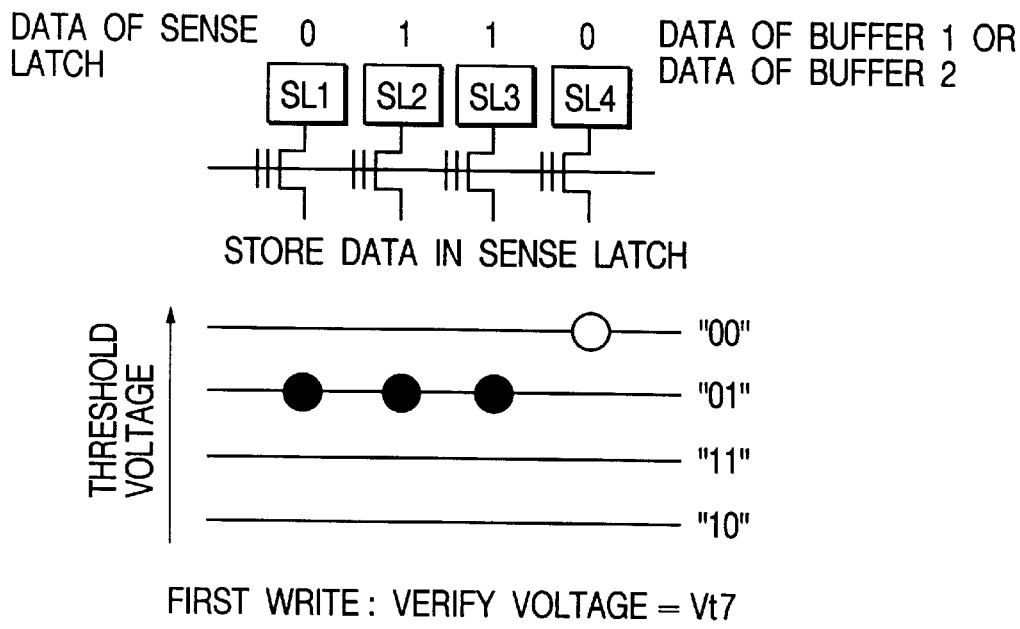
FIG. 16 is a diagram for describing the state of each memory cell at first-stage writing, which is under a rewrite operation of its stored information from binary to multivalue.

FIGS. 15 through 19 respectively show the procedures for the operations of writing 2-bit binary data as tour values or quaternary data. Four values "01" "11", "10" and "00"

indicative of quaternary data are respectively shown in the respective drawings. Threshold voltages of memory cells corresponding to the four values are associated with states of "01", "11", "10" and "00" respectively. As shown in FIG. 15, the memory cells with the quaternary data written therein are first kept in an erased state. Namely, they are kept in the state "00". Data written into sense latches SL1 through SL4 with respect to the four values "01", "11", "10" and "00" are defined as "1", "1", "1" and "0" as illustrated in FIG. 16, respectively. The data "1" latched in the corresponding sense latch allows the execution of writing and the data "0" allows the non-execution of writing. The write operations are divided into a first write shown in FIG. 16, a second write shown in FIG. 17 and a third write shown in FIG. 18. A series of first to third writes proceed until the data written into the corresponding sense latch results in "0". In the first through third writes, only verify voltages are different from one another and the control over the application of write pulse voltages is the same.

When the first write (verify voltage=Vt7) shown in FIG. 16 is performed, the threshold voltage of a memory cell to be written is brought to the state "01". Accordingly, a sense latch of a memory cell corresponding to quaternary data "01" is inverted to "0" and hence the writing of "01" is completed. Namely, the first write results in a write operation for obtaining a threshold state of "01" from the erased state.

Figure 17:
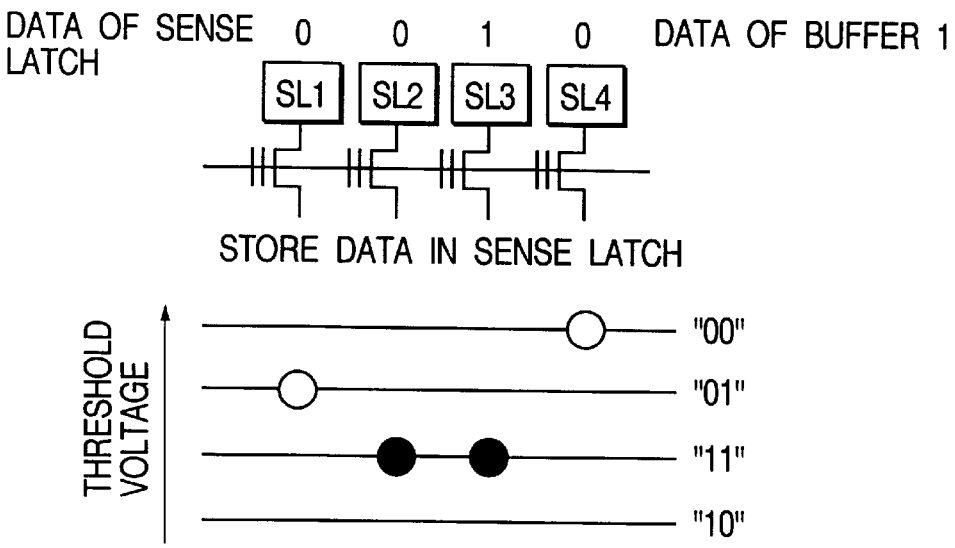
FIG. 17 is a diagram for describing the state of each memory cell at second-stage writing, which is under a rewrite operation of its stored information from binary to multivalue.

When the second write (verify voltage=Vt9) shown in FIG. 17 is done subsequent to the first write, the threshold voltage of a memory cell to be written is brought to the state "11". Accordingly, a sense latch of a memory cell corresponding to quaternary data "11" is inverted to "0" and hence the writing of "11" is completed. Namely, the second write results in a write operation for obtaining a threshold state of "11" by being performed subsequent to the first write.

Figure 18:
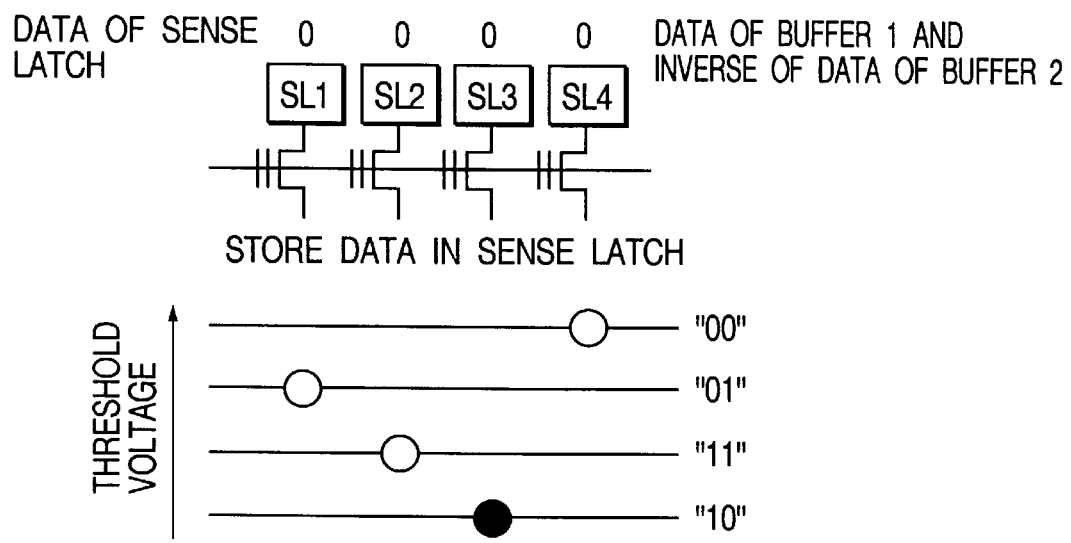
FIG. 18 is a diagram for describing the state of each memory cell at third-stage writing, which is under a rewrite operation of its stored information from binary to multivalue.
Figure 19:
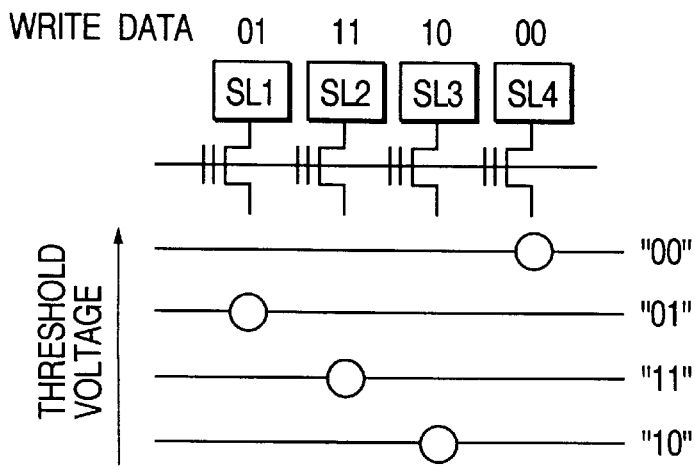
FIG. 19 is a diagram for describing the state of each memory cell at completion of a write operation, which is under a rewrite operation of its stored information from binary to multivalue.

When the third write (verify voltage=Vt11) shown in FIG. 18 is done subsequent to the second write, the threshold voltage of a memory cell to be written is brought to the state "10". Accordingly, a sense latch of a memory cell corresponding to quaternary data "10" is inverted to "0" and hence the writing of "10" is terminated. Namely, the third write results in a write operation for obtaining a threshold state of "10" by being performed subsequent to the first write and the second write.

Figure 20:
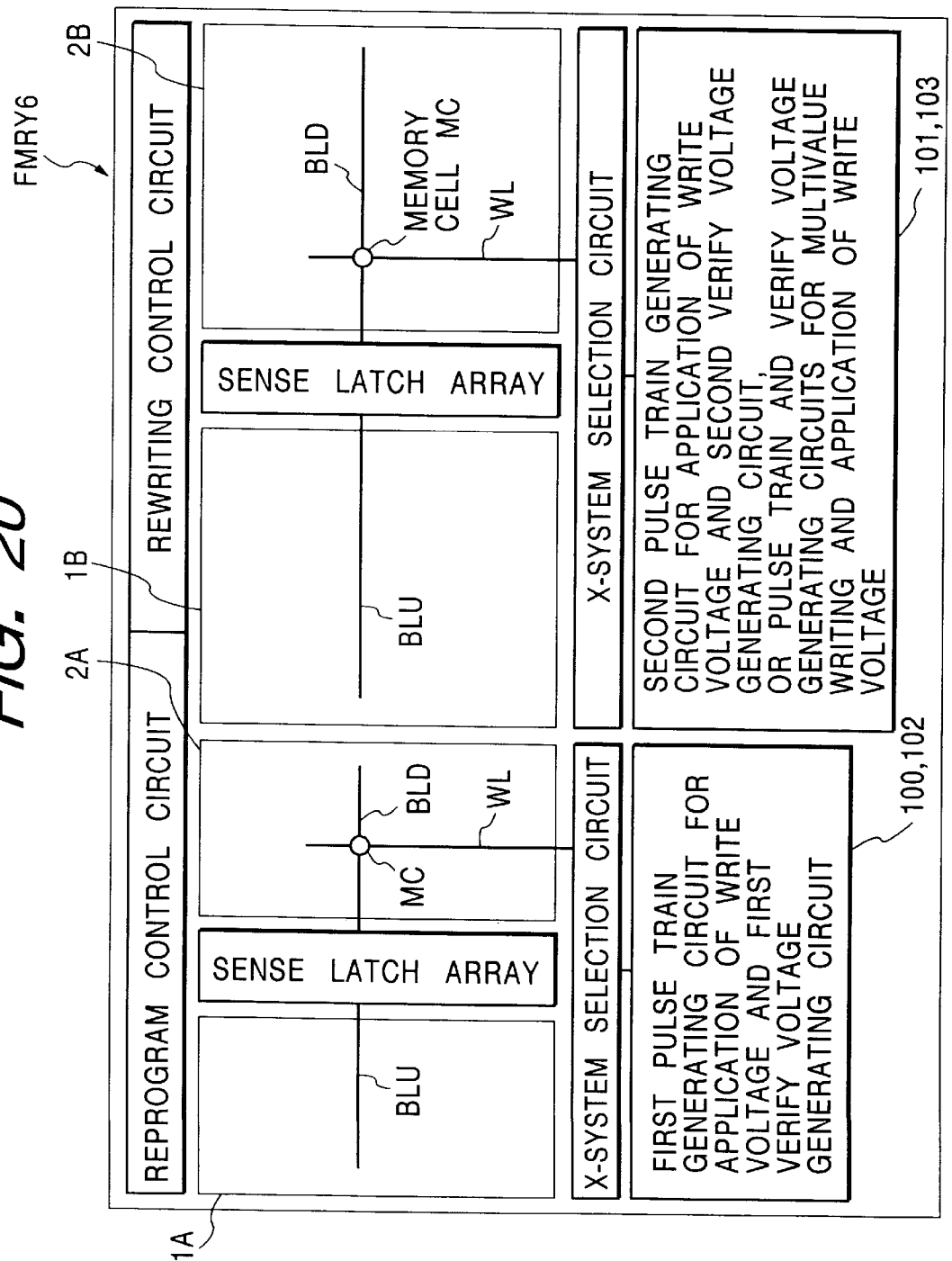
FIG. 20 is a diagram showing a still further flash memory in which coarse write-dedicated memory mats in the first write mode are physically separated from high-accuracy write-dedicated (including multivalue write) memory mats in the second write mode.

In a flash memory FMRY6 shown in FIG. 20, memory mats 1A and 2A dedicated to coarse write in the first write mode are physically distinguished from memory mats 1B and 2B dedicated to high-accuracy write (inclusive of multivalue write) in the second write mode. A sense latch array for the memory mats 1A and 2A is separated from a sense latch array for the memory mats 1B and 2B.

Figure 21:
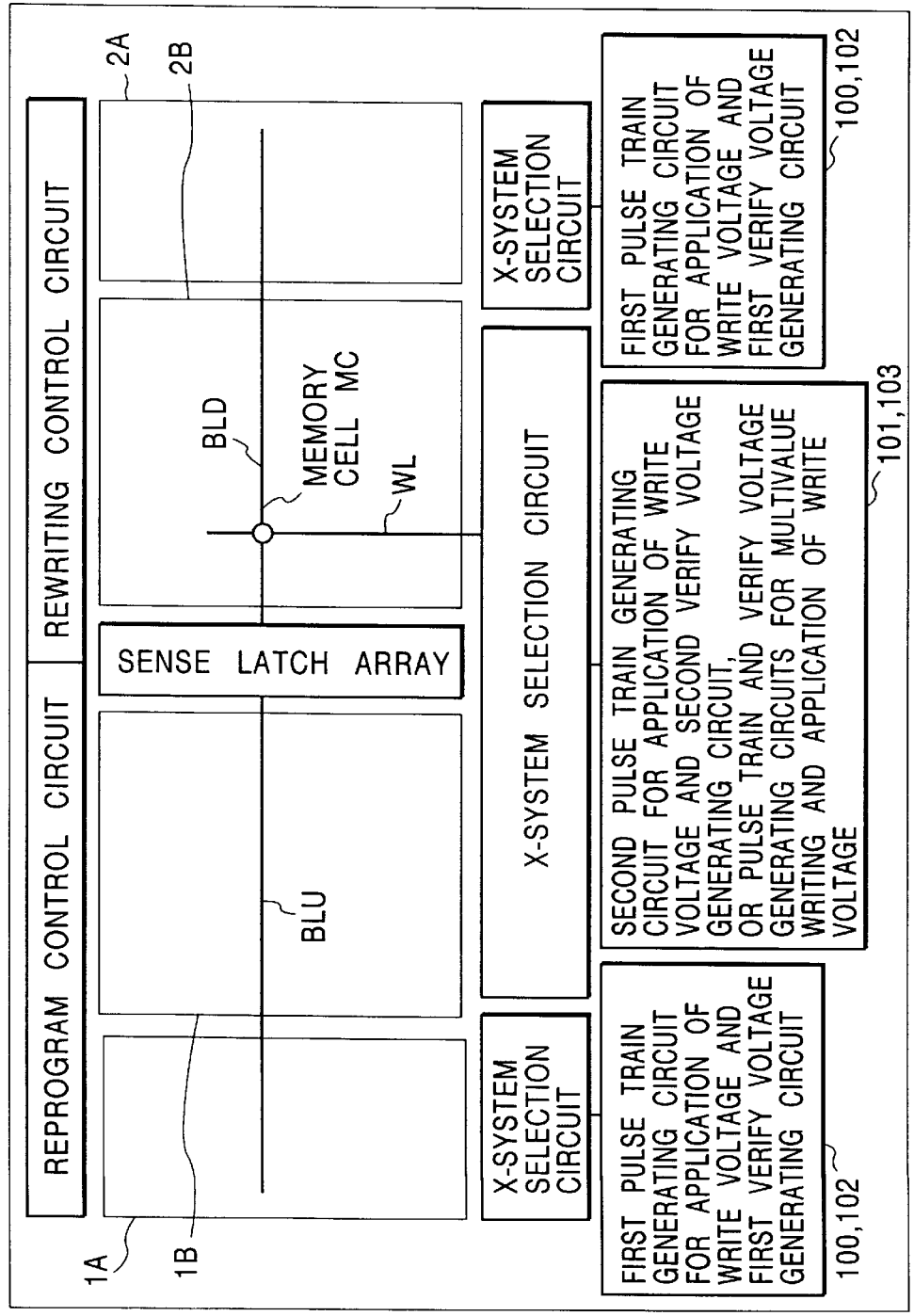
FIG. 21 is a diagram illustrating a still further flash memory having memory mats shared for coarse writing and high-accuracy writing.

A flash memory FMRY7 shown in FIG. 21 is different from the configuration shown in FIG. 13 in that a sense latch array is shared between memory mats 1A and 2A dedicated to the coarse write and memory mats 1B and 2B dedicated to the high-accuracy write. Incidentally, the individual configurations and functions shown in FIGS. 20 and 21 are basically identical to those in the above description, and their detailed description will therefore be omitted.

In the configurations shown in FIGS. 20 and 21, a first pulse train generating circuit 100 for application of a write voltage and a first verify voltage generating circuit 102 are used for writing made to the memory mats 1A and 2A. Further, a second pulse train generating circuit 101 for application of a write voltage and a second verify voltage generating circuit 103 are used for writing made to the memory mats 1B and 2B.

Memory cell structures about a tunnel film thickness of each memory cell MC, the thickness of an interlayer insulator, the size of a floating gate, etc. can be individualized so as to be optimized for the memory mats 1A and 2A dedicated to the coarse write and the memory mats 1B and 2B dedicated to the high-accuracy write.

Figure 22:
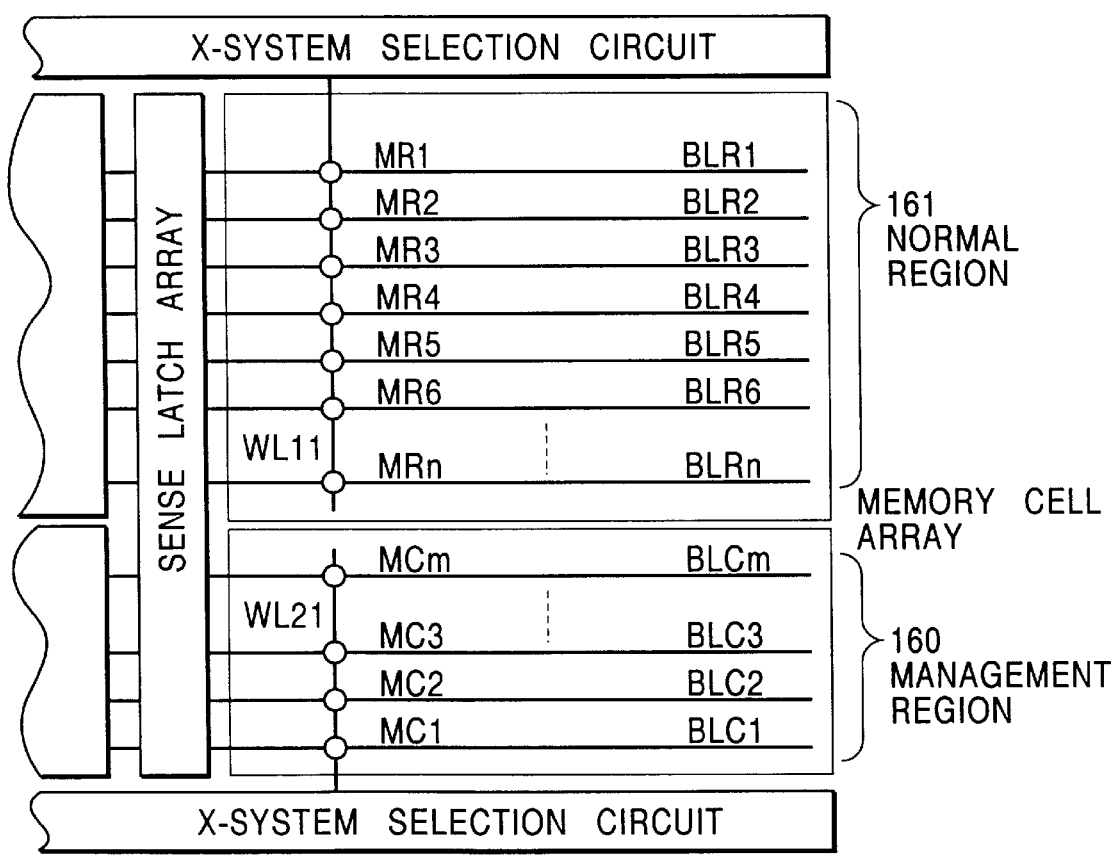
FIG. 22 is a diagram for describing an example in which data written in a first write mode (coarse write) and data written in a second write mode (high-accuracy write) are mixed into each memory mat.

FIG. 22 shows an example in which data written in a first write mode (coarse write) and data written in a second write mode (high-accuracy write) are mixed into each memory mat. In order to mix data coarsely written in the first write mode into data written with high accuracy in the second write mode for each group of memory cells (hereinafter called "sector") in the memory mats 1 and 2, for example, a portion of the sector is defined as a management region 160 and information for identifying either the data written in the first write mode or the data written in the second write mode is written into this region 160. Referring to FIG. 22, MR1 through MRn and MC1 through MCm are represented as one sector. Of these, MC1 through MCm are defined as the management region corresponding to them. The identification information is assigned to bits suitable for MC1 through MCm. Another region for storing sector management information is assigned to the management region 160. In FIG. 22, a word line WL21 for the management region 160 is separated from a word line WL11 for a portion (normal region) 161 of the sector, which is other than the management region 160. This is intended to allow, for example, the erasing of sector data by inverting valid bits indicative of the effectiveness of the sector data in the management region 160. They may be disposed on the same word line according to a system for managing the sector data. Although other configurations of the flash memory are not shown in FIG. 22, the circuits shown in FIG. 1, for example are provided in FIG. 22 in addition to the above.

Figure 23:
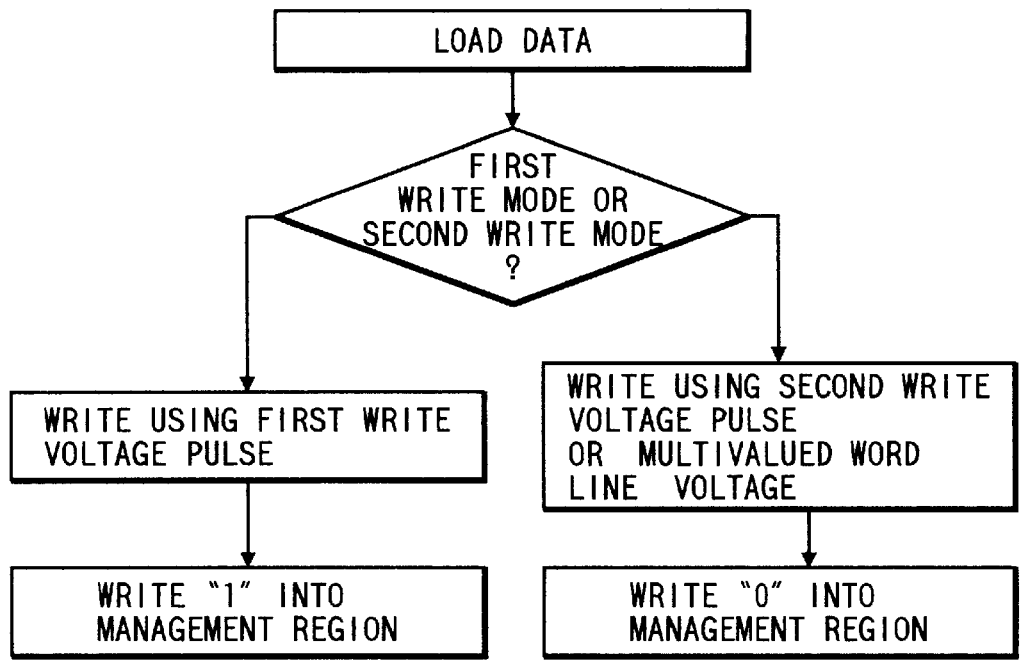
FIG. 23 is a flowchart for describing one example of a write operation at the time that the configuration shown in FIG. 22 is adopted.

FIG. 23 is a flowchart for describing the write operation at the time that the configuration of FIG. 22 is adopted. When the written data is loaded into the corresponding sense latch upon writing, either the write voltage pulse for the first write mode or the write voltage pulse (inclusive of the multivalue write) for the second write mode, each having been described in the examples shown thus far, is selected depending on whether a written command corresponds to the first write mode (coarse write) or the second write mode (high-accuracy write including multivalue writing). If the command is found to be the first write mode, then, for example, "1" is written into the management region of the corresponding sector. If the command is found to be the second write mode, then, e.g., "0" is written into the management region of the corresponding sector. It is desirable that in order to make a decision as to either data in the first write mode or data in the second write mode after the reading of the data in the management region to be described later at this time, the erasing of the management region and the write threshold voltage distribution are the same even if the data is written into the normal region in either the first write mode or the second write mode. Therefore, X-system selection circuits are provided separately for the management region 160 and the normal region 161 in FIG. 22. Thus, since a word line voltage at verify with respect to the management region 160 can be set separately from a word line voltage at verify with respect to the normal region 161, the uniform erasing and writing of data from and into each memory cell in the management region 160 can be achieved regardless of whether the normal region is written in the first write mode or the second write mode.

Figure 24:
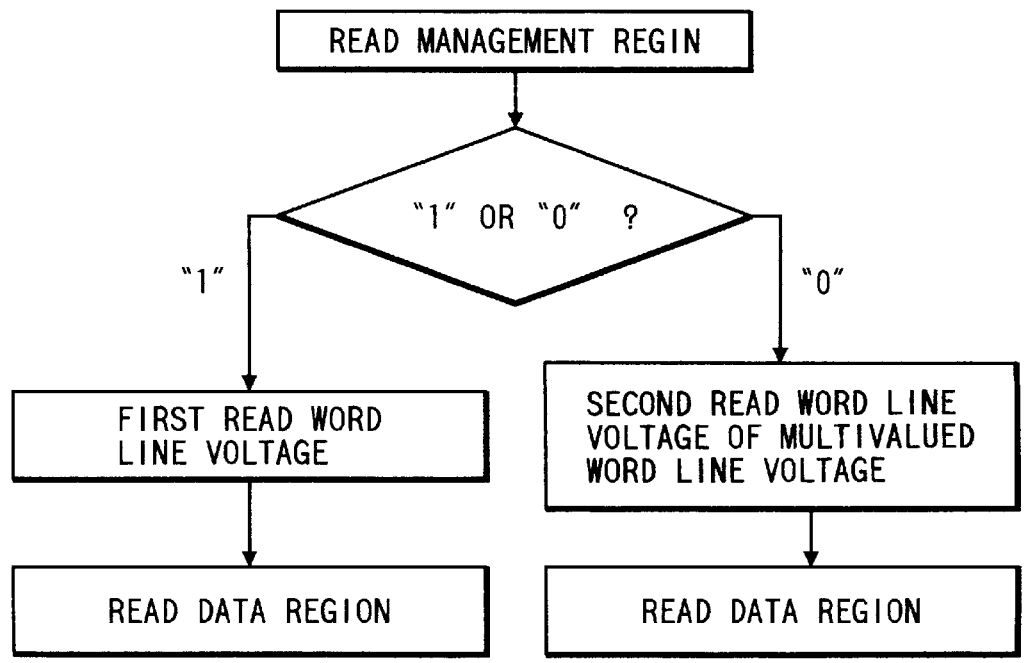
FIG. 24 is a flowchart for describing one example of a read operation at the time that the configuration shown in FIG. 22 is adopted.

FIG. 24 shows a flowchart for describing the read operation at the time that the configuration of FIG. 22 is adopted.

When the data is read from the normal region 161, the sector management information is first supplied from the management region 160 of the corresponding sector to the write-erase determination circuit 80 through the column-system circuit 60 shown in FIG. 60. When the write-erase determination circuit 80 judges the selected information included in the supplied sector management information to be "1", the normal region of the corresponding sector holds the data written in the first write mode (coarse write) therein. Therefore, the ROM decoder 76 outputs a control signal to the power control circuit 82 based on the result of decision by the write-erase determination circuit 80 so as to select a first read word line voltage, whereby the data is read from the data region (normal region) 161. On the other hand, if the information is found to be "0", then a second read word line voltage is selected to read the data written in the second write mode (high-accuracy write including the multivalue write) from the normal region of the sector, whereby the data is read from the data region (normal region) 161.

Figure 25:
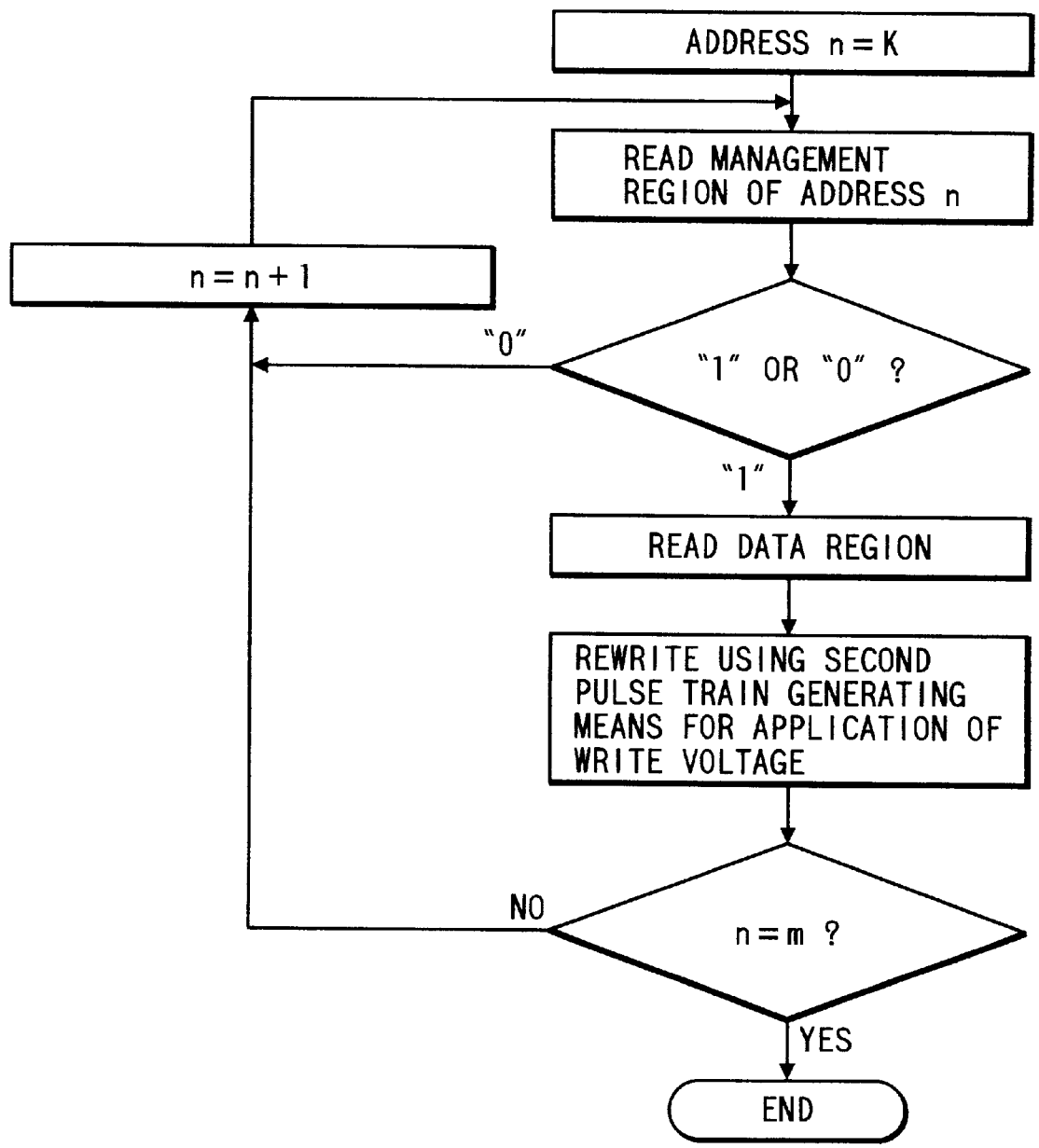
FIG. 25 is a flowchart for describing one example of a rewrite operation at the time that the configuration shown in FIG. 22 is adopted.

FIG. 25 shows a flowchart for describing one example of the rewrite operation at the time that the configuration shown in FIG. 22 is adopted. A description will now be made of the case in which addresses from an address k to an address m are defined as objects to be rewritten. The address n is set as k (n=k) and data in a management region at the address n is read. When the data is found to be "1", data in a sector corresponding to the address has led to being written in the first write mode (coarse write). In this case, the data is read from the normal region 161 of the corresponding sector and a second word line voltage is selected to rewrite the data into the original data storage area in the second write mode (including high-accuracy write by multivalues). On the other hand, if the data is found to be "0", then the data is already written in the second write mode (including high-accuracy write by multivalues) and hence the object to be rewritten proceeds to the next address. The above operation is repeated until the intended final address is reached.

[3. Coarse write]

The various flash memories described above had the two coarse and high-accuracy write modes. Several examples of flash memories for carrying out high-speed write while paying attention to the execution of the coarse write will next be explained. Namely, the flash memories to be described have the coarse write mode alone.

Figure 26A:
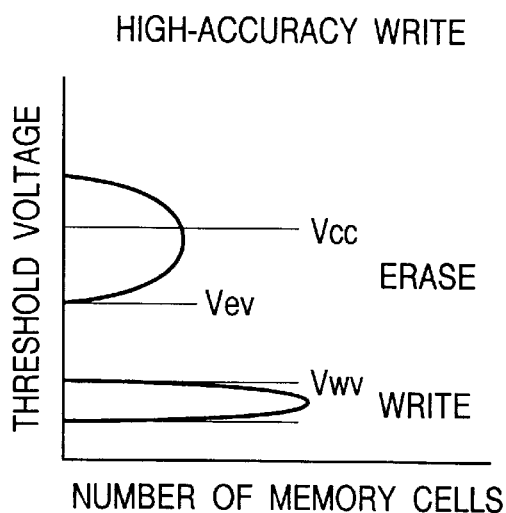
FIGS. 26(a) and 26(b) are diagrams for describing comparisons between threshold voltage distributions at the time that a write level (corresponding to a threshold voltage of each memory cell in a written state) is set to ½ of Vcc and above ½ of Vcc.
Figure 26B:
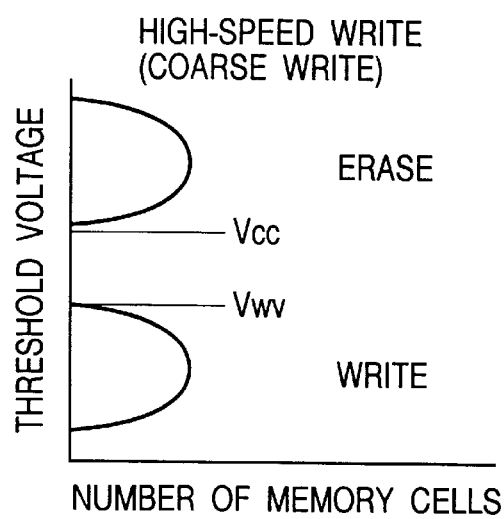

A threshold voltage distribution shown in FIG. 26(*a*) is obtained from a flash memory wherein a write level (equivalent to a verify word line voltage at writing) is defined as, for example, 1.5V with respect to a power source voltage Vcc of, for example, 3.3V and the threshold voltage of a memory cell per write pulse is set so as to range from 0.1V to 0.2V, whereby the high-accuracy write is carried out. Thus, the result obtained by adding a threshold voltage difference for obtaining a current difference required to be detected by a sense amplifier (sense latch) to the voltage of 1.5V when the write level Vwv is being set to, for example, the voltage of 1.5V with respect to the Vcc of 3.3V, for example, represents the minimum voltage Vev in an erased state. It is necessary to determine the level of the erased state even from the viewpoint of reliability elsewhere. Whether or not the threshold voltage of each memory cell has reached above Vev, is detected upon erasing to control the application of an erase pulse voltage. Thus, a low-voltage operation and high reliability can be achieved by reducing Vwv and thereby reducing even Vev to as low a value as possible.

However, the characteristic of each memory cell is varied by three digits or so in terms of the time required for the threshold voltage to reach from the eased state to a threshold voltage of Vwv when the voltages to be applied upon writing are the same. When the writing of the memory cell is done under such conditions, variations in normal characteristic of a memory cell are considered to correspond to a case in which unless a change $\Delta Vth1$ in threshold voltage of the memory cell is set to a write pulse (width or voltage) below 0.2V, the threshold voltage will lead to 0V or less according to memory cells. If the 3-digit variation is converted to a variation in equivalent threshold voltage, then it results in 3V or so. Thus, since the amount of change in threshold voltage per write pulse is equivalent to a variation of 0.2V between the attainment of the threshold voltage of a memory cell fastest in writing to Vwv and the attainment of the threshold voltage of a memory cell slowest in writing to Vwv, it is necessary to apply pulses 15 times from simple calculation. It is necessary to perform a verify operation for making a decision as to whether the threshold voltage has reached a desired value for each pulse. This results in overhead of a long write time.

Thus, in order to write data at high speed, the amount of change $\Delta Vth1$ per write pulse is increased by making the pulse width long or raising the voltage. However, the memory cell is apt to deplete due to this increase. Accordingly, the write level is rendered high. When Vwv is set to 2.0V, for example, $\Delta Vth1$ can be set to 0.4V. Since the 3-digit variation is equivalent to a threshold voltage variation of 3V assuming the existence of the 3-digit variation, the pulse may be applied eight times. Since the number of verify operations is reduced as much, the data can be written at high speed. Namely, the write level (corresponding to the threshold voltage of a memory cell in a written state) was intended to fall below ½ the Vcc in the art. However, the write level is set so as to fall above one half of Vcc as shown in FIG. 26(*b*) herein. When a chip supports power source voltages of two types or more, the above description applies to the lowest power source voltage.

Further, the characteristic of the memory cell is varied by three digits or so in terms of the time necessary for the threshold voltage to reach from an erased state to a threshold voltage of Vwv when the voltage to be applied upon writing is the same. If the 3-digit variation is converted to a variation in equivalent threshold voltage, then it results in 3V or so. The variation converted to this voltage is taken as $\Delta Vdv$. This time, the erase level (corresponding to a threshold voltage level in an erased state) and the write level (corresponding to a threshold voltage in a written state) are rendered high relatively and the amount of change $\Delta Vth$ in threshold voltage per write pulse is increased. Further, the number of verify operations is reduced. When the number of verify operations necessary to absorb (reduce) the variation in threshold voltage is taken as n at this time, $n=\Delta Vdv \div \Delta Vth$. When $\Delta Vdv$ determined by the structure of the memory cell, its manufacturing conditions, the number of memory cells, etc. is obtained from this equation, a method of effectively setting $\Delta Vth$ at the time that it is not restricted by the erase level and the write level, is determined. Namely, even if $\Delta Vth$ is increased 0.1V or higher where n is not reduced once or more when $\Delta Vth$ is increased by 0.1V corresponding to a restrictable step width, its increase does not make sense in terms of an improvement (a reduction in the number of write verify operations) in write operating speed because n is an integer. Although the write level is out of restrictions, the more $\Delta Vth$ is raised, the more the threshold voltage after writing becomes greater (variation becomes increased) and the memory cell is apt to deplete. Further, the amount of a transfer electric charge becomes great and the number of times that reprogramming can be performed, is reduced since a value obtained by cumulating the amounts of electric charges transferable over an insulating film is about 10 coulombs. According to this, $\Delta$Vth may preferably be small. Thus, when n is not reduced once or more, $\Delta$Vth is considered to be the most suitable value. Namely, when $\Delta$Vth is virtually increased by 0.1V, the value of $\Delta$Vth at the time that the number of verify operations is not reduced once or more, may be adopted for coarse writing. When the write level is determined by being placed under restriction from read disturbance, the upper limit (corresponding to the maximum amount $\Delta$Vth) of the write level is determined.

Figure 27:
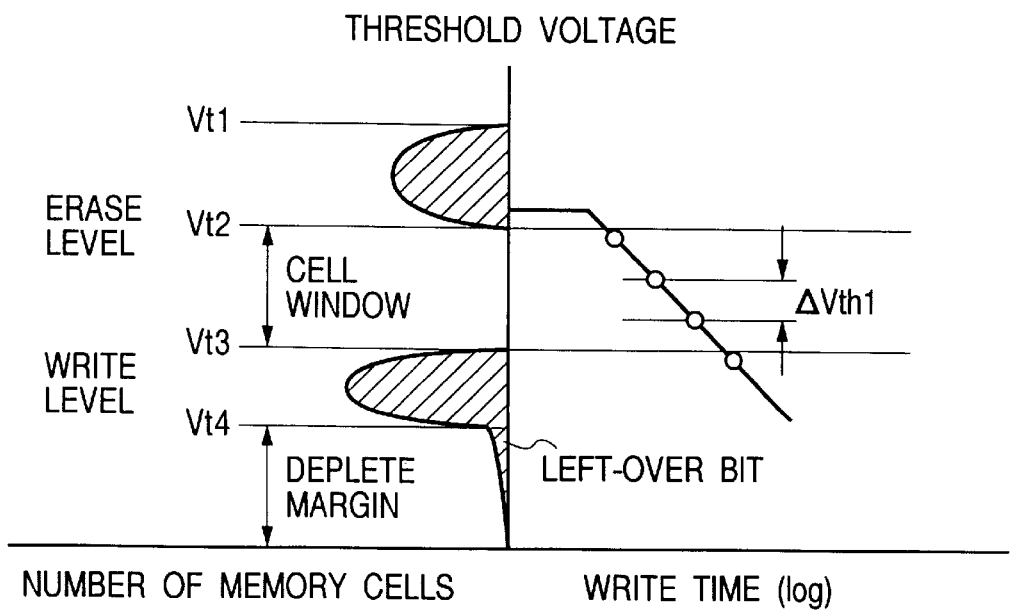
FIG. 27 is a diagram for describing an erase level and a write level set to above ½ of Vcc and the amount of change in threshold voltage per write voltage pulse.
Figure 28A:
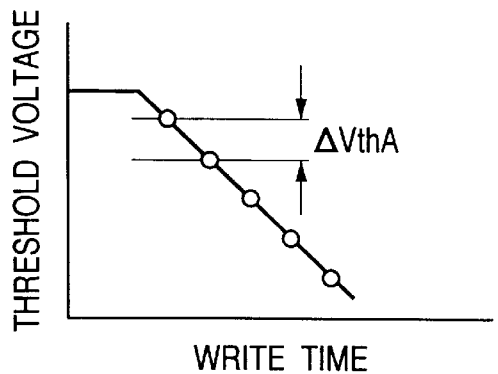
FIGS. 28(a) to 28(d) are diagrams for describing the difference in write meaning between an AND memory cell and a NAND memory cell.
Figure 28B:
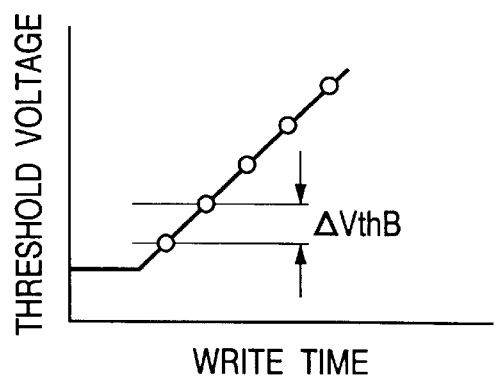
Figure 28C:
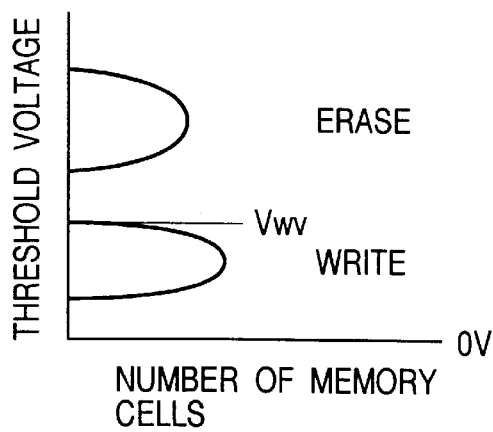
Figure 28D:
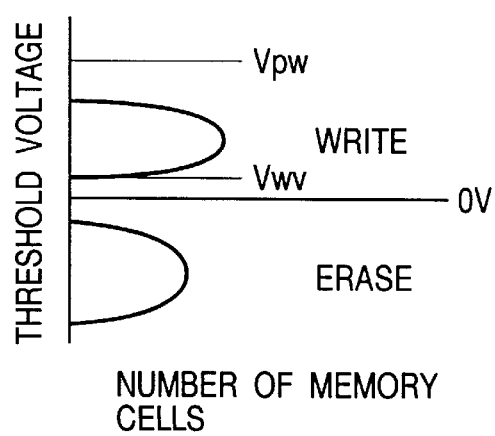
Figure 29A:
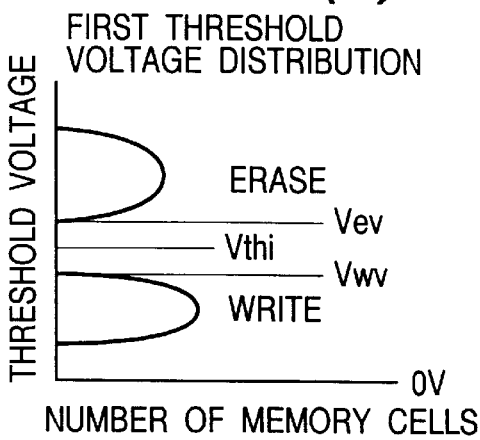
FIGS. 29(a) to 29(f) are diagrams for describing the correlation between erase and write levels of each memory cell and a threshold voltage (Vthi) thereof at irradiation of ultraviolet rays by being divided into the AND memory cell structure and NAND memory cell structure shown in FIG. 28.
Figure 29B:
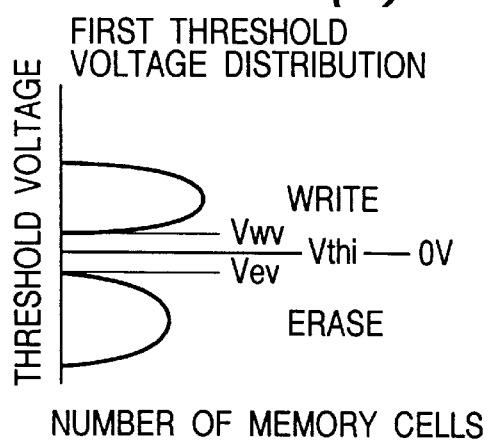
Figure 29C:
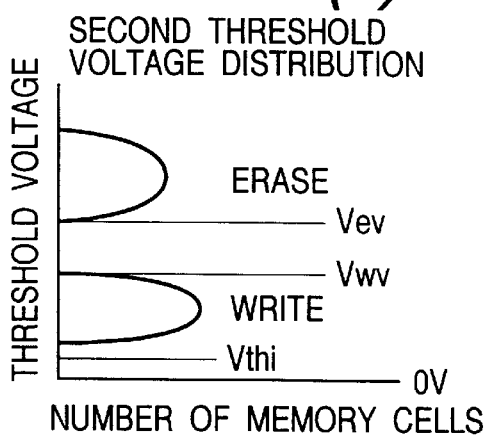
Figure 29D:
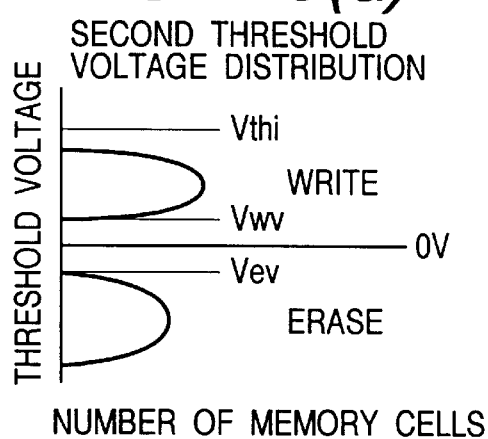
Figure 29E:
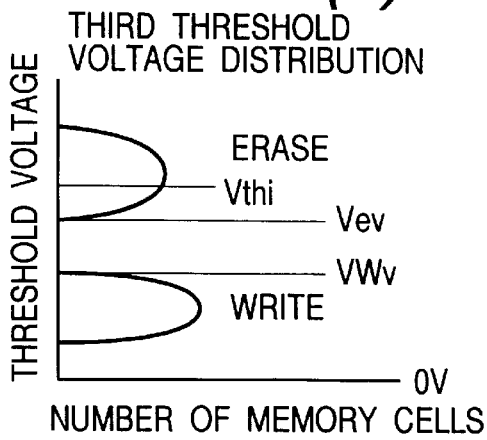
Figure 29F:
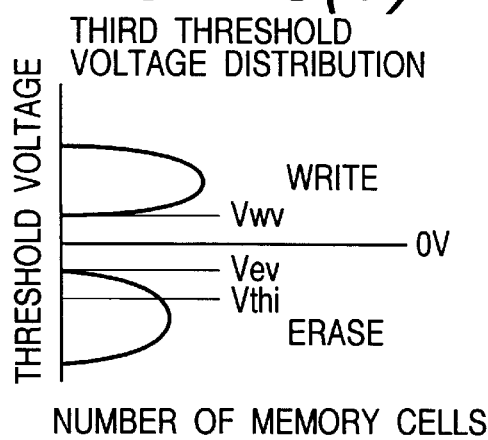

FIG. 27 illustrates the above event from the viewpoint of an erase level, a write level and the amount of change in threshold voltage per write pulse. When a decision voltage at erasing is taken as Vev (corresponding to a word line voltage at verify), the threshold voltage of each memory cell reaches above Vev. The maximum value of the threshold voltage at erasing is Vt1. If a decision voltage at writing is taken as Vwv (corresponding to a word line voltage at verify), then the threshold voltage of the memory cell falls below Vwv. When except for specific bits, the minimum value of a threshold voltage distribution is Vt4. At this time, memory cells each having a threshold voltage between Vev and Vwv do not exist. The threshold voltage between Vev and Vwv is called a "cell window". The magnitude (corresponding to the difference between Vev and Vwv) of this cell window is about 1V. It is necessary to set a word line voltage at reading between the two.

The threshold voltage distribution obtained at the time that the corresponding memory cell proceeds within the cell window of about 1V from the erased state to the written state at the amount of change $\Delta$Vth1 below 0.2V per write pulse, is represented as shown in FIG. 26(*a*). In FIG. 26(*b*) in contrast to this, the memory cell proceeds within the cell window from the erased state to the written state at $\Delta$Vth1= 0.4V or higher. Thus, since the number of verify operations decreases, the overhead is reduced and hence high-speed writing is made possible.

With respect to the configuration of the flash memory, which performs the coarse write as the write operation, its overall block diagram is not shown. This is because this configuration can be implemented by slightly changing the functions of the circuit block shown in FIG. 60, such as the setting of the width of a first write pulse, the level of a verify voltage and a word line selection level, etc. under the configuration of the flash memory shown in FIG. 60.

FIGS. 28(*a*) to 28(*d*) show the difference in the meaning of "write" between an AND memory cell and a NAND memory cell. In the description made up to this time, the operation of reducing the threshold voltage of each memory cell is called a "write operation". Contrary to this, however, the operation of selectively bringing memory cells whose threshold voltages are uniformly set to a relatively low state, to a high threshold voltage state (the operation of increasing the threshold voltage) might be called a "write". In the former, the threshold voltage of the memory cell is allowed not so as to fall below 0V. In the latter, the threshold voltage of the memory cell is allowed not so as to fall above Vpw under the same condition if the structure of the NAND memory cell is shown as an illustrative example. Vpw indicates a voltage (corresponding to a word line voltage for each pass memory cell) applied to a word line for a non-selected memory cell at reading.

In the case of the structure of the AND memory cell exhibiting the threshold voltage distribution shown in FIG. 28(*a*) and FIG. 28(*c*), the verify voltage Vwv at writing is set to 2V or ½Vcc or higher. In the case of the structure of the NAND memory cell exhibiting the threshold voltage distribution shown in FIG. 28(*b*) and FIG. 28(*d*), the difference between the verify voltage Vwv at writing and the word line voltage Vpw for the pass memory cell is set to 2V or higher or ½Vcc or higher. In the flash memory having the high-accuracy write mode (second write mode) and the coarse write mode (first write mode), the verify voltage Vwv (corresponding to the difference between the same and 0V) at writing varies between the two modes and the difference in the coarse write mode in which the amount of change is large, is set higher than in the high-accuracy write mode, in the AND memory cell structure exhibiting the threshold voltage distribution shown in FIG. 28(*c*). On the other hand, in the NAND memory cell structure exhibiting the threshold voltage distribution shown in FIG. 28(*d*), the difference between the verify voltages Vwv and Vpw varies between the two modes and the difference in the coarse mode in which the amount of change is large, is set to a large value.

FIGS. 29(*a*) to 29(*f*) illustrate the correlation between erase and write levels of each memory cell and a threshold voltage (Vthi in thermal equilibrium state) thereof at irradiation of ultraviolet rays in a state of being divided into the AND memory cell structure and NAND memory cell structure shown in FIG. 28(*a*) to FIG. 28(*d*). The threshold voltage Vthi at irradiation of the ultraviolet rays roughly means the threshold voltage of a memory cell in which electrons and holes are in an equilibrium state.

FIGS. 29(*a*) and 29(*b*) respectively show Vthi set at intermediate points between Vev and Vwv. Thus, a retention margin and a read disturb margin are both met. In this state, both erasing and writing can be carried out substantially in the same time. FIG. 29(*c*) and 29(*d*) respectively illustrate Vthi set on the Vwv sides. The writing of data can be done at high speed under a low applied voltage. However, the reliability of the erasing is low relatively. FIGS. 29(*e*) and 29(*f*) respectively depict Vthi set on the Vev sides. FIGS. 29(*e*) and 29(*f*) are contrary to FIGS. 29(*c*) and 29(*d*) and Vthi become resistive to retention.

[4. Trimming over write voltage pulse widths and the like]

Figure 30:
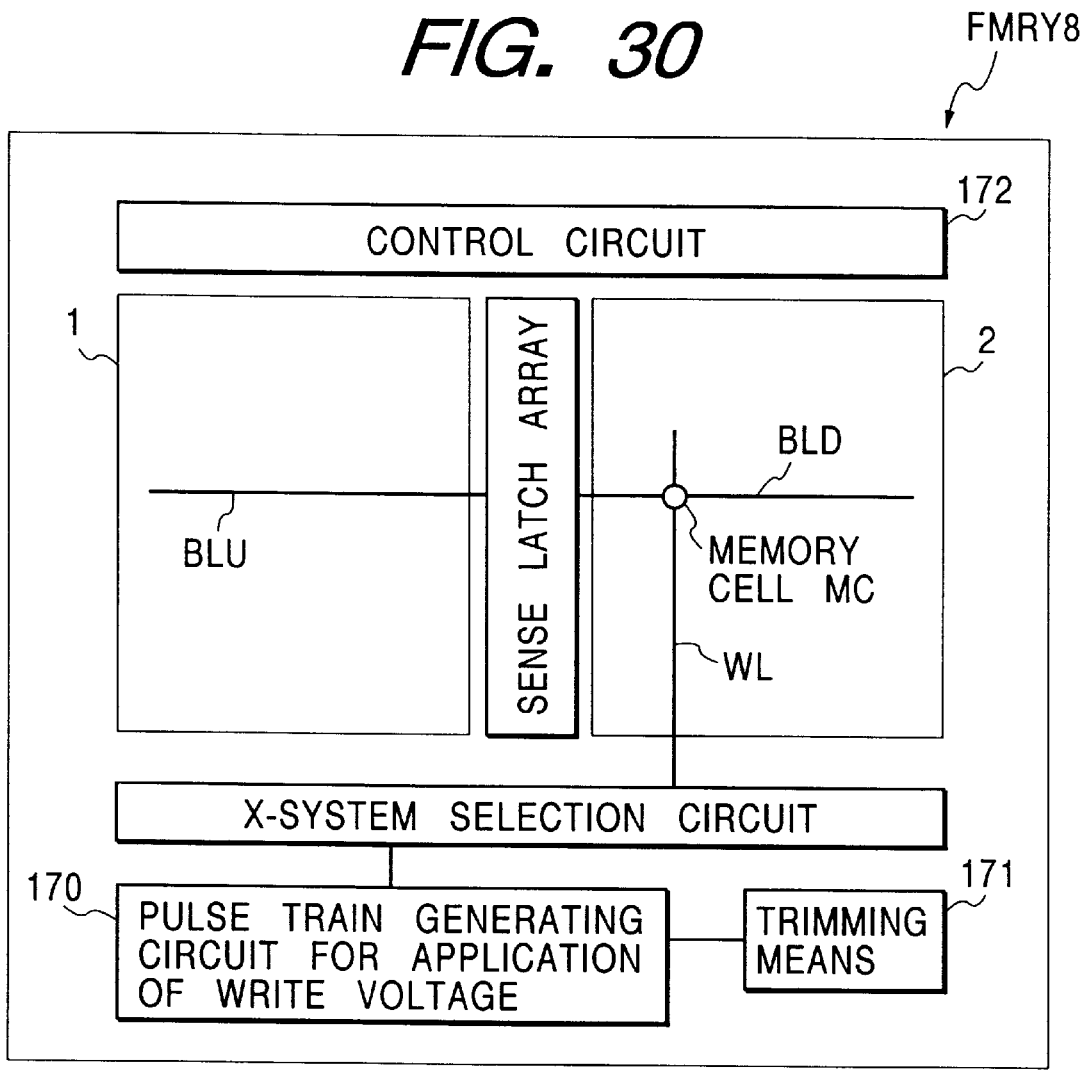
FIG. 30 is a block diagram showing a still further flash memory capable of trimming the minimum write voltage pulse widths and the magnitudes of changes in write voltage pulse width.

FIG. 30 shows one example of a flash memory FMRY8 capable of trimming the minimum write voltage pulse widths and the magnitudes of changes in write voltage pulse width. Reference numeral 170 indicates a pulse train generating circuit for application of a write voltage, reference numeral 171 indicates a trimming means and reference numeral 172 indicates a whole control circuit. The writing by the flash memory shown in the same drawing takes such a form as to gradually increase a write voltage pulse width at a fixed write voltage in the same manner as described in FIG. 1. The flash memory FMRY8 is identical in basic configuration to that shown in FIG. 60, and means for allowing trimming over each write voltage pulse width is newly added to the flash memory FMRY8.

The number of objects to be trimmed is two. The first object to be trimmed is the minimum write voltage pulse width shown in FIG. 31(*a*) and FIG. 31(*b*). Namely, it is a period in which the initial write voltage is applied under written operation. When the initial write voltage is applied to a chip B shown in FIG. 31(*b*) in the same pulse width as that in a chip A, needless write and verify operations in which the threshold voltage substantially remains unchanged virtually, must be done many times, so that the efficiency of writing is greatly reduced. If the minimum write voltage pulse width can be trimmed, then the differences in characteristic between memory cells due to process variations can be rendered uniform or optimized between flash memory chips. Namely, the amounts of shifts of threshold voltages of memory cells are considered to subtly differ from each other due to the process variations even if the write voltages are the same. Allowing adjustments to the difference in such characteristic in an inspection process such as a wafer process of a flash memory is of importance to make high-speed write possible.

Figure 32A:
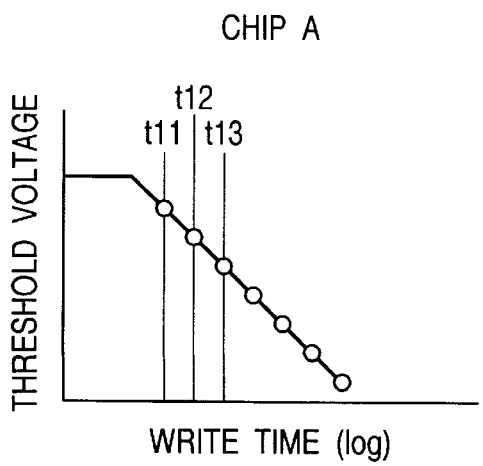
FIGS. 32(a) and 32(b) are diagrams for describing trimming of the magnitudes of the changes in write voltage pulse width to be subjected to another trimming in FIG. 30.
Figure 32B:
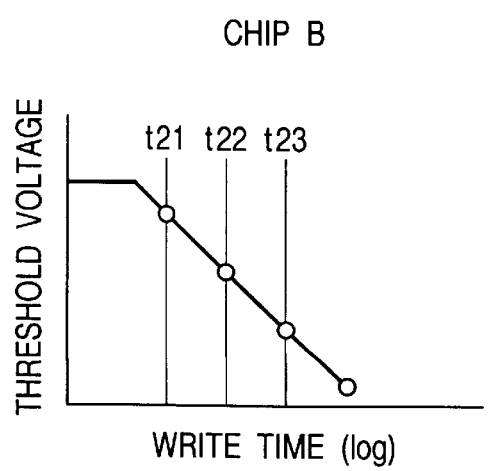

The second object to be trimmed is the magnitude of a change in write voltage pulse width. Namely, the amounts of gradual increases in pulse widths are defined as objects to be trimmed as shown in FIGS. 32(a) and 32(b).

Figure 33:
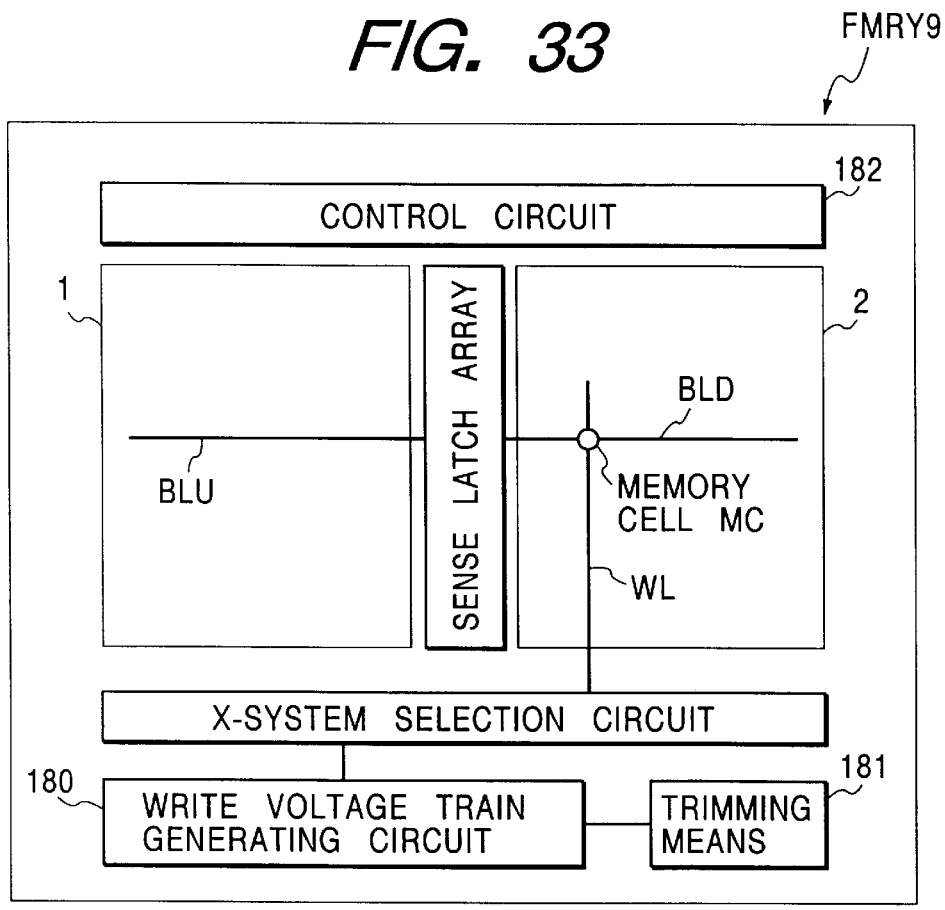
FIG. 33 is a block diagram illustrating a still further flash memory capable of trimming the absolute values of the minimum voltages and the magnitudes of changes in write voltages under a system for varying the write voltages.

FIG. 33 shows a flash memory FMRY9 capable of trimming the absolute values of the minimum voltages and the magnitudes of changes in voltages under a system for varying the write voltages. Reference numeral 180 indicates a write voltage train generating circuit, reference numeral 181 indicates a trimming means, and reference numeral 182 indicates a control circuit for performing the entire control in accordance with a command supplied thereto. The writing by the flash memory shown in the same drawing takes such a form as to gradually increase each write voltage at a fixed write pulse width in the same manner as described in FIG. 5. The flash memory FMRY9 is identical in basic configuration to that shown in FIG. 60, and means for allowing trimming over each write voltage is newly added to the flash memory FMRY9.

Figure 34A:
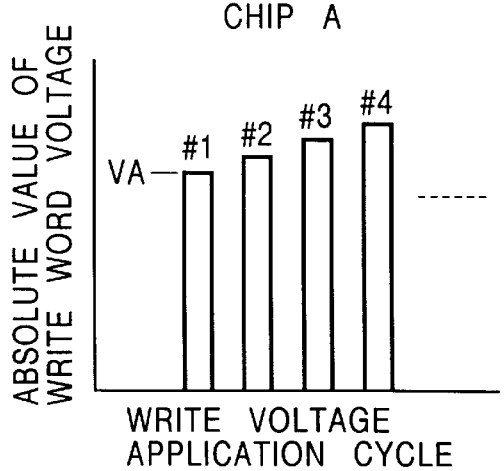
FIGS. 34(a) and 34(b) are diagrams for describing trimming of the minimum write voltage values to be subjected to one trimming in FIG. 33.
Figure 34B:
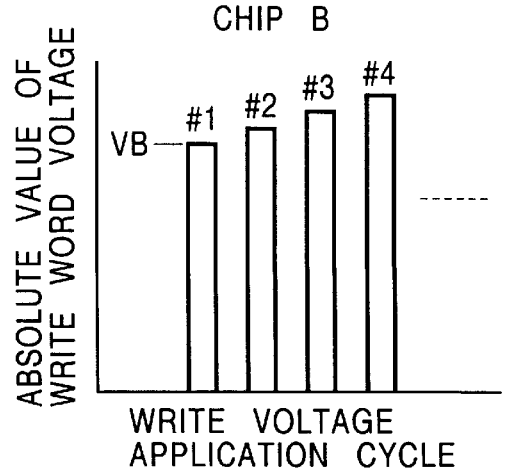

The number of objects to be trimmed is two. The first object to be trimmed is the minimum write voltage values VA and VB shown in FIG. 34(a) and FIG. 34(b). The second object to be trimmed is gradually-increased widths $\Delta$VWA and $\Delta$VWB of write voltage values shown in FIG. 35(a) and FIG. 35(b).

FIG. 36 illustrates a flash memory FMRY10 provided with means capable of changing the magnitudes of the changes at the midpoint. Reference numeral 190 indicates a pulse train generating circuit for application of a write voltage or write voltage generating circuit. Reference numeral 191 indicates a pulse train setting circuit or voltage train setting circuit. Reference numeral 192 indicates a control circuit for controlling the entire control in accordance with a command supplied thereto. The flash memory FMRY9 is identical in basic configuration to that shown in FIG. 60.

Figure 37A:
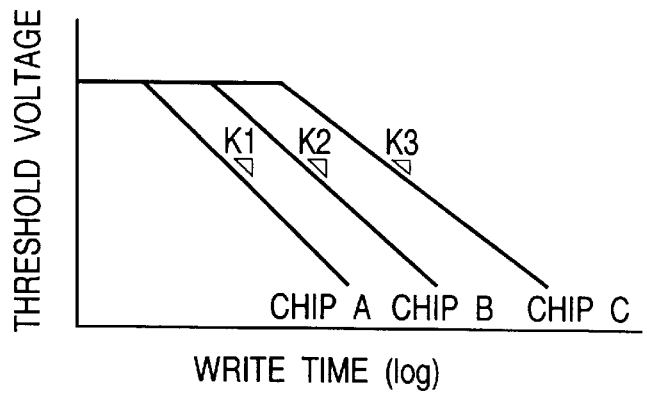
FIGS. 37(a) to 37(c) are diagrams for describing one example ot the technique of changing each gradually-increased width or the like of the threshold voltage in the course of its increasing in FIG. 36.
Figure 37B:
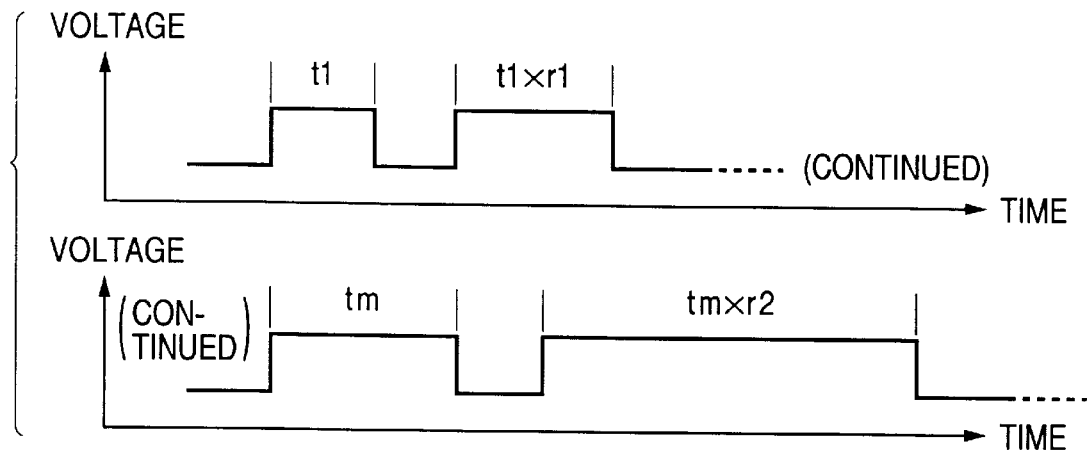
Figure 37C:
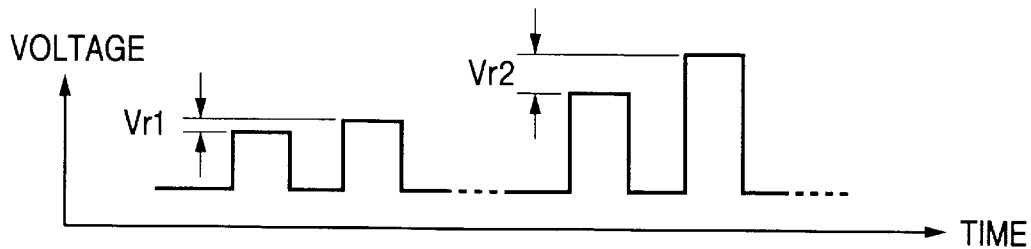

In the case of a flash memory that performs in such a way as to gradually increase a pulse width at a fixed write voltage, for example, the rate of change in threshold voltage with respect to each write time can be changed for each chip as illustrated by a write characteristic shown in FIG. 37(a) by way of example. When the rate of increase in pulse width with respect to the immediately preceding pulse width is r1 times as shown in FIG. 37(b), for example, the rate of increase can be changed to r2 times at the midpoint. As also shown in FIG. 37(c), the initial amount of increase Vr1 in voltage can be changed to Vr2 in the course of its increase. Although not shown in the drawing in particular, a change in the magnitude of change at midpoint is called "concepts" including allowing the magnitude of change not to vary at midpoint (to be set to a fixed value).

Figure 31A:
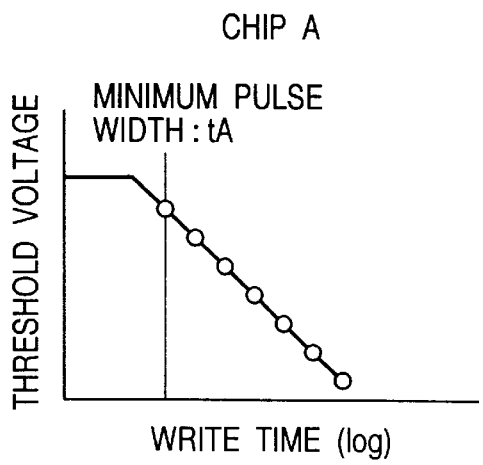
FIGS. 31(a) and 31(b) are diagrams for describing trimming of the minimum write voltage pulse widths to be subjected to trimming in FIG. 30.
Figure 31B:
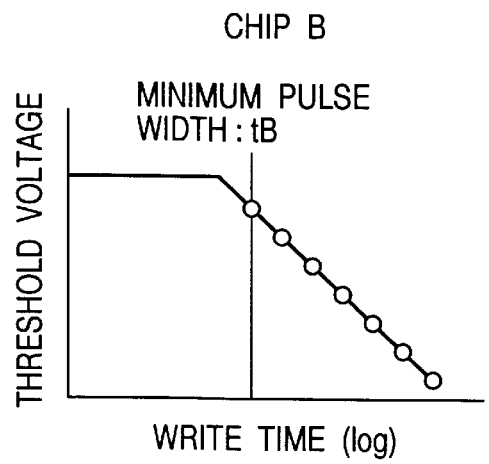
Figure 38:
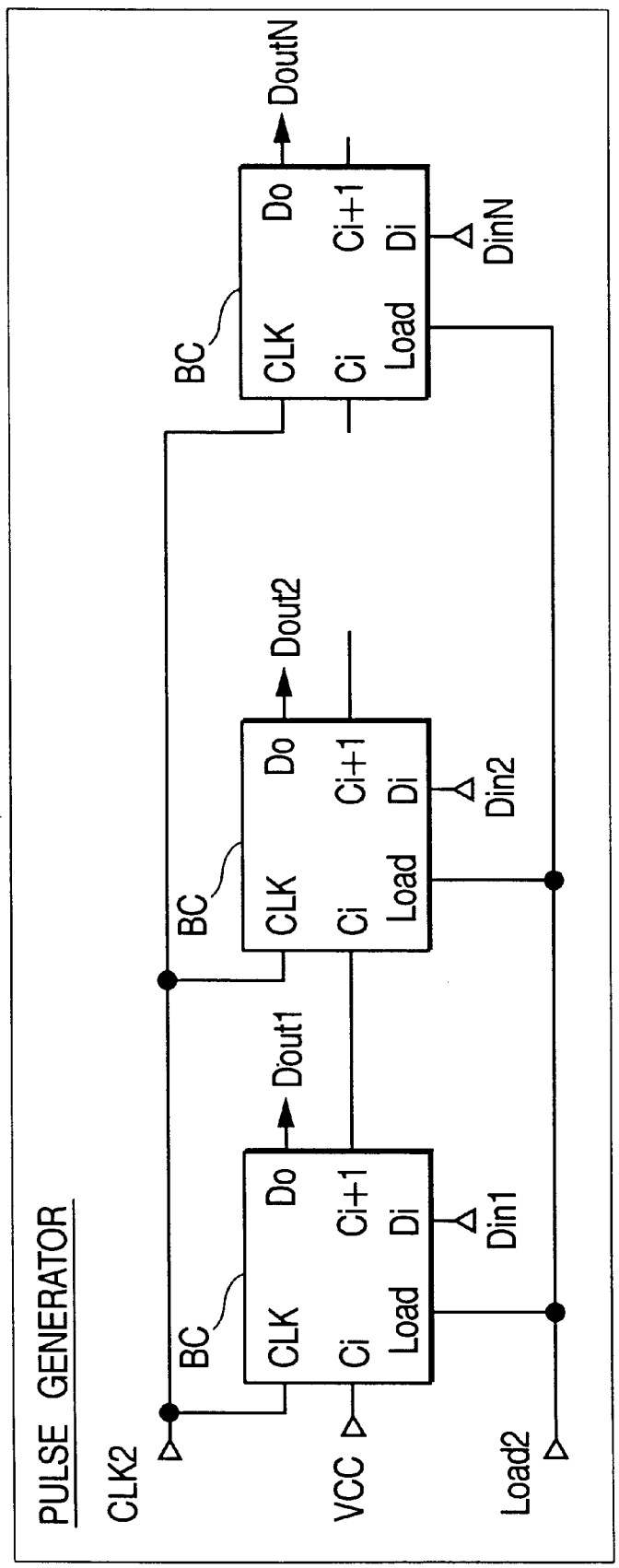
FIG. 38 is a block diagram showing one example of a pulse train generating means (pulse generator) for application of a write voltage.
Figure 39:
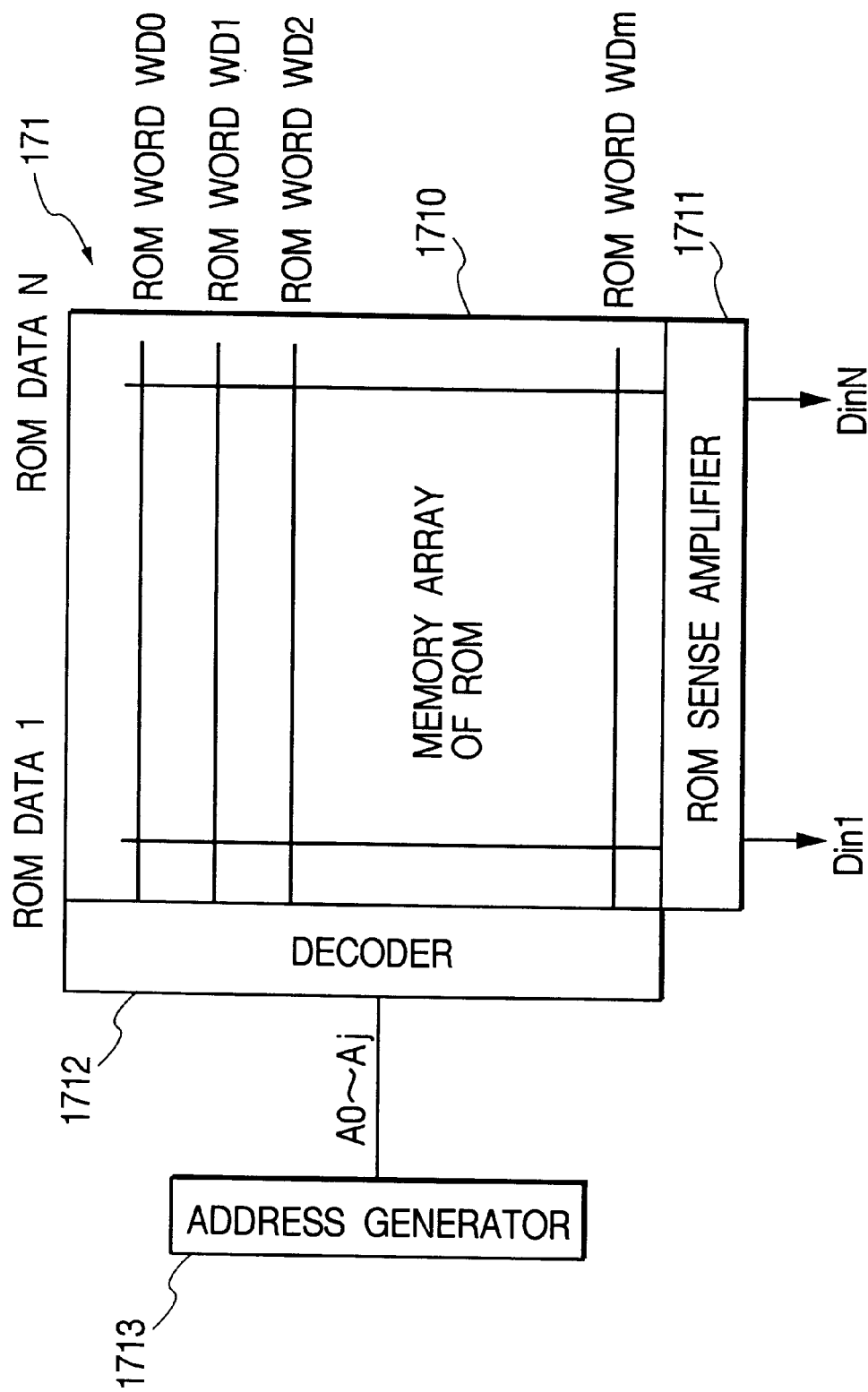
FIG. 39 is a block diagram illustrating one example of a trimming means
Figure 40:
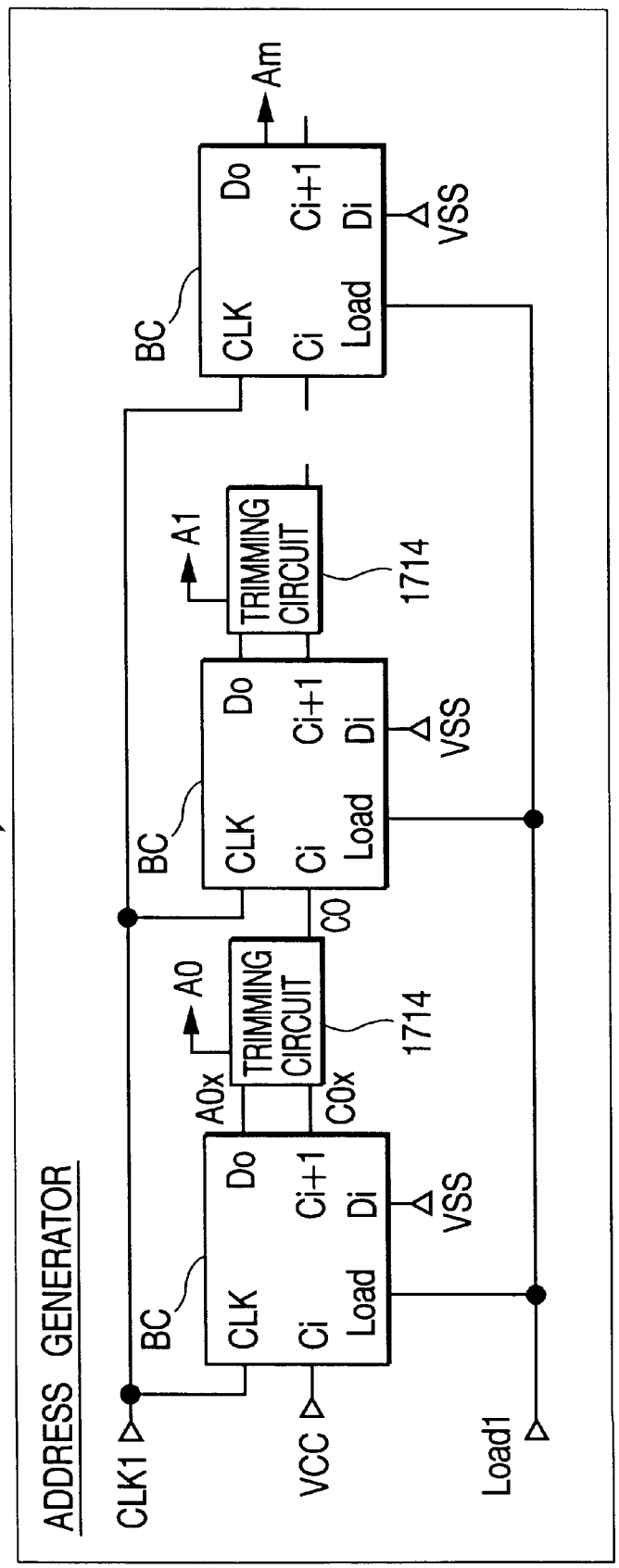
FIG. 40 is a block diagram showing one example of an address generator included in the trimming means.
Figure 41:
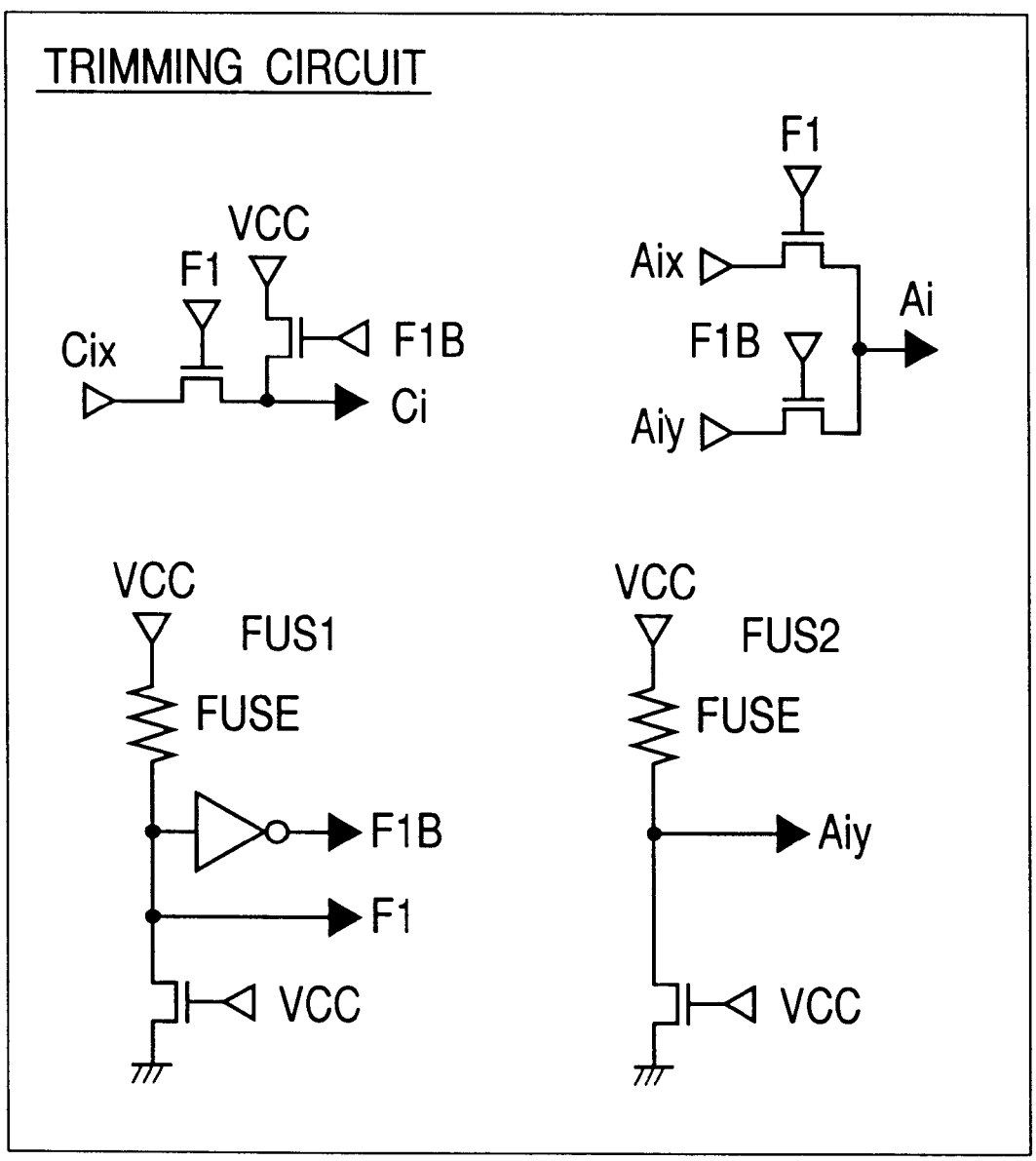
FIG. 41 is a circuit diagram illustrating one example of a trimming circuit included in the address generator.
Figure 42:
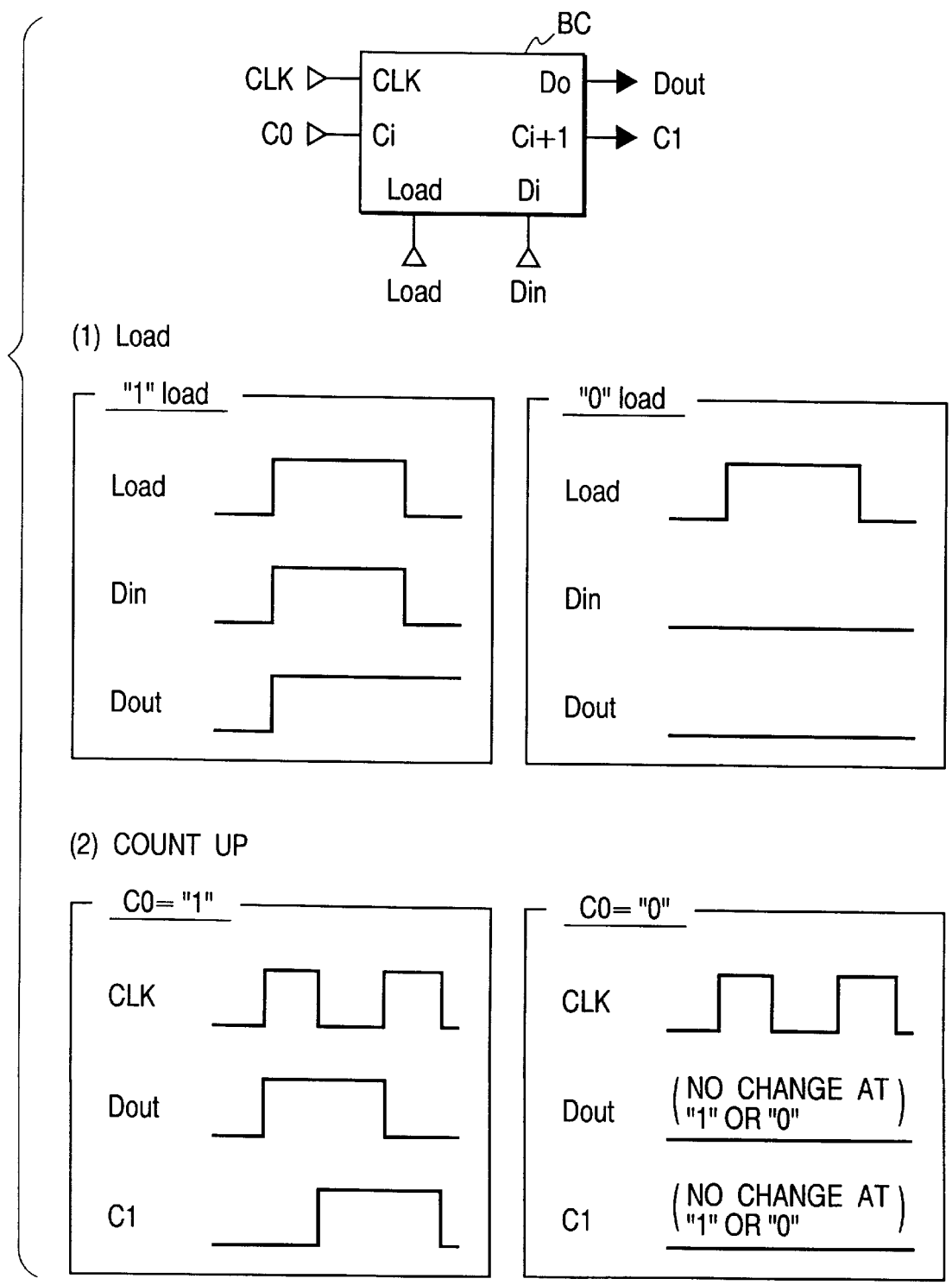
FIG. 42 is a diagram for explaining one example of a counter unit constituting each of the pulse generator and the address generator.

FIGS. 38 through 42 respectively show specific configurations for trimming the pulse widths described in FIGS. 30 through 32. FIG. 38 illustrates one example of the pulse train generating circuit (also called "pulse generator") 170 for the application of the write voltage. FIG. 39 depicts one example of the trimming means 171. FIG. 40 illustrates an address generator included in the trimming means. FIG. 41 shows one example of a trimming circuit included in the address generator. FIG. 42 depicts one example of a counter unit that constitutes each of the pulse generator and the address generator.

The counter unit BC shown in FIG. 42 will first be explained. CLK indicates a clock input terminal, Ci indicates a terminal for inputting a carry supplied from a low-order portion, Do indicates a data output terminal, Ci+1 indicates a carry output terminal, Di indicates a preset data input terminal, and Load indicates a data input instruction signal supplied from a preset data input terminal. Timing provided to load preset data and timing provided to perform count-up operations are also shown in the same drawing.

The pulse generator 170 shown in FIG. 38 has the counter units BC provided in predetermined plural stages, which are electrically connected in series to one another. A clock signal CLK 2 is commonly connected or supplied to clock input terminals CLK. The pulse generator sets preset data as the initial value of counted values. Respective place or digit outputs of the counter units BC are supplied to their corresponding logic gates such as AND or the like. The outputs of the AND gates are defined as write voltage pulses. When the respective digits of the counter units BC are set to a whole bit "1", the cycle or period of a clock pulse is determined. Thus, the smaller the preset data with respect to the number of bits in the pulse generator, the greater the write voltage pulse width.

The trimming means 171 shown in FIG. 39 generates the preset data of the pulse generator 170. Namely, although the invention is not restricted in particular, a memory array 1710 of a ROM place-stores values from a whole bit "0" to a whole bit "1" therein as the preset data of the pulse generator 170 in turn every ROM words WD0 through WDm. A decoder 1712 selects a corresponding ROM word. Preset data read from the selected ROM word is amplified by a sense amplifier 1711, followed by supply to the pulse generator 170.

The address generator 1713 for supplying address signals AO through Aj to the decoder 1712 has the counter units BC provided in predetermined plural stages, which are electrically connected in series to each other as shown in FIG. 40. A clock signal CLK1 is commonly connected or supplied to clock input terminals CLK. Each of the trimming circuits 1714 is provided between the counter units BC. A load signal load1 can initialize address outputs according to its high level.

The trimming circuit 1714 has a circuit configuration shown in FIG. 41. When fuses FUS1 and FUS2 are in a non-cutoff state, the trimming circuit 1714 outputs a carry Ci+1 (Cix) supplied from the previous stage to the subsequent stage and outputs data D0 (Aix) supplied from the previous stage as a place or digit signal. When one fuse FUSE1 burns, a carry output Ci to be outputted to the subsequent stage and a digit signal Ai are always maintained at "1". When the fuses FUS1 and FUS2 burn, the carry output Ci to be sent to the subsequent stage is always set to "1" and the digit signal Ai is always set to "0". Thus, the address generator 1713 can fix arbitrary bits of the address signals A0 through Aj to "1" or "0" according to the open states of the fuses FUS1 and FUS2. Accordingly, when the fuses FUS1 and FUS2 of each trimming circuit 1714 connected to its corresponding counter unit BC are programmed by a predetermined number from the least significant side, the order of words selected from the memory array 1710 of the ROM can be set at intervals of one line, two lines and the like, for example. If the fuses FUS1 and FUS2 of the trimming circuit 1714 connected to the counter unit BC provided on the high-order side are programmed, then a word first selected from the memory array 1710 of the ROM can be specified arbitrarily. Thus, the minimum widths of the write voltage pulses and the gradually-increased widths thereof can be arbitrarily set as described in FIGS. 30 through 32.

Figure 44:
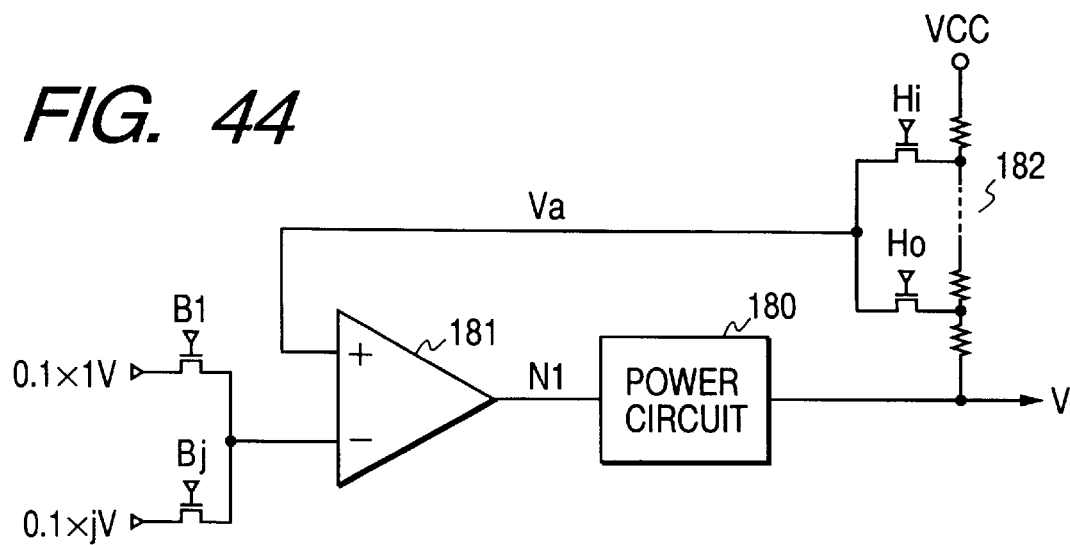
FIG. 44 is a circuit diagram showing one example of a circuit for trimming a power circuit.

FIG. 44 shows a circuit configuration for trimming a power circuit. The power circuit 180 shown in the same drawing is equivalent to the reference power circuit 85 or the charge pump circuit 84 shown in FIG. 60. An inversion or reverse input terminal (−) of an op amplifier 181 can be inputted with voltages in steps of 0.1V by or through control signals B1 through Bj. A voltage V outputted from the power circuit 180 is fed back to a non-reverse input terminal (+) of the op amplifier 181 through a resistance circuit 182. The resistance circuit 182 selects a feedback resistance according to control signals H0 through Hi. The op amplifier 181 and the resistance circuit 182 are included in the power control circuit 82 shown in FIG. 60. Although the invention is not restricted in particular, the control signals B1 through Bj are supplied from the redundant fuse trimming circuit 67 shown in FIG. 60. Although the invention is not restricted in particular, the control signals H0 through Hi are supplied from the ROM decoder 67 shown in FIG. 60.

Now consider that Vcc=3V, i=12 and j=20 and the power circuit 180 can output a negative potential therefrom in FIG. 44, for example. When B10=high level, B1 through B9=low level and B11 through B20=low level at this time, a reference voltage of the op amplifier 181 is set to 1V. When 1V is not applied by B10 due to product variations in flash memory chip, 1V can be reliably obtained by selecting any of other signals B1 through B9 and B11 through B20. The op amplifier 181 compares a voltage Va obtained by making a fraction of the applied voltage with the resistance circuit 182 and 1V. When Va>1, the power circuit 180 is activated, whereas when Va<1, the power circuit 180 is deactivated. A condition for deactivating the power circuit 180 is represented as V+(Vcc−V)k/(1+i)=Vrefxx when Hk=high level and H0=H1=...Hk−1=Hk+1=...Hi=low level. The symbol Vrefxx is a potential applied based on the signal Bj. Solving this equation under the above condition, V=−3.5V when H9 is selected by V=(13−3k)/(13−k), V=−5.7V when H10 is selected thereby, and V=−10V when H11 is selected thereby. The change in signal Hi in this way allows a change in potential during writing.

[5. Applications to digital still camera and the like]

A description will be made of the case in which the flash memory that has adopted the method of rewriting the data stored in the coarse write in the high-accuracy (including multivalue) write, is applied to the digital still camera.

Figure 45A:
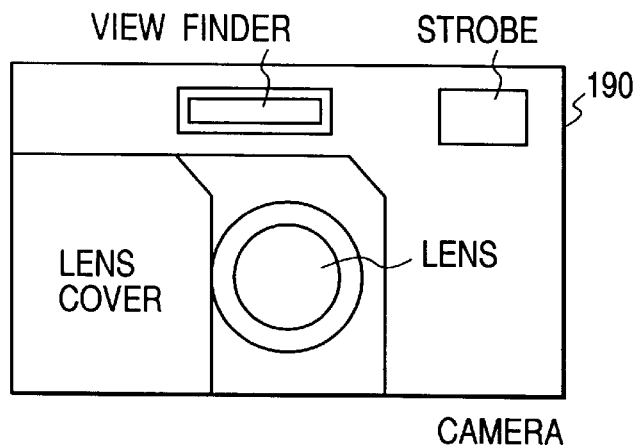
FIGS. 45(a) to 45(c) are diagrams for describing a digital still camera to which a flash memory having a coarse write mode and a high-precision write mode is applied.
Figure 45B:
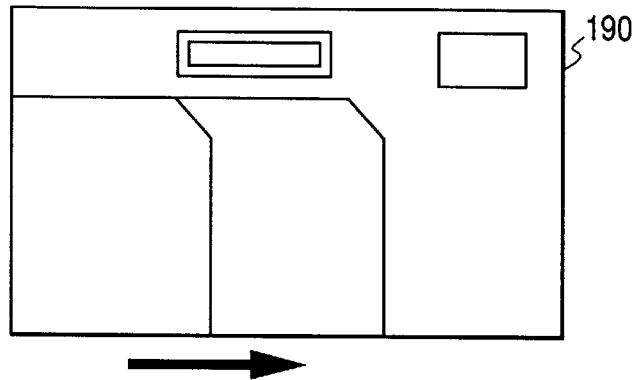
Figure 45C:
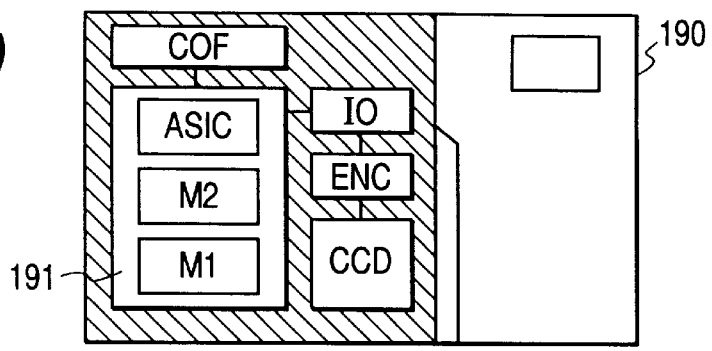

FIGS. 45(*a*) to 45(*c*) show such a digital still camera. According to the camera, the normal photography or shooting is done at high speed in coarse write and data written in the coarse write is rewritten with high accuracy during an interval between writing and another writing or when the power of the camera is turned off or a lens cover is closed. COF in FIG. 45(*c*) is a detecting means for detecting the interval between the two writings, the turning off of the camera's power or the closing of the lens cover (the turned-off state of the power by this closure). An image or picture inputted from a lens is detected by an image-sensing means CCD and encoded by an encoder ENC, followed by supply to a memory card 191 through an input/output circuit IO. The memory card 191 includes a control circuit ASIC that controls memory chips M1 and M2. Each of the memory chips M1 and M2 has the first write mode and the second write mode and serves as the flash memory or the like having the rewrite control circuit 105, which has been described in FIG. 1. A rewriting procedure is basically as described with reference to FIG. 4(*a*) and FIG. 4(*b*). A command for a rewrite mode is given by the output of the detecting means COF and is automatically executed during picture taking or the like.

Figure 46:
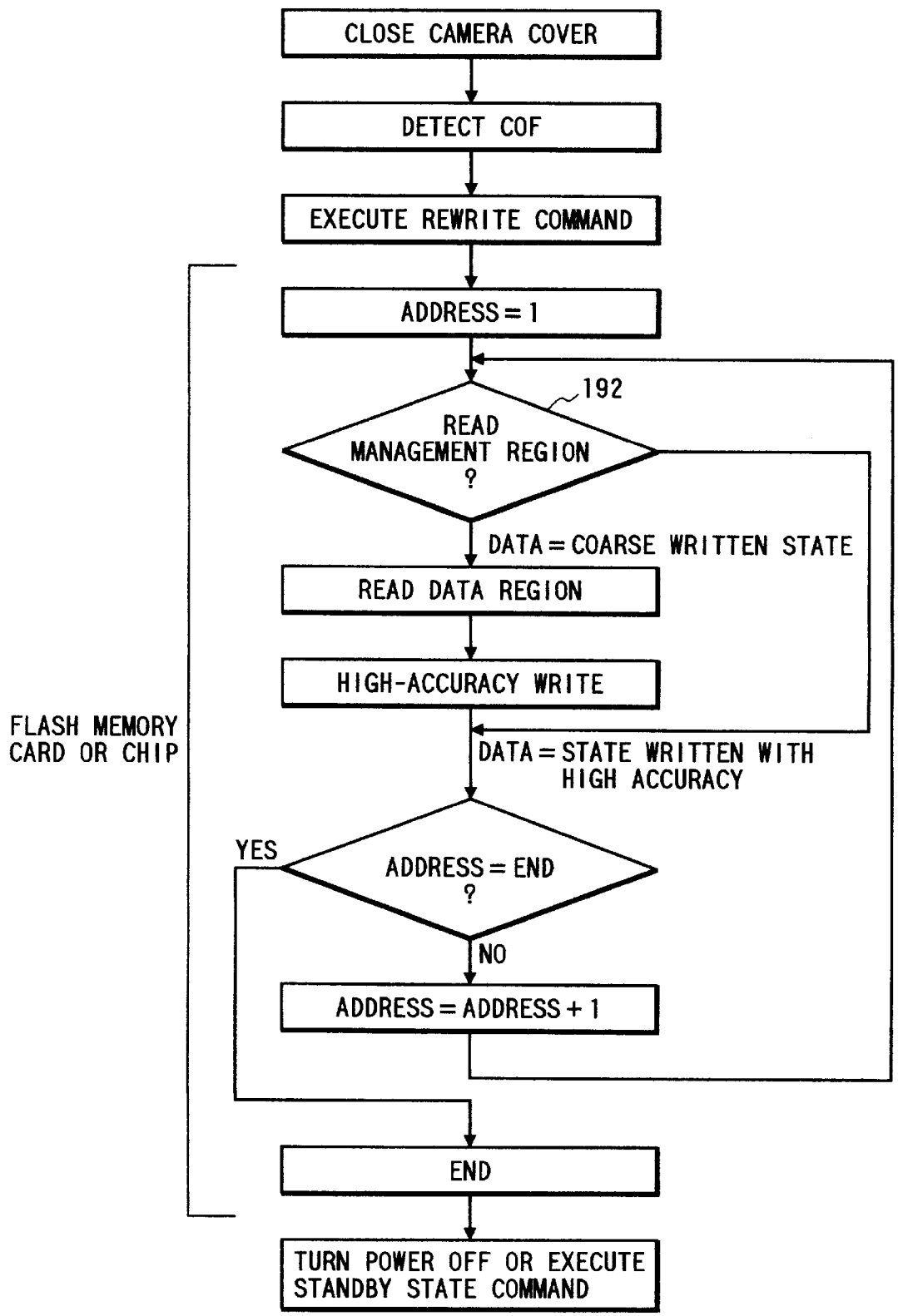
FIG. 46 is a flowchart for describing one example of a rewrite operation employed in the digital still camera shown in FIG. 45.

FIG. 46 shows one example of the rewrite operation by the digital still camera shown in FIGS. 45(*a*) to 45(*c*). This procedure is intended to refer to a management region in Step S192 and rewrite coarsely-written data in high-accuracy write when the high-accuracy write is not being done. Its processing is made to the leading address to the final address in cooperation with the closing operation of the camera cover. A rewrite basic process for referring to the management region is executed as described with reference to FIGS. 22 through 25.

Figure 47:
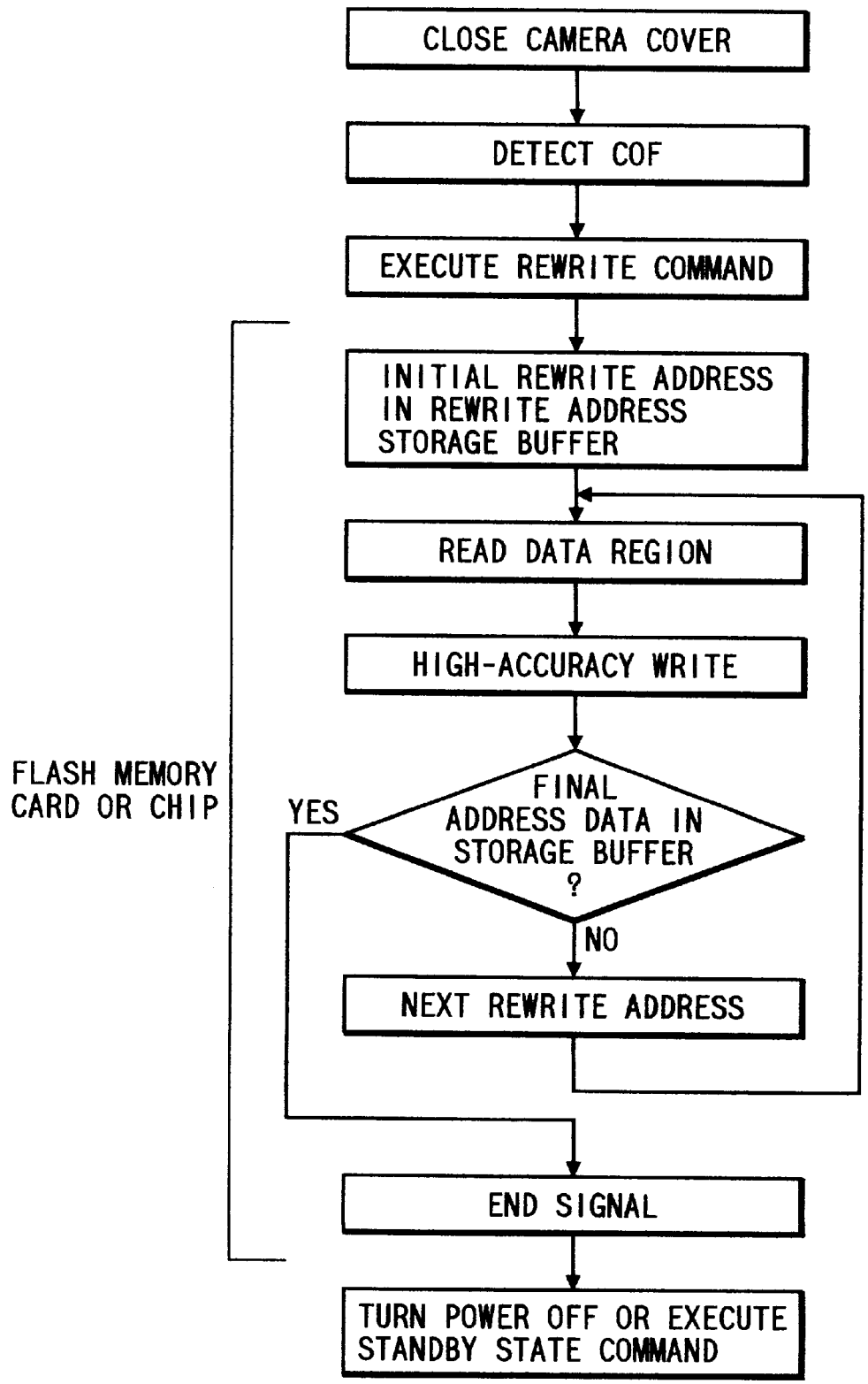
FIG. 47 is another flowchart for describing a rewrite operation employed in the digital still camera shown in FIG. 45.

FIG. 47 illustrates another example of the rewrite operation performed by the digital still camera shown in FIGS. 45(*a*) to 45(*c*). This procedure corresponds to one in which, when a rewrite address storage buffer for storing sector address information shot now and processed in coarse write alone is provided, a rewrite data region is acquired based on the sector address information stored therein.

In a camera or computer system in addition to the above, the rewrite timing allows the execution of rewriting of data written in the coarse write simultaneously with the withdrawal of the memory card in the high-accuracy write. While the flash memory is being used in the camera or computer system, the flash memory is activated at high speed in the coarse write, whereas when the memory card is extracted from the device and stored, the flash memory is processed in the high-accuracy write, which is excellent in retention.

Figure 48:
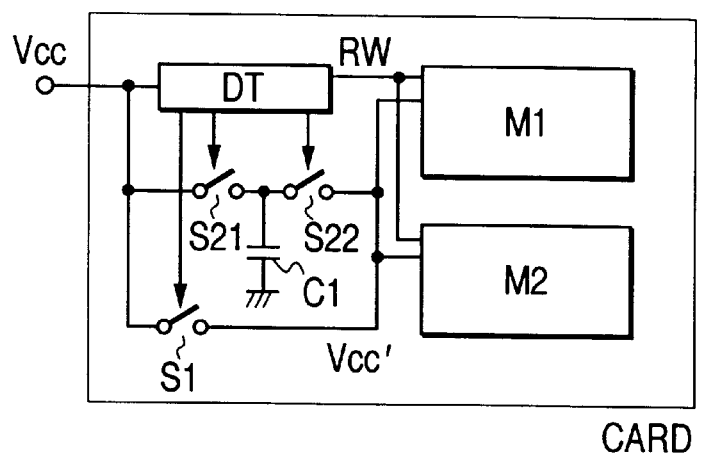
FIG. 48 is a block diagram showing one example of a memory card to which flash memories having coarse write and high-accuracy write modes are applied.

FIG. 48 shows a memory card of a type wherein, when a control circuit DT detects a reduction in Vcc due to the withdrawal of a memory card, it is rewritten using an electric charge stored in a capacitor C1 within the memory card. When Vcc is reduced, switches S1 and S21 are turned off under the control of the control circuit DT to disconnect the memory card from the external Vcc, whereby instructions for executing a rewrite start are provided by a control signal RW. In doing so, a switch S22 is turned on so that rewriting power is supplied to flash memories M1 and M2. If the switch S21 is turned on with some delay upon inserting the memory card, then the supply of the power to each flash memory is not delayed. Incidentally, the capacitor C1 may be charged with a high voltage higher than Vcc, which is generated by the control circuit DT.

Figure 49:
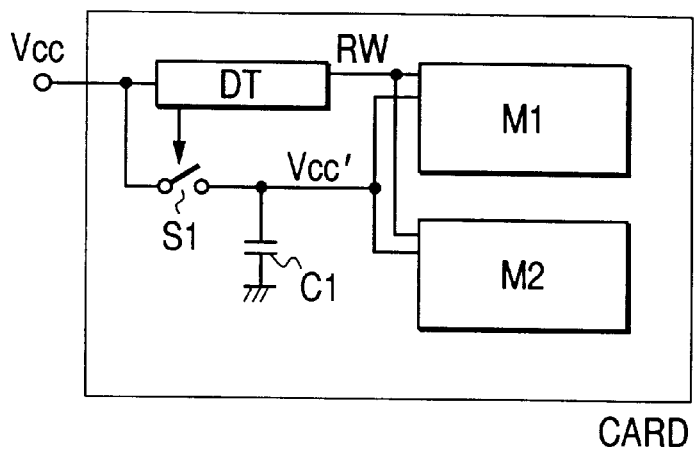
FIG. 49 is another block diagram illustrating a memory card to which the flash memories having the coarse write and high-accuracy modes are applied.

An example shown in FIG. 49 is configured for the same purposes as those in FIG. 48. However, the present example is simplified in configuration by directly connecting a capacitor C1 to Vcc'.

Figure 50:
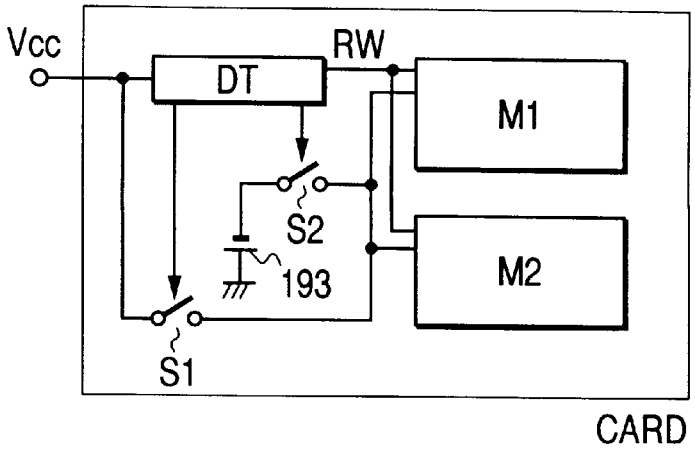
FIG. 50 is a further block diagram depicting a memory card to which the flash memories having the coarse write and high-accuracy write modes are applied.

An example shown in FIG. 50 is also configured for purposes similar to those in FIG. 48. However, a rewrite operating battery 193 is provided within a memory card.

Figure 51:
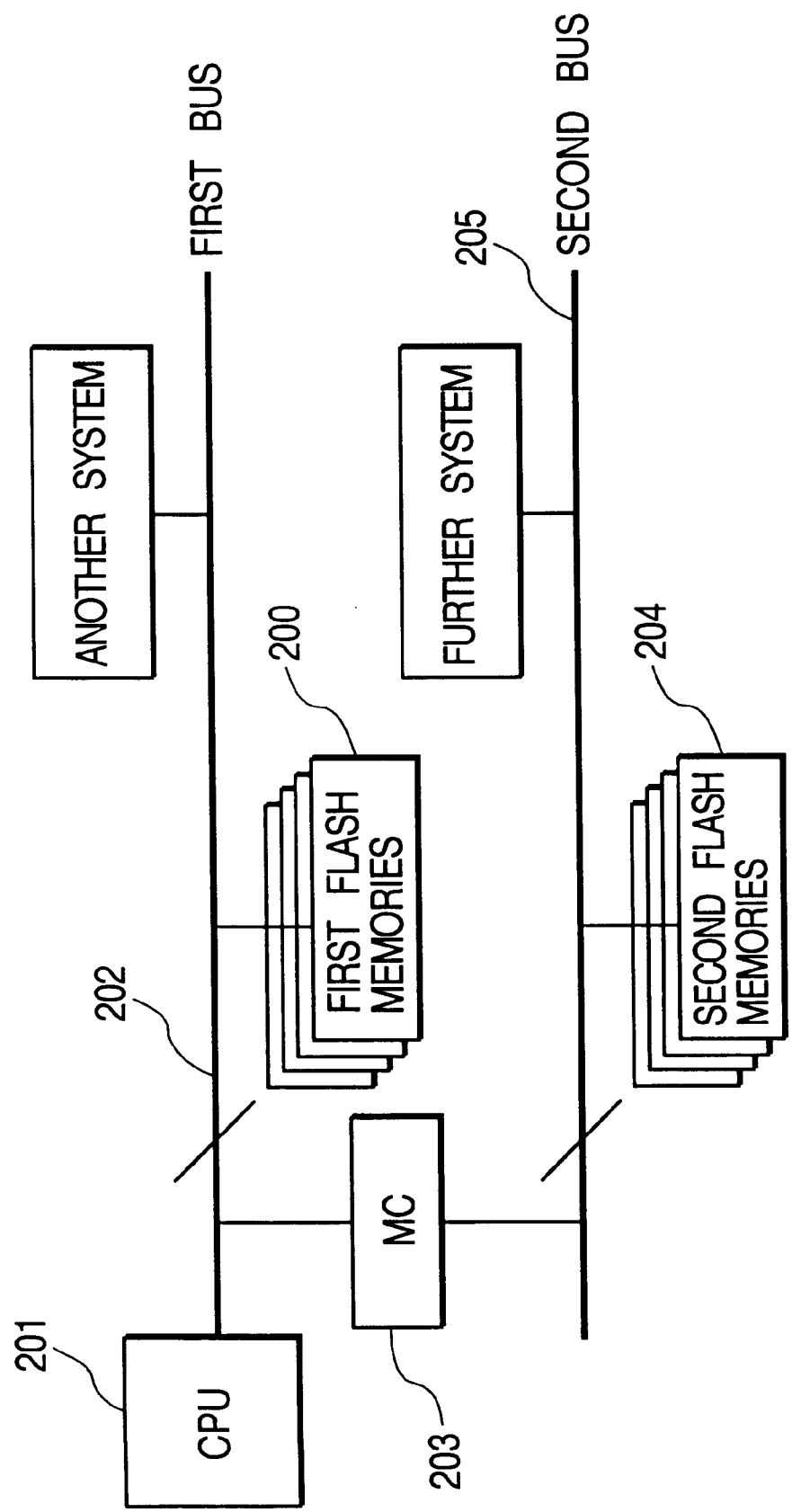
FIG. 51 is a block diagram showing a computer system to which the flash memories having the coarse write and high-accuracy write modes are applied.

FIG. 51 shows a system to which the flash memories, each performing only coarse write as described in FIGS. 26(*a*) and 26(*b*) and FIG. 27, are applied. The first flash memories 200, each of which performs coarse write alone, are electrically connected to a CPU 201 and a first bus 202. Since the first flash memories 200 are capable of performing high-speed writing, they are intended for use as main memories of the CPU 201. Second flash memories 204 are electrically connected to a second bus 205 through a memory controller (MC) 203. Each second flash memory 204 is used to perform high-accuracy write (including multivalues) and is intended for use as, for example, a file memory that needs a long data holding time.

Figure 52:
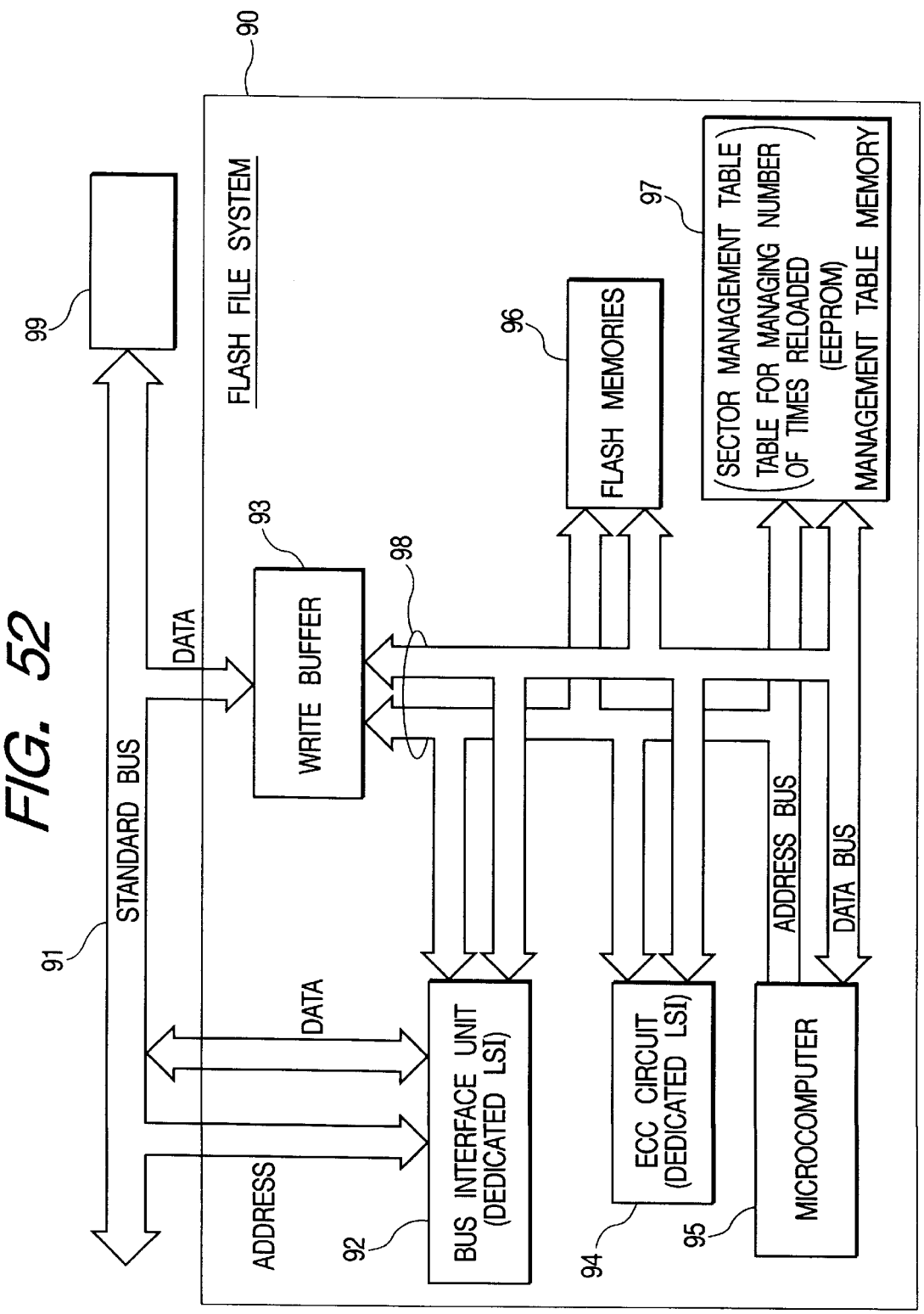
FIG. 52 is a block diagram showing one example of a file memory system to which the flash memories having the coarse write and high-accuracy write modes are applied.

FIG. 52 is a block diagram showing one example of a file memory system using the aforementioned various flash memories. Reference numeral 90 indicates a flash memory card shaped in PC card form, although the invention is not restricted to this in particular. This is a kind of ATA (AT Attachment) card. Although the invention is not restricted in particular, the flash memory card 90 is mountable to a computer 99 such as a personal computer or the like through a standard bus 91 based on IDE (Integrated Device Electronics) so as to be detachable therefrom through an unillustrated connector.

The flash memory 90 has a bus interface unit 92, a write buffer 93, an ECC circuit 94, a microcomputer 95, flash memories 96 and a management table memory 97, which are commonly connected to an internal bus 98.

The bus interface unit 92 performs control on the interface to the standard bus 91 so as to conform to specifications of the ATA card or the like. The write buffer 93 is a data buffer for temporarily storing written data supplied through the standard bus 91. The data stored in the write buffer 93 is written into each of the flash memories 96. The ECC circuit 94 is a circuit having the function of detecting and correcting errors, which is used to improve the accuracy of the data stored in the corresponding flash memory 96. The management table memory 97 is composed of an electrically erasable and programmable or electrically reprogrammable semiconductor memory, such as a flash memory or an EEPROM. A sector management table and a table for managing the number of times that reprogramming is done, are formed in the management table memory 97. Defective addresses or the like in each flash memory 96 are written into the sector management table. Since the characteristic of each memory cell is degraded while write/erase operations are being repeated, in the case of the flash memory in particular, it is necessary to hold such addresses in the sector management table. The number-of-reprogrammings management table holds therein information for managing the number of times that each memory in the flash memory 96 is reprogrammed, for each block of flash memory, for example. The characteristics of the memory cells in each flash memory are guaranteed within the range of a predetermined number of reprogrammings. The microcomputer 95 performs the entire control on the inside of the memory card 90 in accordance with an access request to the flash memory card 90. For example, the microcomputer 95 provides instructions for the operation of each flash memory, issues the command to the corresponding flash memory 96 to perform control on access to the flash memory 96, and controls the management table memory 97.

[6. Further example of flash memory writable in multivalue form]

Figure 61:
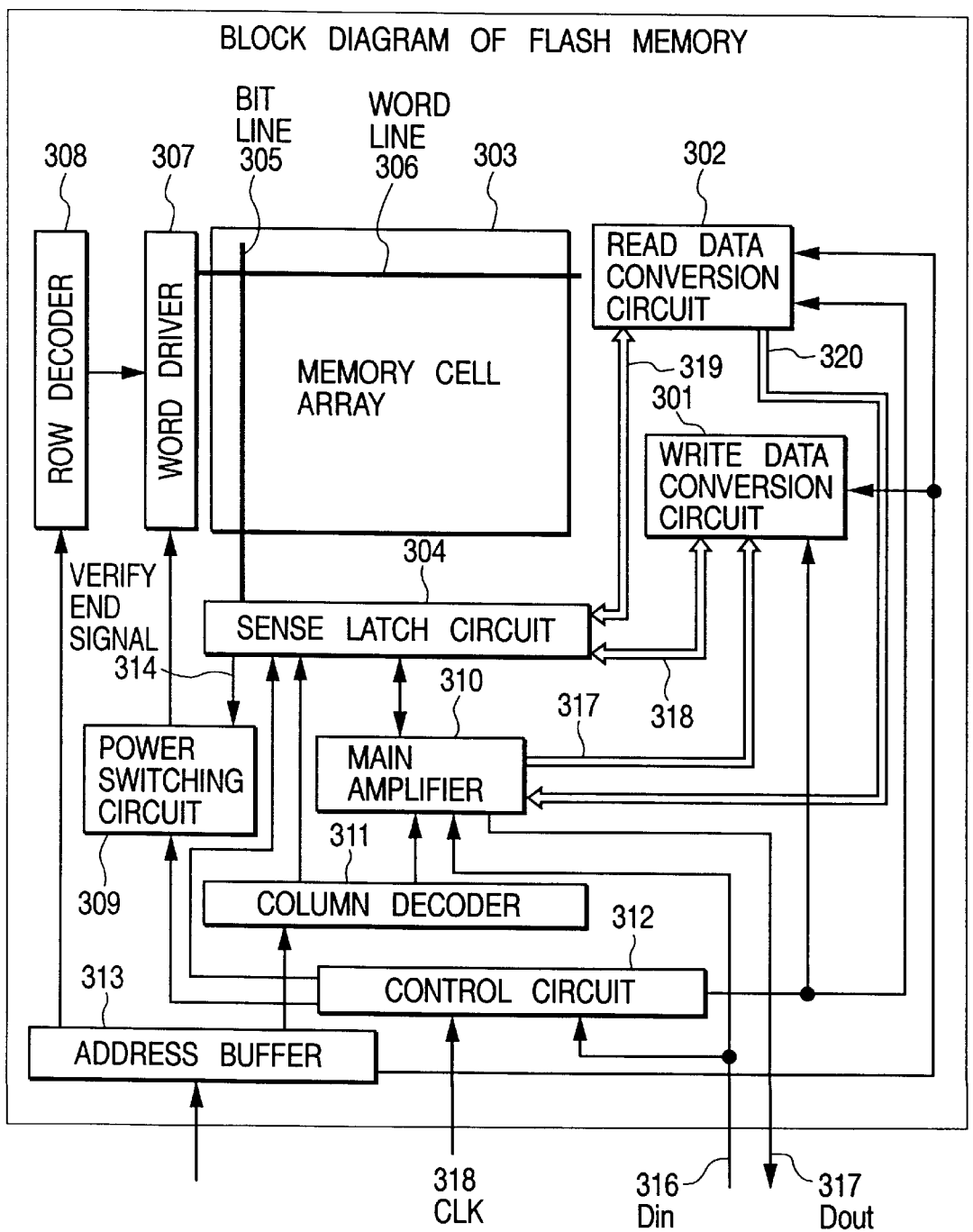
FIG. 61 is a block diagram showing a still further flash memory for supporting both binary wring and multivalue writing.

FIG. 61 shows a further example of the multivalue writable flash memory referred to above. The flash memory is capable of writing 2-bit information into a single memory cell, i.e., writing data therein in a four-value or quaternary form and reading the corresponding information therefrom. Further, as described above, the flash memory is capable of writing data in binary form at high speed and thereafter rewriting the data in quaternary form.

Designated at numerals 303 in FIG. 61 are memory cell arrays, which are disposed on both sides of a sense latch circuit 304 with the sense latch circuit 304 interposed therebetween. It is to be noted that, although only the single-side memory cell array is typically illustrated in FIG. 61, another memory cell array is actually disposed in the obverse/reverse direction of the paper, i.e., in the direction of the depth of the memory cell array 303. The memory cell array 303 has a number of memory cells each having a floating gate and a control gate. The control gate of each memory cell is electrically connected to a word line 306, the drain thereof is electrically connected to a bit line 305, and the source thereof is electrically connected to an unillustrated source line. The word line 306 and the bit line 305 are typically illustrated one by one. A word driver 307 drives a corresponding word line based on a select signal outputted from a row decoder 308. The sense latch circuit 304 is provided at one end side of the bit line 305. Further, the bit line 305 is selected by a column switch circuit based on a select signal outputted from a column decoder 311. The selected bit line 305 forces a main amplifier 310 into conduction. It is to be noted that the column switch circuit is included in the sense latch circuit 304. The column decoder 311 and the row decoder 308 are supplied with an address signal from an address buffer 313. A power switching circuit 309 performs switching to a required operating voltage of the word driver 307 or the like according to operating modes such as erase, write and read modes. A control circuit 312 is externally supplied with an unillustrated access control signal and a clock signal 318 as well as with a command through a data bus or the like. The control circuit 312 controls an internal operation in accordance with the command. Although the invention is not restricted in particular, a method of controlling the internal operation is similar to that employed in the flash memory described with reference to FIG. 60. The control circuit 312 obtains access to a ROM in accordance with the result of decoding of the command and decodes control codes read from the ROM to thereby generate various internal control signals. Although the operating modes specified to the flash memory by the command are not restricted in particular, the operating modes include a coarse write mode based on the first write command and the rewrite mode. It is needless to say that the read and erase operating modes are also included. In the flash memory shown in FIG. 61, one memory cell array 303 is defined as a first write (coarse write) dedicated region, whereas another memory cell array omitted from the drawing is defined as a second write (high-accuracy write) dedicated region. When the rewrite mode is specified, data stored in two memory cells in the former memory cell array are defined as one unit and written into one memory cell in the latter memory cell array in the form of one value of four values.

A stored state of information in one memory cell, which has been written by a quaternary write technique employed in the flash memory shown in FIG. 61, is defined as one state selected from an erased state, a first written state, a second written state and a third written state. Four types of information stored states respectively result in states determined according to 2-bit data expressed in binary form. Namely, the 2-bit data can be stored in one memory cell. Therefore, a write data conversion circuit 301 for setting three types of write verify voltages different from one another, which are applied to the word line upon the write operation, successively switching these to perform write operations in three ways or parts, and controlling, upon these write operations, written data "0" or "1" ('LOW' Or 'High') expressed in binary (one bit) form to be stored in the corresponding sense latch (sense latch included in the sense latch circuit 304) connected to its corresponding memory cell to be written, every write operations divided into the three parts, is provided to write quaternary (2-bit) information into one memory cell. There is also provided a read data conversion circuit 302 for setting voltages used as word line select levels to be applied to the corresponding word line upon reading as three types, taking in or capturing binary (one-bit) data read from the corresponding memory cell by three reading operations through the sense latch circuit 304 and converting the data into quaternary information in 2-bit form after the completion of the three reading operations.

For the write mode, four-value or quaternary data in total expressed in the form of 2 bits is read from the corresponding memory cell and the read data is set as quaternary data expressed in the form of one bit through the write data conversion circuit 301, followed by written into a four-value or quaternary dedicated memory cell array.

Summaries of the quaternary-data write and read operations will first be explained with reference to FIG. 61.

For the quaternary write operation, a data train or string expressed in binary (one bit) form to be written is supplied from Din 316 to the main amplifier 310 where it is amplified, followed by its supply to the write data conversion circuit 301 through a signal line 317. The write data conversion circuit 301 separates the data string to be written into, for example, odd-numbered bits and even-numbered bits, which are transferred to the corresponding sense latches (each called "non-selected sense latch") each electrically connected to a non-selected memory cell in the memory cell array 303 through a signal line 318, where they are temporarily latched therein. Such a non-selected sense latch is commonly used as a data buffer. Further, the write data conversion circuit 301 captures data stored in the non-selected sense latches through the signal line 318 for every operation, such as ⌈write 1 (corresponding to a write operation for obtaining a first written state⌋, ⌈write 2 (corresponding to a write operation for obtaining a second written state)⌋, and ⌈write 3 (corresponding to a write operation for obtaining a third written state)⌋, and converts the data into binary (one bit) data "0" or "1" ('Low' or 'High') corresponding to four-value or quaternary (2 bit) data written into each selected memory cell according to the ⌈write 1⌋, ⌈write 2⌋ and ⌈write 3⌋. The write data conversion circuit 301 transfers the converted data to the corresponding sense latches (each called a "selected sense latch") in the sense latch circuit 304 connected to the selected memory cell and performs the respective write operations such as the ⌈write 1⌋, ⌈write 2⌋ and ⌈write 3⌋ in accordance with the latched binary data.

Thus, the binary data separated into the odd-numbered bits and the even-numbered bits are temporarily stored in the corresponding sense latches each connected to the non-selected memory cell. Further, the binary (one bit) written data are synthesized by the write conversion circuit 301 every three write operations (⌈write 1⌋, ⌈write 2⌋ and ⌈write 3⌋) different in verify voltage from each other, and the write operations different in verify voltage from each other are carried out, whereby four-value or quaternary (2-bit) information can be written into one memory cell.

For the read operation, three types of voltages different from each other are applied to the corresponding word line 306 in turn. Further, binary (one-bit) information "0" or "1" ('Low' or 'High') read into selected sense latches from their corresponding memory cells in the memory cell array 303 under the read operations made three times are transferred to and temporarily stored in their corresponding non-selected sense latches, which are different from each other. The three types of binary (one-bit) data "0" or "1" ("Low" or "High") read by the three read operations and transferred from the selected sense latches to the non-selected sense latches and latched therein, are transferred to the read data conversion circuit 302 through a signal line 319. The read data conversion circuit 302 synthesizes high-order bits and low-order bits of four-value or quaternary (2-bit) data, based on the thus-transferred data. The read data conversion circuit 302 alternately outputs the synthesized high-order and low-order bits and sets its output as a binary (one-bit) data string. This is amplified by the main amplifier 310 after which it is outputted from Dout 317.

Figure 62:
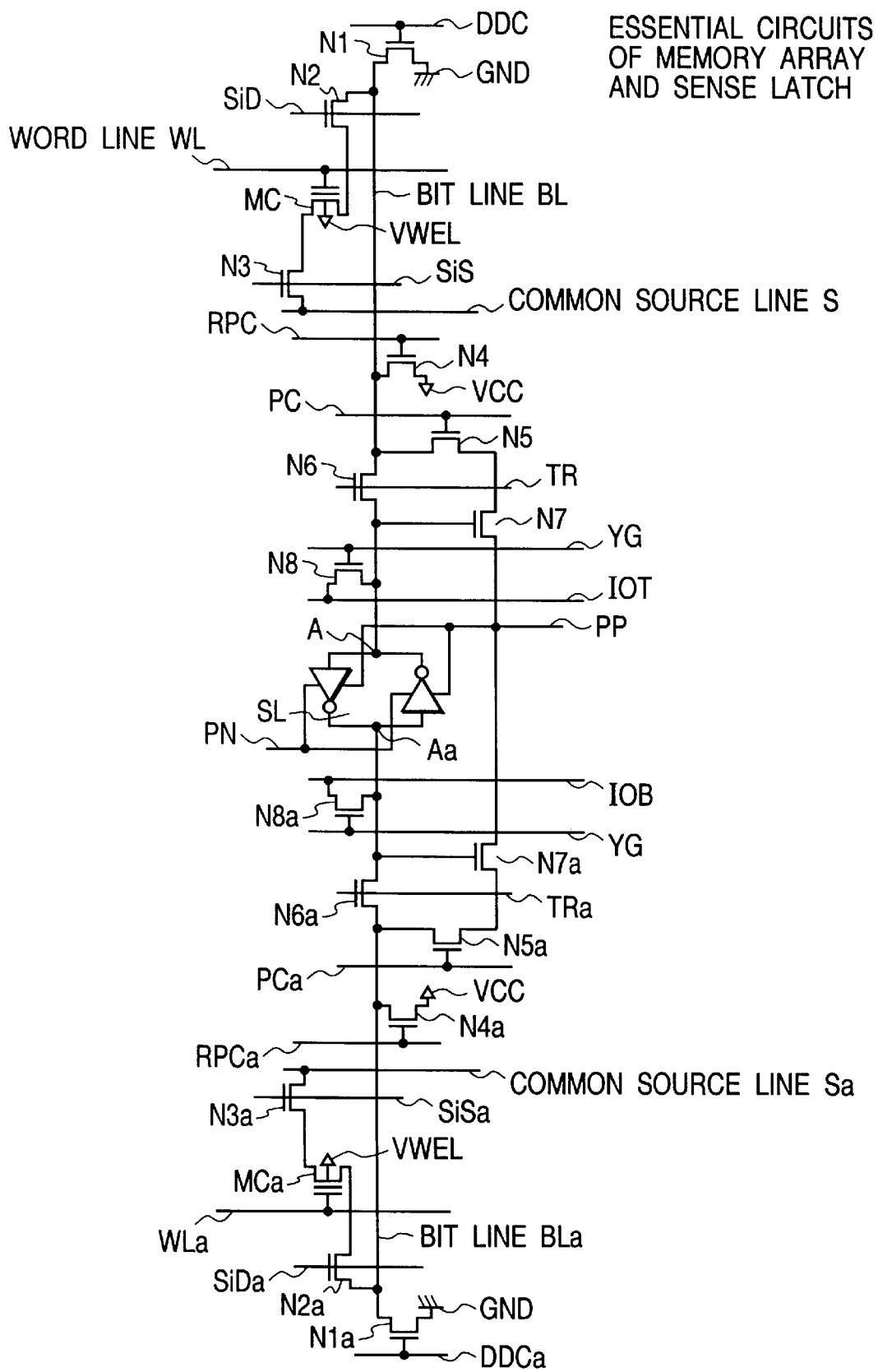
FIG. 62 is a circuit diagram illustrating, in detail as an example, parts of a memory cell array and a sense latch shown in FIG. 61.

FIG. 62 typically illustrates a part of a circuit configuration related to the memory cell array 303 and the sense latch circuit 304 employed in the flash memory shown in FIG. 61. In the configuration shown in FIG. 62, a bit line BLa is also provided on the opposite side of a bit line BL with a sense latch SL interposed therebetween. Although the invention is not restricted in particular, the bit line BLa is provided in one-to-one correspondence with the bit line BL. Upon access, one of the bit lines is used as the other reference bit line. Which one of them is used as the reference bit line is relatively determined according to the placement of a memory cell to be accessed. The control circuit 312 performs control on its determination.

Referring to FIG. 62, N1 through N8 and N1a through N8a indicate NMOS switches, SL indicates a sense latch, MC and MCa indicate memory cells, VCC indicates a power source voltage, VWEL indicates a substrate voltage for the memory cells, GND indicates a ground potential, WL and WLa indicate word lines, BL and BLa indicate bit lines, S and Sa indicate common source lines, DDC and DDCa indicate control signal lines for discharging the bit lines, SiS and SiSa indicate control signal lines for respectively electrically connecting the sources of the memory cells MC and MCa to the common source lines S and Sa, RPC and RPCa indicate control signal lines for precharging the bit lines upon a read operation, PC and PCa indicate control signal lines for precharging the bit lines upon a write verify operation, TR and TRa indicate control signal lines for providing electrical connections between the bit lines and the sense latch, IOT and IOB indicate input/output lines, YG indicate control signal lines for providing electrical connections between the sense latch and the input/output lines, and PP and PN indicate operating power supplies used for a PMOS transistor and an NMOS transistor of the sense latch SL.

Although the invention is not restricted in particular, the bit lines BL and BLa are formed of aluminum-made interconnections. Although the invention is not restricted in particular, a series circuit of a memory cell is provided for each of the bit lines BL and BLa (one series circuit of memory cell is typically shown for one bit line in FIG. 62). NMOS switches N2 and N2a are provided so as to make continuity or conduction between one of the series circuits of a plurality of the memory cells and its corresponding bit line. The NMOS switches N2 and N2a are by-switch controlled by control signals SiD and SiDa.

The details of the aforementioned quaternary write and read operations will be explained below. The quaternary write and the quaternary read will exclusively be explained below. It can be understood that if the contents of the quaternary write and the quaternary read are understood, then the data written in binary form is read from the memory cell array upon the rewrite operation and the data may be written into quaternary form, using the write conversion circuit 301. As is apparent from the example of each flash memory referred to above, each address written into quaternary form may be internally generated. For example, only the address bit (e.g., the most significant bit) for providing instructions as to either a region written in binary form or a region written in quaternary form can be changed so as to make use of a read address for the initial data to be written in binary form.

Figure 63:
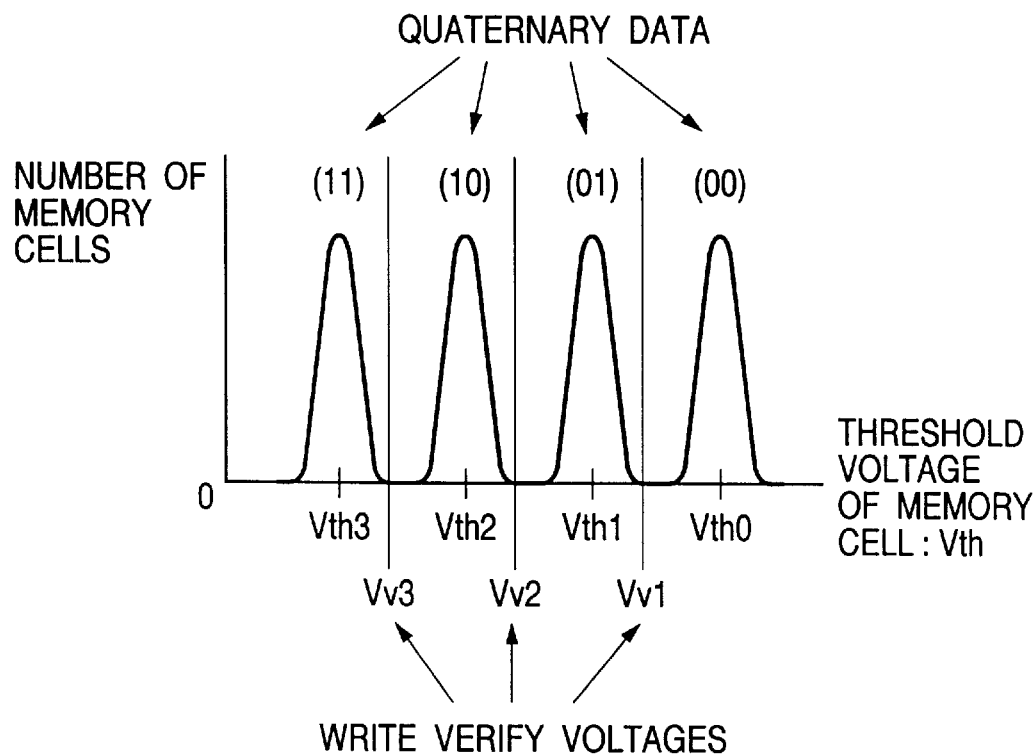
FIG. 63 is a diagram for describing the relationship between write verify voltages and threshold voltages at quaternary writing with respect to one memory cell.

<<1>> Write Operation:

Configurations and operations for write and write verify will be described in detail with reference to FIGS. 63 through 73. FIG. 63 shows the relationship between voltages applied to word lines at the write verify and distributions of threshold voltages of memory cells with four-value or quaternary (2-bit) information written therein. In this case, the correspondence of the threshold voltages of the memory cells and the quaternary (2-bit) information stored in the memory cells is as follows: A state (corresponding to an erased state of memory cell) of Vth0 highest in threshold voltage is defined as a state in which information "00" has been written. A state of Vth1 which is second highest in threshold voltage is defined as a state in which information "01" has been written. A state of Vth2 which is third highest in threshold voltage is defined as a state in which information "10" has been written. A state of Vth3 lowest in threshold voltage is defined as a state in which information "11" has been written.

Figure 64:
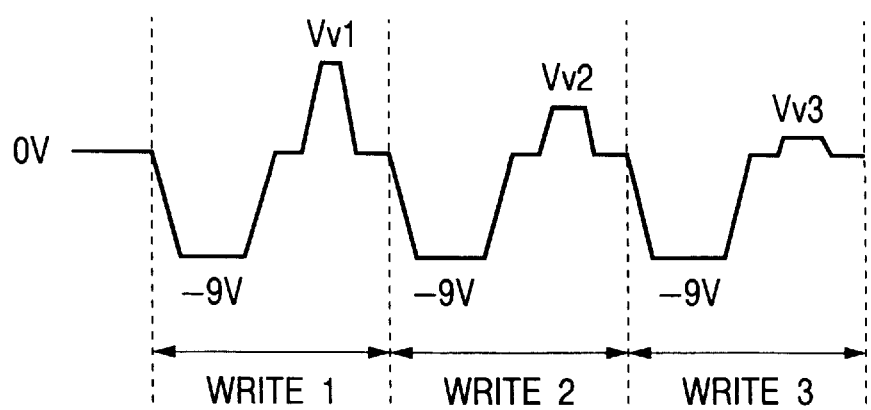
FIG. 64 is a diagram for describing one example of voltages applied to each word line at writing.

In order to store the four-value or quaternary (2-bit) information in one memory cell, the distributions of the threshold voltages of the memory cells are polarized in the form shown in FIG. 63. In order to control the distribution of the threshold voltage of each memory cell by the write operation and the subsequent write verify operation, write verify voltages are defined as three types of voltages Vv1, Vv2 and Vv3 that satisfy Vth0>Vv1>Vth1, Vth1>Vv2>Vth2 and Vth2>Vv3>Vth3 with respect to threshold voltages Vth0, Vth1, Vth2 and Vth3 of the four memory cells shown in FIG. 63. The write verify voltages are applied to the corresponding word lines upon the write verify operation. FIG. 64 shows an example of the voltages applied to the word line. All the operations of [write 1], [write 2] and [write 3] in FIG. 64 represent two operations: one for the write operation and another for the write verify operation. The threshold voltages of memory cells to write four-value or quaternary data "01", "10" and "11" therein are set lower than Vv1 in accordance with the [write 1] operation. The threshold voltages of memory cells to write the quaternary data "10" and "11" therein are set lower than Vv2 in accordance with the [write 2] operation. Further, the threshold voltage of a memory cell to write the quaternary data "11" therein is set lower than Vv3 according to the [write 3] operation. The respective operations of [write 1], [write 2] and [write 3] will be explained below.

The respective [write 1], [write 2] and [write 3] operations of the circuit typically illustrated in FIG. 62 are in common use except that the erase operation is carried out before the [write 1] operation and the voltages applied to the corresponding word lines at the write verify are different from each other. Thus, those common to the [write 1], [write 2] and [write 3] operations and the write verify operation will first be described with reference to FIG. 62.

When data is written into the memory cell MC, the input/output line IOT on the non-reverse side is brought to a high level (also hereinafter called merely 'High') and the input/output line IOB on the reverse side is brought to a low level (also hereinafter called simply 'Low'). In all the operations, IOT and IOB serve as complementary signals at all times. Next, the control signal lines YG are raised to select levels to turn the NMOS switches N8 and N8a on. Thus, 'High' data is latched in the sense latch SL. At this time, the node A side of the sense latch SL results in 'High' and the node Aa side thereof results in 'Low'. Next, the power source voltage PP on the PMOS transistor side of the sense latch SL is raised to, for example, 4[V] from the power source voltage VCC to raise the control signal line PC and the control signal line PCa to the select level, whereby the NMOS switches N5 and N5a are turned on. Since, at this time, the 'High' data is already latched in the sense latch SL, the node A side of the sense latch SL is 'High'. Therefore, the NMOS switch N7 is turned on so that the bit line BL is precharged to 4[V] through the NMOS switch N5. On the other hand, since the node Aa side of the sense latch SL is 'Low', the NMOS switch N7 is in an off state and the bit line BLa is not precharged. Thus, the bit line BLa results in 0[V]. Thereafter, the voltage on each of the control signal lines PC and PCa is set to a non-select level so that the NMOS switches N5 and N5a are turned off. Next, the control signal SiD is raised so that the NMOS switch N2 is turned on. Further, for example, −9[V] is applied to the word line WL and hence each of the control signal lines TR and TRa is raised to a select level so that the NMOS switches N6 and N6a are turned on, whereby the data is written into the memory cell MC. At this time, the substrate voltage VWEL for the memory cell MC is set to, for example, 0[V]. Thereafter, the word line WL is set to 0[V] and the voltage on each of the control signal lines TR and TRa is raised to a non-select level so that the NMOS switches N6 and N6a are turned off. Afterwards, the control signal lines DDC and DDCa are raised to a select level so that the NMOS switches N1 and N1a are turned on. As a result, the bit line BL to be written and the bit line BLa on the reference side are discharged so that the potentials on these bit lines BL and BLa are initially set to 0[V]. Further, the voltage on each of the control signal lines DDC and DDCa falls to a non-select level so that the NMOS switches N1 and N1a are brought to an off state. Thereafter, the following write verify operation is carried out.

Upon the write verify operation, the voltage of the power source PP on the PMOS transistor side of the sense latch SL is first set to the power source voltage VCC. Thus, the control signal line PC is raised to the select level so that the NMOS switch N5 is brought to an on state. When information "1" ('High') is being latched in the sense latch SL at this time as described for the write operation, the NMOS switch N7 is turned on so that the bit line BL is precharged. However, since the NMOS switch N7 is turned off when information "0" ('Low') is being latched in the sense latch SL, the bit line BL is not precharged. Further, the control signal RPCa is raised to a select signal so that the NMOS switch N4a is brought to an on state. Consequently, the bit line BLa on the reference side is precharged to a voltage lower than that at the bit line BL. Next, the voltages on the control signal lines PC and RPCa are both lowered to a non-select level so that the NMOS switches N5 and N4a are inverted to an off state. Thereafter, the power source PP on the PMOS transistor side of the sense switch SL is set to VSS (corresponding to a power source voltage on the low potential side, such as the ground potential) and the power source PN on the NMOS transistor side is set to VCC (corresponding to a power source on the high potential side), whereby the sense latch SL is discharged. Next, the control signal lines SiD and SiS are raised to a select level so that the NMOS switches N2 and N3 are turned on. Thus, any of the verify voltages Vv1, Vv2 and Vv3 may be applied to the word line WL. At this time, the substrate voltage VWEL for the source line S and the memory cell MC is set to 0[V]. When the threshold voltage of the memory cell MC is lower than the select level on the word line, the memory cell MC is turned on so that the current flows from the bit line BL to the source line S side. As a result, the potential on the bit line BL is reduced. On the other hand, when the threshold voltage of the memory cell MC is not lower than the select level on the word line upon the write operation, the memory cell MC is not brought to the one state so that the potential of the bit line BL is not reduced. The voltage of the word line is returned to 0[V] and thereafter the voltages on the control signal lines SiD and SiS are lowered to turn off the NMOS switches N1 and N3. Further, the control signal lines TR and TRa are raised to a select level so that the NMOS switches N6 and N6a are turned on. Thus, the power source PP on the PMOS transistor side of the sense latch SL is set to VCC and the power source PN on the NMOS transistor side is set to VSS so as to activate the sense latch SL. As a result, the sense latch SL amplifies the difference in potential between the bit line BL and the bit line BLa on the reference side. If the memory cell MC is in the on state at this time, then the potential on the bit line BL side is reduced. Thus, when the bit line BL becomes lower than the bit line BLa on the reference side in level, 'High' latched in the sense latch SL is inverted to 'Low'. When the memory cell MC is off, the bit line BLa is not reduced in potential. Since the level on the bit line BL is set higher than the level of the bit line BLa on the reference side, 'High' latched in the sense latch SL remains non-inverted. The write operation and the write verify operation are repeated until 'High' latched in the sense latch SL is inverted to 'Low' according to this verify operation. Control over the write operation and the write verify operation is exerted by the control circuit 312.

A method of controlling the threshold voltage of each memory cell MC in which the quaternary or four-value (2-bit) data is written, will next be described. This control method is capable of converting data expressed in binary form into a binary (one-bit) signal "0" or "1" ('Low' or 'High') corresponding to each of quaternary (2-bit) data successively written in non-selected sense latches in accordance with three write operations by the write data conversion circuit 301 to be described later to thereby make it possible to write the quaternary or four-value (2-bit) data into one memory cell as will be described below.

Figure 65:
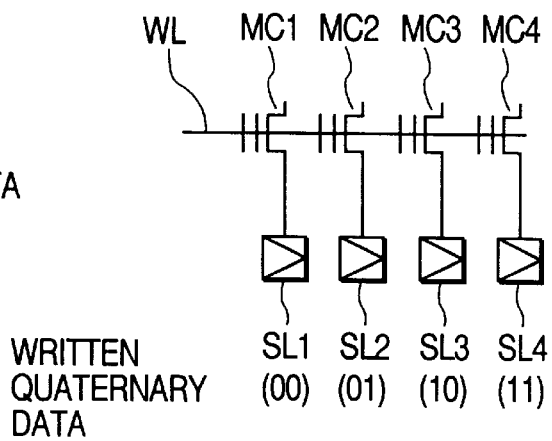
FIG. 65 is a diagram for describing the correspondence of four memory cells and quaternary data written therein to explain one example of quaternary data writing.

Now consider where four-value or quaternary data "00", "01", "10", "11" are written into four memory cells MC1, MC2, MC3 and MC4 electrically connected to one word line WL as shown in FIG. 65. The quaternary data "00", "01", "10" and "11" are obtained by delimiting one-bit data string "00011011" with two. Eight memory cells are normally required to write the eight data therein. However, if one-bit data string is delimited with two to make the four-value or quaternary (2-bit) data "00", "01", "10" and "11" as described above and the data are respectively written into one memory cell, then only four memory cells are required, so that the capacity of the memory can be doubled.

Figure 66:
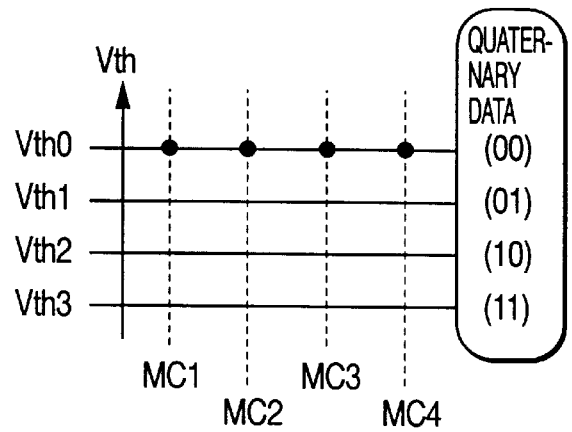
FIG. 66 is a diagram for describing threshold voltages of four memory cells at the time that the four memory cells are all kept in an erased state as a first stage for obtaining the written state shown in FIG. 64.

The erase operation is first carried out before the write operation and the threshold voltage of each of the memory cells MC1 through MC4 is matched with a high Vth0 (see FIG. 66). The erase operation will be described with reference to FIG. 62. For example, 12[V] and −4[V] are respectively applied as the voltage for the word line WL and the substrate voltage VWEL for the memory cell MC, and −4[V] is applied to the common source line S to raise the control signal line SiS to the select level so as to turn on the NMOS switch N3, thereby allowing the source side of the memory cell MC to be set to −4[V]. The erase operation can be carried out in this way. Thus, the floating gate of the memory cell MC to be erased is filled with electrons so that the threshold voltage of the memory cell MC is rendered high. Thereafter, the write and write verify operations are carried out. At this time, the voltages shown in FIG. 64 are considered to be applied to the word line WL.

Figure 67:
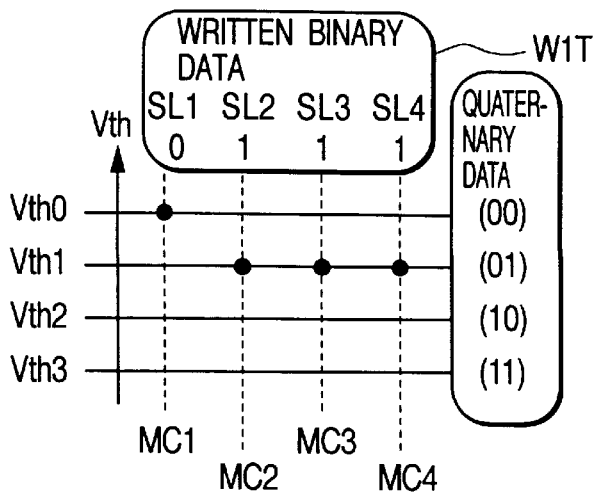
FIG. 67 is a diagram for describing changes in threshold voltages of four memory cells, which are obtained by [write 1] after the four memory cells are kept in an erased state as a second stage for acquiring the written state shown in FIG. 64.

For the [write 1] operation, binary data W1T to be written is first latched in each of sense latches SL1 through SL4 respectively electrically connected to the memory cells MC1 through MC4. Namely, the sense latch SL1 electrically connected to the memory cell MC1 is rendered 'Low' ("0" is latched in the sense latch SL1) and the sense latches SL2 through SL4 electrically connected to the memory cells MC2 through MC4 other than the memory cell MC1 are all rendered 'High' ("1" is latched in the sense latches SL2 through SL4), whereby the data is written into each of the memory cells MC2 through MC4. Thereafter, the already-described write and write verify operations are carried out with the voltage on the word line as, e.g., −9[V] upon the write and as Vv1 upon the write verify. If the threshold voltages of the memory cells MC2 through MC4 reach Vth1 as shown in FIG. 67, then the [write 1] operation is completed and the routine procedure proceeds to the [write 2] operation subsequent to this.

Figure 68:
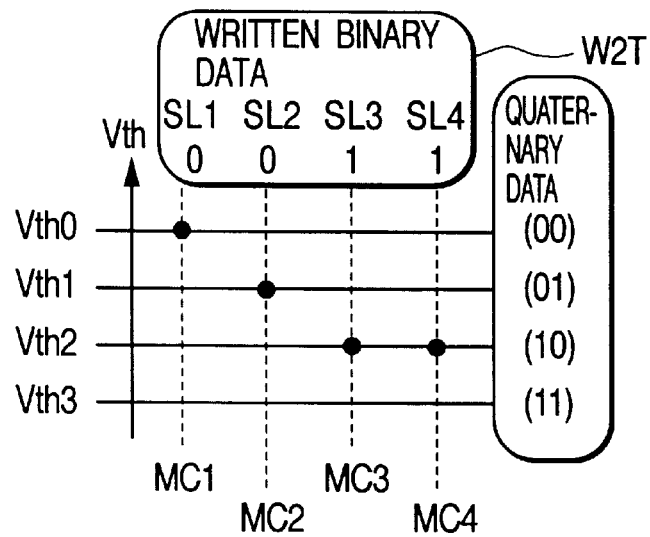
FIG. 68 is a diagram for describing changes in threshold voltages of memory cells, which are obtained by [write 2] as a third stage for obtaining the written state shown in FIG. 64.

Upon the [write 2] operation, binary data W2T to be written is first latched in each of the sense latches SL1 through SL4 respectively electrically connected to the memory cells MC1 through MC4. Namely, the sense latches SL1 and SL2 respectively electrically connected to the memory cells MC1 and MC2 are rendered "Low" ("0" is latched in the sense latches SL1 and SL2) and the sense latches SL3 and SL4 electrically connected to the memory cells MC3 and MC4 other than the memory cells MC1 and MC2 are rendered "High" ("1" is latched in the sense latches SL3 and SL4), whereby the data is written into each of the memory cells MC3 and MC4. Thereafter, the write and write verify operations are carried out with the voltage on the word line as, e.g., −9[V] upon the write and as Vv2 upon the write verify in same manner as for the [write 1] operation. If the threshold voltages of the memory cells MC3 and MC4 reach Vth2 as shown in FIG. 68, then the [write 2] operation is completed and the routine procedure proceeds to the [write 3] operation subsequent to this.

Figure 69:
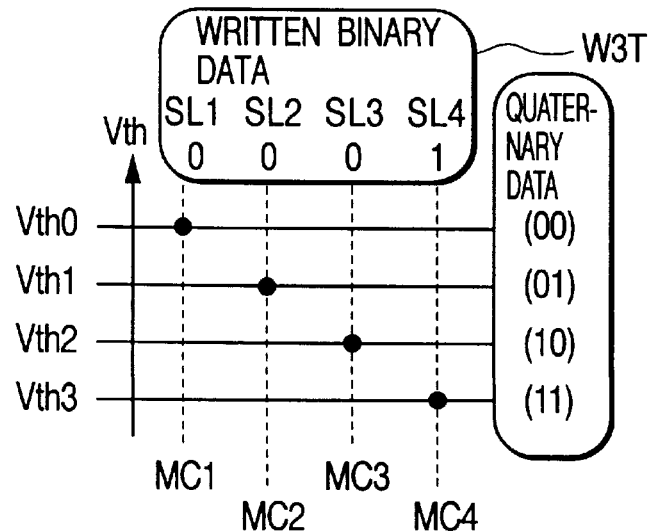
FIG. 69 is a diagram for describing changes in threshold voltages of memory cells, which are obtained by [write 3] as a fourth stage for obtaining the written state shown in FIG. 64.

For the [write 3] operation, binary data W3T to be written is first latched in each of the sense latches SL1 through SL4 respectively electrically connected to the memory cells MC1 through MC4. Namely, the sense latches SL1 through SL3 respectively electrically connected to the memory cells MC1 through MC3 are rendered "Low" ("0" is latched in the sense latches SL1 through SL3) and the sense latch SL4 electrically connected to the memory cell MC4 is rendered "High" ("1" is latched in the sense latch SL4), whereby the data is written into the memory cell MC4 alone. Thereafter, the write and write verify operations are carried out with the voltage on the word line as, e.g., −9[V] upon the write and as Vv3 upon the write verify in same manner as upon the [write 1] write [write 2] operations. If the threshold voltage of the memory cell MC4 reaches Vth3 as shown in FIG. 69, then the [write 3] operation is completed and hence all the write operations are completed, whereby four-value or quaternary (2-bit) information "00", "01", "10" and "11" are written into the memory cells MC1 through MC4. Thus, the quaternary (2-bit) information can be written into one memory cell by performing the three write operations of [write 1] through [write 3] in which the voltage to be applied to the word line at the above-described verify is set to Vv1 through Vv3.

Figure 70:
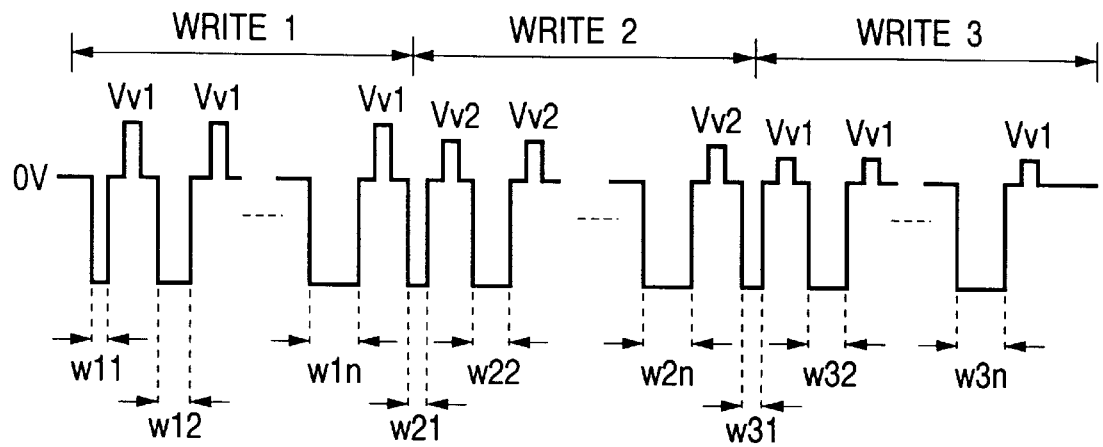
FIG. 70 is a diagram for describing, as a write voltage application mode, one example of voltage waveforms at the time that write pulse widths are gradually increased.
Figure 71:
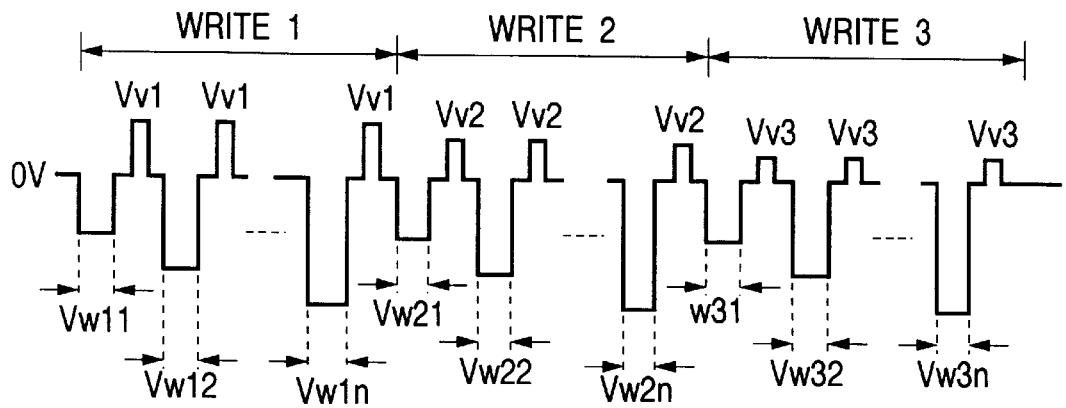
FIG. 71 is a diagram for describing, as a write voltage application mode, one example of voltage waveforms at the time that write pulse widths are gradually increased.

In the example of the application of the word line voltage, which is shown in FIG. 64, the write verify operation subsequent to the write operations at the respective stages ([write 1] through [write 3]) is performed once to obtain the desired threshold voltages. As the method of applying each write voltage to the word line, methods shown in FIGS. 70 and 71 can be selected in addition to the example shown in FIG. 64. The method shown in FIG. 70 is intended to control the time required to apply one write voltage, i.e., a write pulse width so that it gradually increases. The method shown in FIG. 71 is intended to fix one write pulse and control a write voltage level at that time so as to gradually increase it.

A method of converting a binary (one-bit) written data string into binary data W1T through W3T for four-value or quaternary (2-bit) writing at [write 1] through [write 3] and their complementary signals W1B through W3B will next be described.

Figure 72:
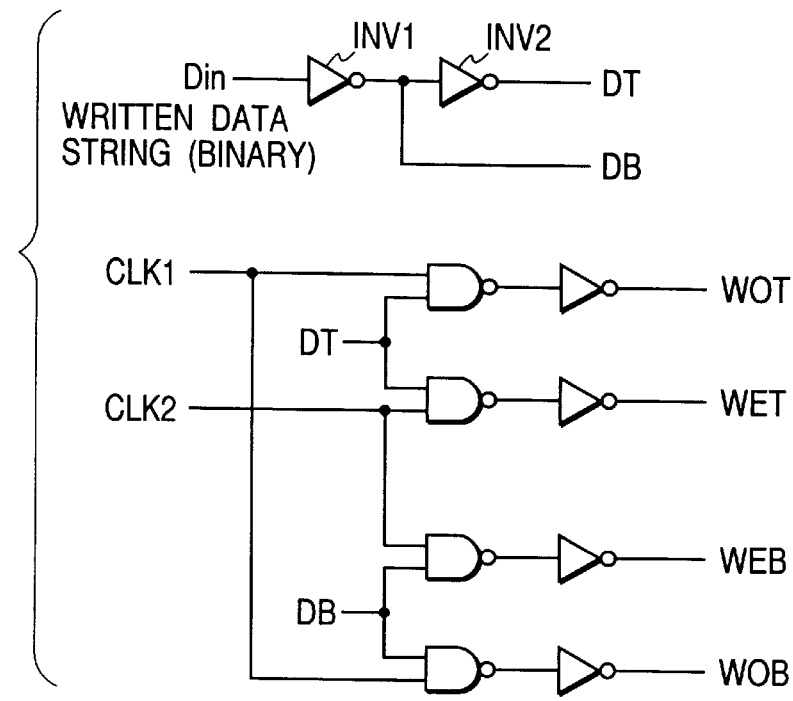
FIG. 72 is a logic circuit diagram showing one example of a circuit for separating written data into even-numbered and odd-numbered bits.

FIG. 72 shows one example of a circuit for separating a binary (on-bit) data string to be written into odd-numbered and even-numbered bits. The circuit shown in the figure is characterized in that the binary data string to be written is separated into complementary signals of DT and DB and thereafter the complementary signals are separated into odd-numbered bits WOT and WOB (corresponding to signals complementary to each other) and even-numbered bits WET and WEB (corresponding to signals complementary to each other) in response to clock signals CLK1 and CLK2 shifted by a half cycle from each other.

Figure 73:
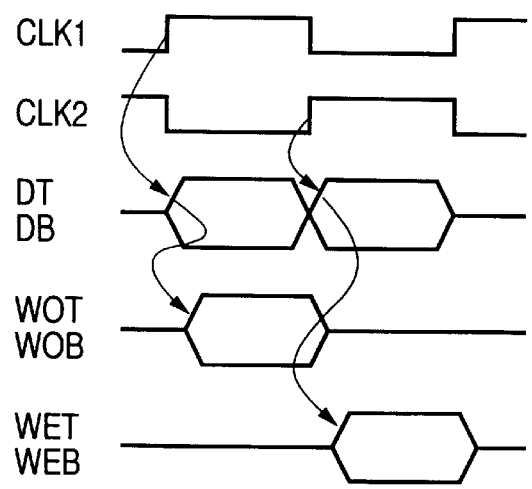
FIG. 73 is a timing chart for describing one example of the operation of the circuit shown in FIG. 72.

The operation of the circuit shown in FIG. 72 will be explained with reference to FIG. 73. FIG. 73 shows, as an example, the case in which a binary (one-bit) written data string is inputted to a data input terminal (Din) 16 of a flash memory sequentially as "1" and "1" (continuously as 'High' and 'High'). The input written data string is separated into complementary signals of DT and DB by inverter circuits INV1 and INV2. The separated signals DT and DB are respectively separated into a set of WOT and WOB (odd-numbered bits) and a set of WET and WEB (even-numbered bits) corresponding to signals complementary to each other. In the present example, the conversion of the data string into the complementary signals is performed to meet or treat the case in which the input of the same latch SL is defined as a differential signal or complementary signals. This is not necessarily limited to the present example.

Figure 74:
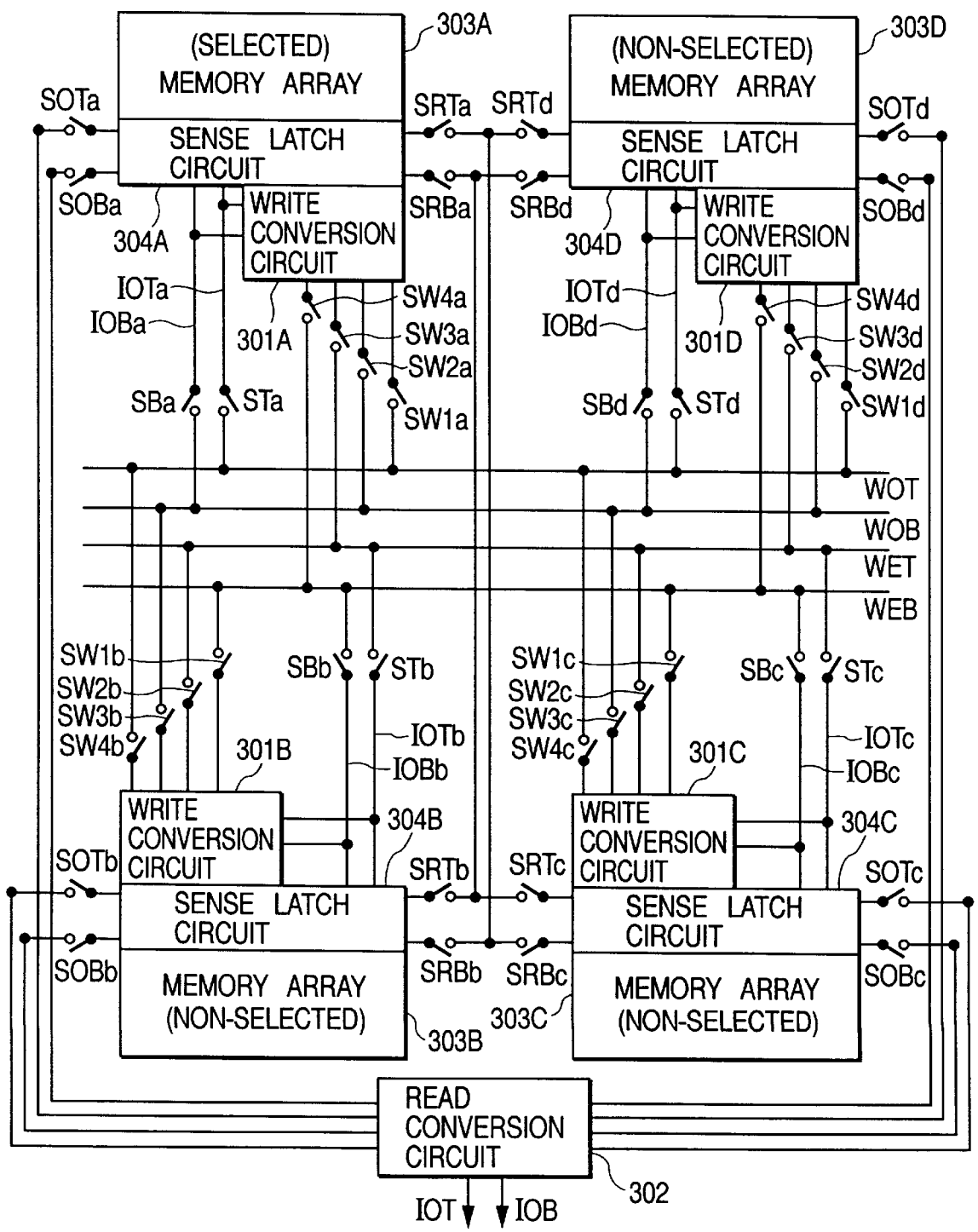
FIG. 74 is a block diagram illustrating the manner in which the memory cell array, the sense latch circuit, the write conversion circuit and the read conversion circuit shown in FIG. 61 are electrically connected to one another.

FIG. 74 shows a circuit configuration for writing the complementary data separated into even-numbered and odd-numbered bits in this way, in four-value or quaternary form. The configuration shown in the figure is equivalent to a configurational example in which the components shown in FIG. 61 are associated with a memory cell array 303, a sense latch circuit 304, a write conversion circuit 301 and a read conversion circuit 302. Although the invention is not restricted in particular, the memory cell array 303 comprises memory arrays 303A through 303D divided into four. The sense latch circuit 304 comprises sense latch circuits 304A through 304D divided into four. The write conversion circuit 301 is composed of write conversion circuits 301A through 301D divided into four. Access is made to one memory array selected from the four memory arrays 303A through 303D. Signal lines for the complementary signals WOT, WOB, WET and WEB are respectively electrically connected to the write conversion circuit 301A through switches SW1a through SW4a, the write conversion circuit 301B through switches SW1b through SW4b, the write conversion circuit 301C through the switches SW1c through SW4c, and the write conversion circuit 301D through switches SW1d through SW4d. Further, the write conversion circuit 301A and the sense latch circuit 304A electrically connected to input/output lines IOTa and IOBa are electrically connectable to their corresponding signal lines for the complementary signals WOT and WOB through switches SBa and STa, whereas the write conversion circuit 301D and the sense latch circuit 304D electrically connected to input/output lines IOTd and IOBd are electrically connectable to their signal lines for the complementary lines WOT and WOB through switches SBd and STd. Similarly, the write conversion circuit 301B and the sense latch circuit 304B electrically connected to input/output lines IOTb and IOBb are electrically connectable to their corresponding signal lines for the complementary signals WET and WEB through switches SBb and STb, whereas the write conversion circuit 301C and the sense latch circuit 304C electrically connected to input/output lines IOTc and IOBc are electrically connectable to their corresponding signal lines for the complementary signals WET and WEB through switches SBc and STc. Further, the sense latch circuits 304A through 304D are capable of mutually transferring latch signals through switches SRTa, SRBa, SRTb, SRBb, SRTc, SRBc, SRTd and SRBd. The respective switches are controlled by a control circuit 12. The respective sense latch circuits 304A through 304D are electrically connected to a read conversion circuit 302 through switches SOTa, SOBa, SOTb, SOBb, SOTc, SOBc, SOTd and SOBd.

In order to write the four-value or quaternary (2-bit) information into one selected memory array, the circuit shown in FIG. 74 serves as a circuit for latching the signals separated into odd-numbered and even-numbered bits by the separation circuit shown in FIG. 72 in the sense latch circuit connected to the two non-selected memory arrays and temporarily holding them therein, synthesizing the binary data W1T through W3T corresponding to the [write 1] through [write 3] and their complementary signals W1B through W3B by the write conversion circuit provided for the selected memory array upon the [write 1] through [write 3] operations, and allowing the sense latch circuit 304 of the selected memory array to latch the synthesized data, thereby writing the data into one selected memory array.

Now consider where, for example, the memory array 303A is used as a selected memory array (the memory arrays 303B through 303D are used as non-selected memory arrays) and data is written into a memory cell included in the selected memory array 303A. The switches SRTd and SRBd are closed so as to allow the sense latch circuit 304D to hold the odd-numbered bits WOT and WOB separated by the circuit shown in FIG. 69 therein. The switches SRTb and SRBb are closed so as to cause the sense latch circuit 304B to hold the even-numbered bits WET and WEB therein. The even-numbered bits may be stored in the sense latch circuit 304C. However, a description will be made below, of a case in which they have been stored in the sense latch circuit 304B. For the [write 1] through [write 3] operations, the switches SRTd, SRBd, SRTb and SRBb and the switches SW1a through SW4a are closed so as to transfer the odd-numbered bit information WOT and WOB held in the sense latch circuit 304D and the even-numbered bit information WET and WEB held in the sense latch circuit 304B to the write conversion circuit 301A for the selected memory array 303A. The write conversion circuit 301A subjected to their transfer converts four-value or quaternary (2-bit) information into binary (one-bit) data "0" or "1" ('High' or 'Low') for writing it into the corresponding memory cell and causes the sense latch circuit 304A of the selected memory array 303A to latch the converted data, thereby performing write and write verify operations. A circuit configuration for synthesizing data using the write conversion circuits 301A through 301D and an example of its operation will next be explained.

Figure 75:
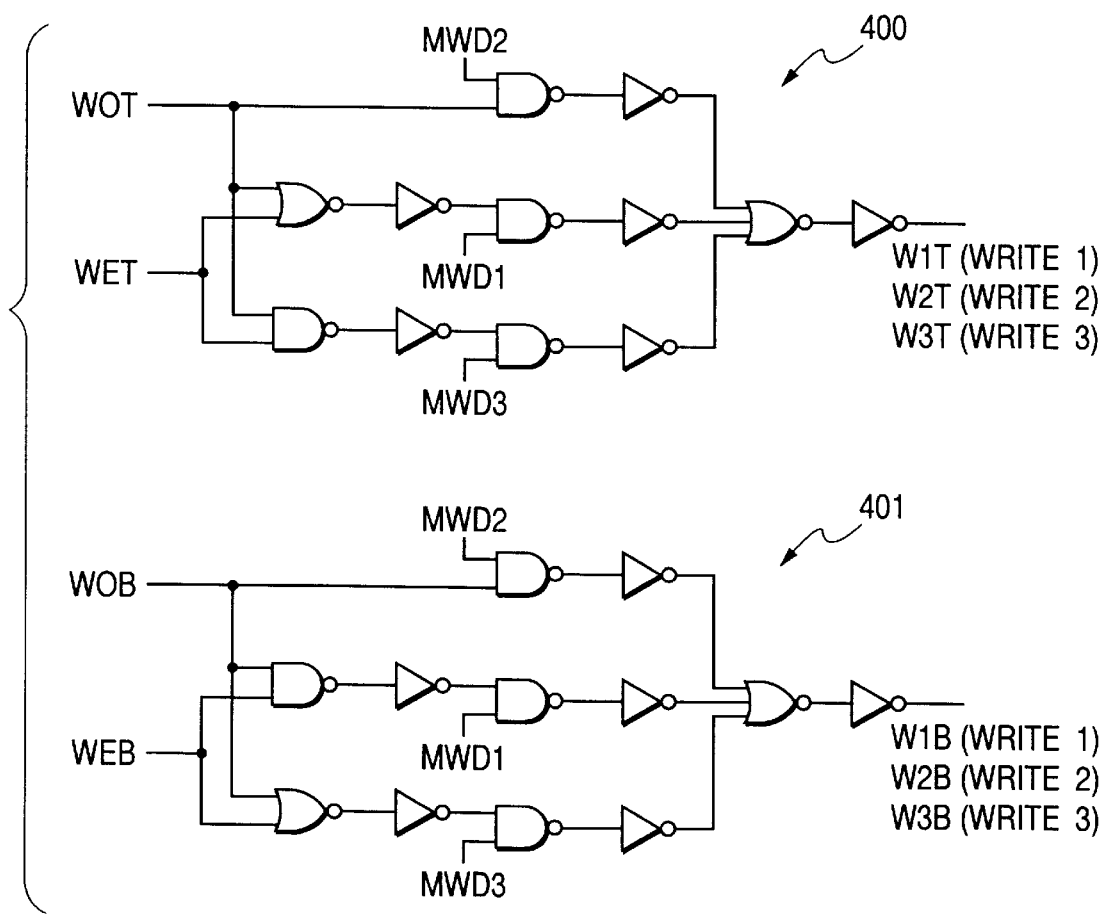
FIG. 75 is a logic circuit diagram showing one example of a write data synthesis circuit for generating data for [write 1] to [write 3] from the data separated into the even-numbered and odd-numbered bits by the circuit shown in FIG. 72.

FIG. 75 shows one example of a write data synthesis circuit included in each write conversion circuit. The write conversion circuits 301A through 301D shown in FIG. 74 are all implemented by the circuit shown in FIG. 75. The write data synthesis circuit shown in the same drawing is roughly separated into a circuit portion 400 for synthesizing non-reverse data WOT and WET of 2-bit complementary signals and respectively synthesizing data W1T through W3T supplied to the input/output line IOT of the sense latch SL in association with the [write 1] through [write 3], and a circuit portion 401 for synthesizing reverse data WOB and WEB of the 2-bit complementary signals and respectively synthesizing W1B through W3B supplied to the input/output line IOB of the sense latch SL in association with the [write 1] through [write 3]. The circuit portion 400 produces or forms, based on the non-reverse data WOT and WET of the 2-bit complementary signals, the data W1T through a signal path selected by a mode signal MWD1 upon the [write 1], forms the data W2T through a signal path selected by a mode signal MWD2 upon the [write 2], and forms the data W3T through a signal path selected by a mode signal MWD3 upon the [write 3]. The circuit portion 401 produces or forms, based on the reverse data WOB and WEB of the 2-bit complementary signals, the data W1B through a signal path selected by a mode signal MWD1 upon the [write 1], forms the data W2B through a signal path selected by a mode signal MWD2 upon the [write 2], and forms the data W3B through a signal path selected by a mode signal MWD3 upon the [write 3]. For [write 1], the data W1T and W1B are supplied to the input/output lines IOT and IOB of the sense latch SL of the selected memory array to perform the write and the write verify. For the [write 2], the W2T and W2B are supplied to the input/output lines IOT and IOB of the sense latch SL of the selected memory array to perform the write and the write verify. For [write 3], the W3T and W3B are supplied to the input/output lines IOT and IOB of the sense latch SL of the selected memory array to perform the write and the write verify. For [write 1] through [write 3], WOT and WET are supplied to the write conversion circuit 301A on the selected side from the sense latch circuit 304D on the non-selected side, and WOB and WEB are supplied to the write conversion circuit 301A from the sense latch circuit 304C on the non-selected side.

FIGS. 76(A), 76(B) and 76(C) respectively show the results of outputs by the data synthesis circuit shown in FIG. 75. When [write 1] is performed, the signal MWD1 shown in FIG. 75 is rendered 'High'. Similarly, the signals MWD2 and MWD3 are respectively rendered 'High' upon executing the [write 2] and [write 3]. Outputs at IOT and IOB, which are shown in FIGS. 76(A), 76(B) and 76(C), correspond to the written binary data W1T through W3T shown in FIGS. 67 through 69 with respect to a binary data string ("0", "0", "0", "1", "1", "0", "1" and "1") upon the [write 1] through [write 3] write 3J operations.

Similarly, when writing is made to another memory array, data separated into odd-numbered bits and even-numbered bits are temporarily held in two sense latch circuits of a non-selected memory array. Upon writing, the held data are transferred to a write conversion circuit for a selected memory array, where the written data may be synthesized so as to be latched in the corresponding sense latch circuit of the selected memory array.

Incidentally, the circuit shown in FIG. 72 for separating the data into even-numbered and odd-numbered bits and the data synthesis circuit shown in FIG. 75 are included in the write data conversion circuit 301.

<<2>> Read Operation:

A configuration for reading out information corresponding to 2 bits, which is stored in one memory cell, will next be described in detail. A configuration for reading out 2-bit (four-value or quaternary) data written into one memory cell and converting the data into a one-bit (binary) data string will first be explained with reference to FIGS. 77 through 86.

Figure 77:
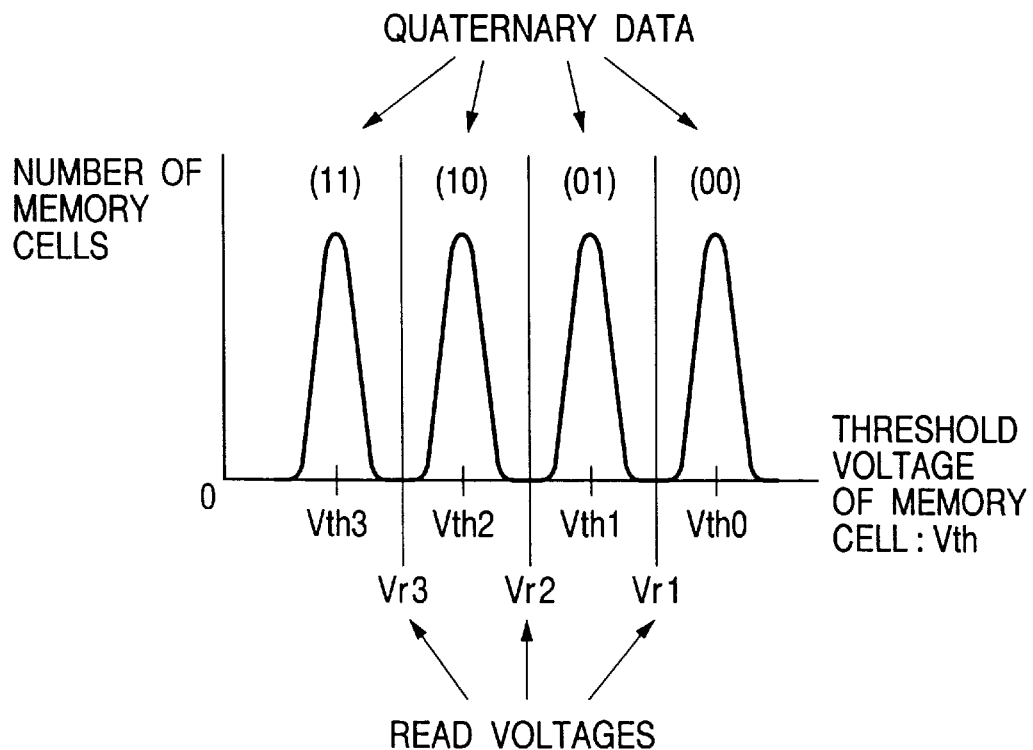
FIG. 77 is a diagram for describing the relationship between word line potentials and threshold voltages of memory cells at the time of reading of the memory cells with data written therein in quaternary form.
Figure 78:
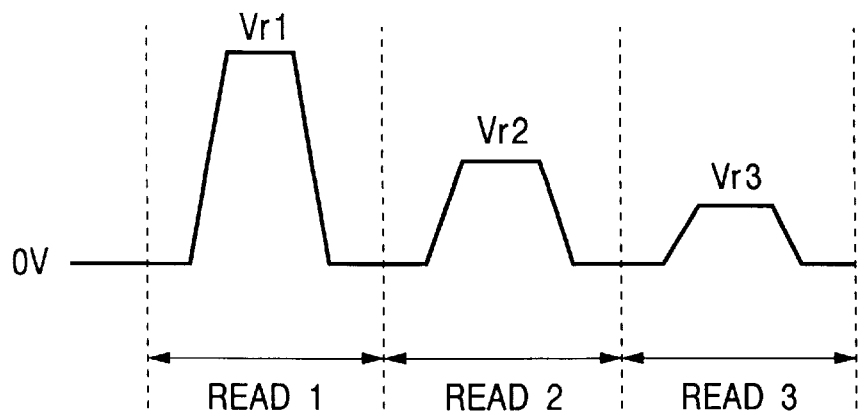
FIG. 78 is a waveform diagram for describing examples of voltages applied to read word lines.

In the present example, voltages applied to the corresponding word line at reading will be defined as voltages Vr1, Vr2 and Vr3 that respectively satisfy Vth0>Vr1>Vth1, Vth1>Vr2>Vth2, Vth2>Vr3>Vth3 shown in FIG. 77 with respect to threshold voltages of memory cells polarized in four form as shown in FIG. 77 according to the paragraph <<1>> write operation. Examples of the voltages applied to the word line at this time will be shown in FIG. 78. An operation for applying the voltage Vr1 to the corresponding word line to thereby perform reading is called "[read 1]". Similarly, operations for respectively applying the voltages Vr2 and Vr3 to the word line to thereby perform reading are called "[read 2]" and "[read 3]". Performing the read operation three times means that four-value or quaternary (2-bit) information written into each memory cell is read out as binary (one-bit) information every one of the read operations of [read 1], [read 2] and [read 3].

Since the essential or principal circuits including the memory arrays and the sense latch circuits at [read 1], [read 2] and [read 3] referred to above are common in operation, the read operations of their common portion will first be explained with reference to FIG. 62.

Upon data reading, a power source PP on the PMOS transistor side of a sense latch SL is first set to a ground potential VSS and a power source PN on the NMOS transistor side is set to a power source voltage VCC. Thereafter, control signal lines RPC and SiD are raised to a select level to turn on NMOS switches N4 and N2 respectively. Thus, a bit line BL electrically connected to a selected memory cell MC and the node A side are precharged to 1V, for example. Simultaneously, a control signal line RPCa is raised to a select level to turn on an NMOS switch N4a, whereby the node Aa side on the reference side is precharged to 0.5[V], for example. Next, the voltages on the control signal lines RPC and RPCa are reduced to a non-select level to turn off the NMOS switches N4 and N4a. Thereafter, a control signal line SiS is raised to a select level to turn on an NMOS switch N3. Thus, the voltage for a source line S and a substrate voltage VWEL of the memory cell are set to 0[V] respectively and each read voltage is applied to the corresponding word line. When, at this time, the threshold voltage of the memory cell MC is lower than the voltage applied to the word line, the memory cell MC is turned on so that a current flows from the bit line BL side to the source line side. Consequently, the voltages at the bit line and the node A side are lowered. On the other hand, when the threshold voltage of the memory cell MC is higher than the voltage applied to the word line, the memory cell MC is not turned on so that no current flows in the memory cell. Therefore, the voltages at the bit line BL and the node A side are not reduced. Next, the voltage on the word line WL is set to 0[V] and the voltages on the control signal lines SiD and SiS are reduced to a non-select level to turn off the NMOS switches N2 and N3. Thereafter, control signal lines TR and TRa are reduced to a select level to turn on NMOS switches N6 and N6a. Next, the power source PP on the PMOS transistor side of the sense latch SL is set to VCC and the power source PN on the NMOS transistor side is set to VSS. In this condition, the difference in voltage between the node A and the node Aa on the reference side is amplified. A control signal line YG is raised to a select level in timing provided to determine its amplifying operation to turn on NMOS switches N8 and N8a, whereby the information held in the sense latch SL is outputted to input/output lines IOT and IOB. Signals complementary to each other are outputted to the input/output lines IOT and IOB.

Figure 79:
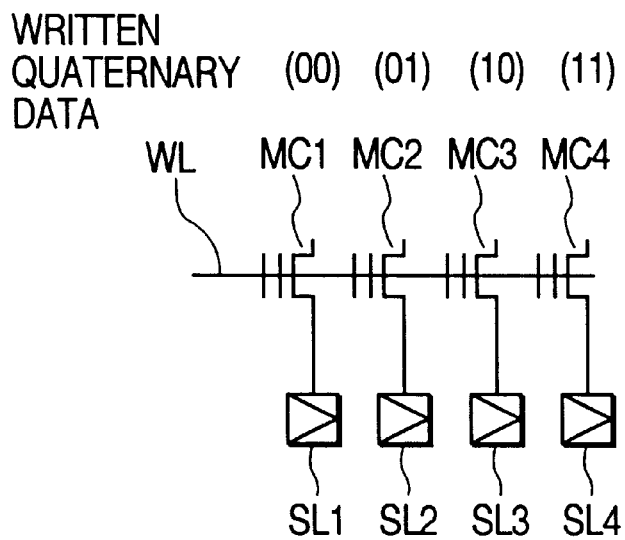
FIG. 79 is a diagram for describing the correspondence of four memory cells and data written therein in quaternary form to explain one example of the reading of quaternary data.

The reading of four-value or quaternary (2-bit) information written into each memory cell at the operations of [read 1⌋, ⌈read 2⌋ and ⌈read 3⌋ will next be described with the case shown in FIG. 79 as an example. Now consider, when referring to FIG. 79, that four-value or quaternary (2-bit) data of "00", "01", "10" and "11" have been written into four memory cells MC1 through MC4 electrically connected to one word line WL. These four values are those obtained by delimiting a binary (one-bit) data string "00011011" with two according to the already-known write operations to thereby define it as "00", "01", "10" and "11". They are stored in their corresponding memory cells MC1 through MC4. Further, SL through SL4 indicate sense latches respectively electrically connected to the memory cells MC1 through MC4. In the present example, the reading of the multivalues (four values) stored in one memory cell can be realized by the simple configuration of each sense latch.

Figure 80:
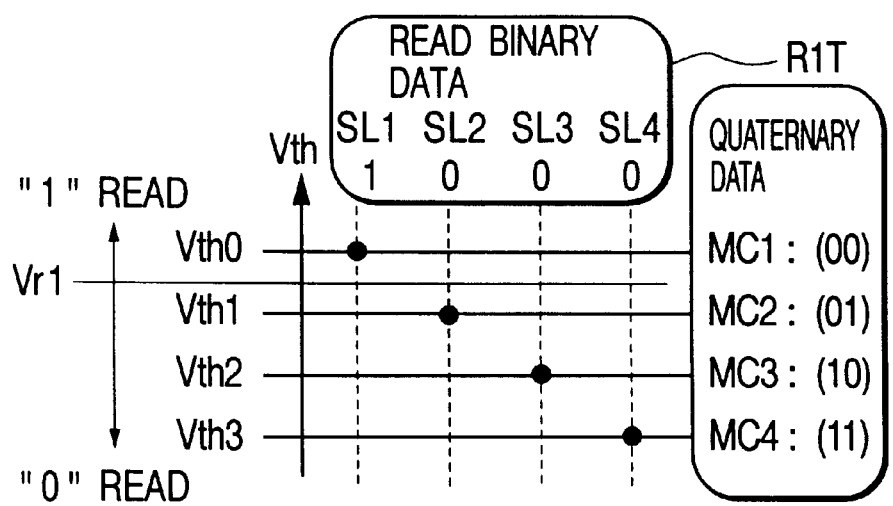
FIG. 80 is a diagram for describing binary data obtained by [read 1] with respect to the memory cells shown in FIG. 79.
Figure 81:
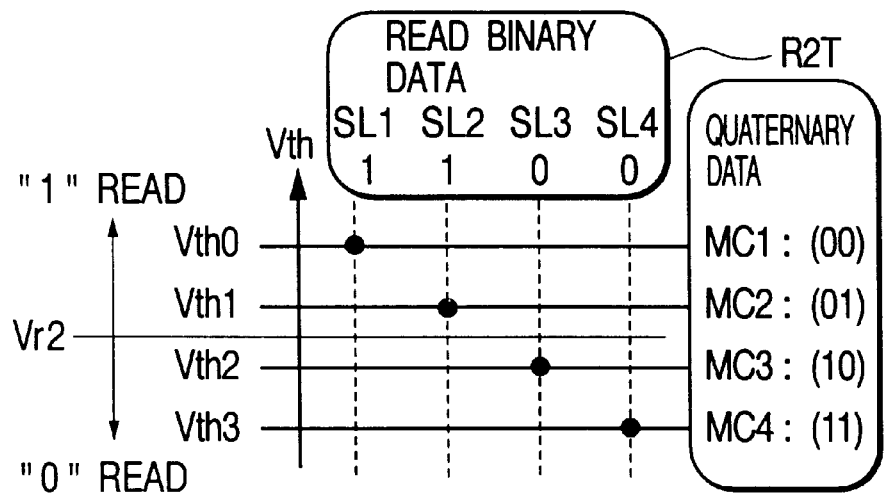
FIG. 81 is a diagram for describing binary data obtained by [read 2] with respect to the memory cells shown in FIG. 79.
Figure 82:
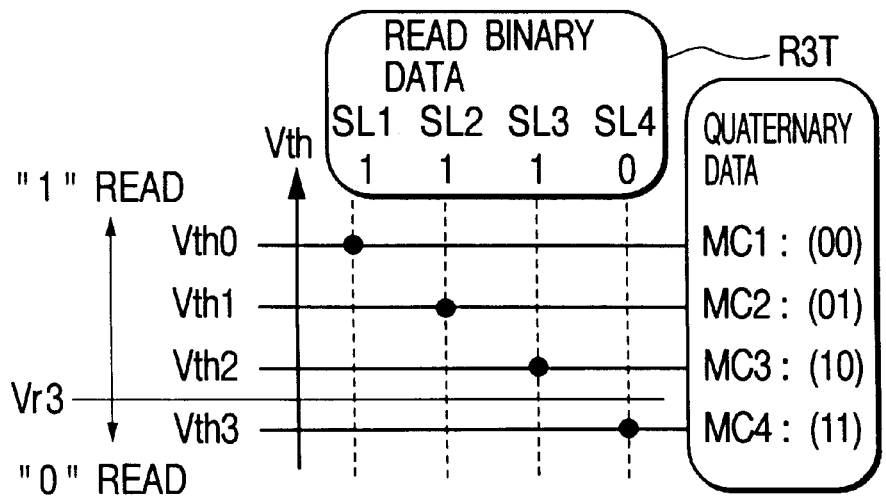
FIG. 82 is a diagram for describing binary data obtained by [read 3] with respect to the memory cells shown in FIG. 79.

FIG. 80 is a diagram showing the relationship between threshold voltages of memory cells MC1 through MC4 and a read voltage Vr1 applied to a word line, and "0" or "1" ('High' or 'Low') of binary (one-bit) data R1T read from the memory cells MC1 through MC4 and latched in sense latches SL1 through SL4 according to the operation of ⌈read 1⌋. Similarly, FIGS. 81 and 82 respectively show the relationship between threshold voltages of the memory cells MC1 through MC4 and read voltages Vr2 and Vr3 applied to the word line, and binary (one-bit) data R2T and R3T read from the memory cells MC1 through MC4 and latched in the sense latches SL1 through SL4 according to the operations of ⌈read 2⌋ and ⌈read 3⌋. A method of compressing this binary (one-bit) information and converting the binary (one-bit) data R1T through R3T read from the memory cells with four-value or quaternary (2-bit) information stored therein and their complementary signals R1B through R3B into binary (one-bit) information prior to being compressed as four-value or quaternary data and stored in the memory cells, in the flash memory composed of the aforementioned configuration shown in FIG. 74, will be described.

The reading of information in the selected memory array 303A shown in FIG. 74 will be explained as an illustrative example. The switches SRTa, SRBa, SRTb and SRBb are closed so as to transfer the binary (one-bit) data R1T read by the operation of ⌈read 1⌋ and its complementary signal R1B to the sense latch circuit 303B, whereby the sense latch 304B holds the data R1T and R1B therein. After the switches SRTa, SRBa, SRTb and SRBb have been opened (turned off), the operation ⌈read 2⌋ is carried out.

For the operation ⌈read 2⌋, the switches SRTa, SRBa, SRTc and SRBc are closed (turned on) so that the binary (one-bit) data R2T and R2B read from the selected memory array 303A are transferred from the sense latch circuit 304A to the sense latch 304C, whereby the sense latch circuit 304C holds the data R2T and R2B therein. Thereafter, these switches are opened and the operation ⌈read 3⌋ is started to read the binary (one-bit) data R3T and R3B after which they are held in the sense latch 304A. The three read data held in the three sense latch circuits 304A, 304B and 304C are supplied to the read conversion circuit 302 through the switches SOTa, SOBa, SOTb, SOBb, SOTd and SOBd. The read conversion circuit 302 converts or restores the data into bit-by-bit data strings.

Figure 83:
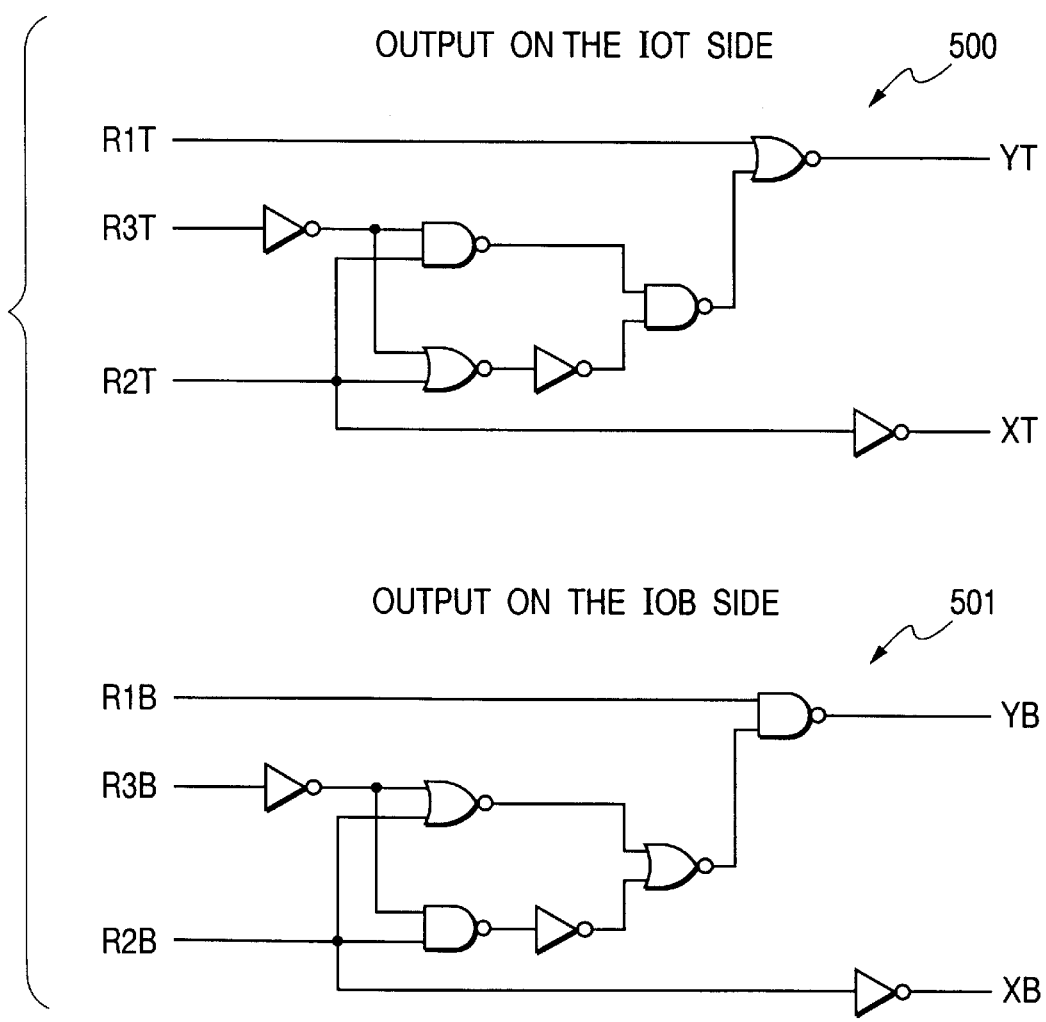
FIG. 83 is a logic circuit diagram showing one example of a read data synthesis circuit.

FIG. 83 shows an example of a circuit for converting binary (one-bit) data R1T through R3T read according to the operations ⌈read 1⌋ through ⌈read 3⌋ and their complementary signals R1B through R3B into four-value or quaternary (2-bit) data "00", "01", "10" and "11" stored in each memory cell.

The read data synthesis circuit shown in the same figure is roughly separated into a circuit portion 400 on the input/output line IOT side and a circuit portion 401 on the input/output IOB side. The circuit portion 400 produces or forms 2-bit non-reverse signals YT and XT in parallel based on the non-reverse signals R1T through R3T obtained by the three readings of ⌈read 1⌋ through ⌈read 3⌋. The circuit portion 401 forms 2-bit reverse signals YB and XB in parallel based on the reverse signals R1B through R3B obtained by the three readings of ⌈read 1⌋ through ⌈read 3⌋. Namely, the read data synthesis circuit converts the data R1T, R2T and R3T transferred from the sense latch circuits 304A, 304B and 304C and their complementary signals R1B, R2B and R3B into a four-value or quaternary (2-bit) data string. XT indicates a high-order bit of four-value or quaternary (2-bit) data, whereas YT indicates a low-order bit. XB and YB indicate signals complementary to the data referred to above. When the quaternary data is "10", for example, the high-order bit results in "1" and the low-order bit results in "0".

FIG. 84 shows the relationship between the data R1T through R3T (R1B through R3B) obtained by the operations ⌈read 1⌋ through ⌈read 3⌋ referred to above and the combined or synthesized outputs XT and YT (XB and YB) obtained thereby.

Figure 85:
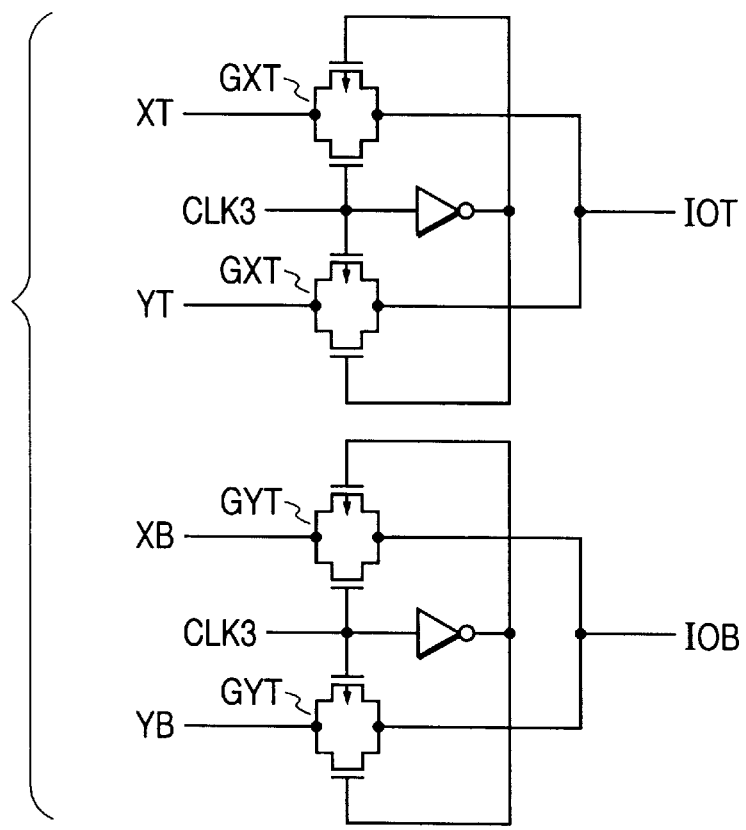
FIG. 85 is a circuit diagram showing examples of circuits for respectively alternately outputting high-order and low-order bits, based on outputs produced from the read data synthesis circuit.

The high-order bits XT and XB and low-order bits YT and YB obtained by the read data synthesis circuit are alternately selected by circuits shown in FIG. 85 and outputted as 2-bit data therefrom. The circuits shown in FIG. 85 are respectively provided with CMOS transfer gates GXT and GYT for alternately outputting the high-order bit XT and the low-order bit YT to the IOT in synchronism with a clock signal CLK3 and alternately outputting the high-order bit complementary signal XB and the low-order bit complementary signal YB to the IOB in synchronism with the clock signal CLK3. Thus, the quaternary information stored in one memory cell can be read out as the 2-bit data string.

Figure 86:
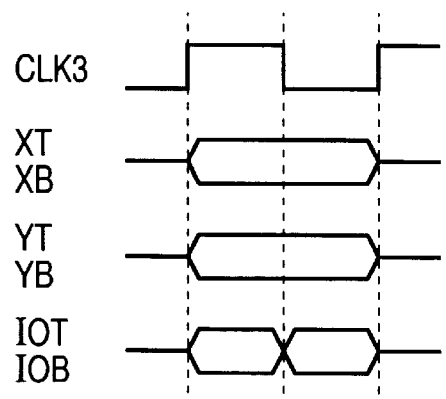
FIG. 86 is a timing chart for describing examples of the operations of the circuits shown in FIG. 85.

FIG. 86 shows outputs at IOT and IOB, which are obtained when a case in which "XT" and "YT" are both of "11" as timing provided to operate the circuit shown in FIG. 83 by way of example (complementary signals "XB" and "YB" are both "00"), i.e., information stored in one memory cell is represented as "11" in four-value or quaternary (2-bit) form, is considered as an example. When the clock signal CLK3 is in a 'High' state, the CMOS transfer gates GXT and GXB are opened so as to output the XT and XB signals to their corresponding input/output lines IOT and IOB. At this time, the CMOS transfer gates GYT and GYB are closed and the YT and YB signals are not outputted. On the other hand, when the clock signal CLK3 is in a 'Low' state, the CMOS transfer gates GYT and GYB are opened so as to output the YT and YB signals to their corresponding input/output lines IOT and IOB. At this time, the XT and XB signals are not outputted because the transfer gates GXT and GXB are being closed.

Incidentally, the read data synthesis circuit shown in FIG. 83 and the circuits shown in FIG. 85 for alternately outputting the high-order and low-order bits are included in the read conversion circuit 302.

As described above, the binary (one-bit) data respectively read in association with the quaternary (2-bit) information written into the memory cell according to the three operations ⌈read 1⌋ through ⌈read 3⌋ are transferred to the sense latch circuit 304 of the non-selected memory array. After the three readings have been completed, these binary (one-bit) data are converted into the binary (one-bit) data string by the read data conversion circuit 302 to thereby read out the four-value or quaternary (2-bit) information.

The invention, which has been made by the present inventors, has been described specifically with reference to various embodiments. It is however needless to say that the present invention is not necessarily limited to this and various changes can be made within the scope not departing from the gist or substance thereof. The present invention is not necessarily limited to a flash memory and can be applied to, for example, a non-volatile memory such as an EEPROM or the like, and a semiconductor integrated circuit such as a microcomputer or the like provided with such an memory as an on-chip memory. Further, the semiconductor integrated circuit according to the present invention is not limited to a digital still camera and a PC card and can be widely applied to other various data processing systems.

Effects obtained by typical ones of the features disclosed in the present application will be explained as follows:

Namely, the operation of writing of data into a non-volatile memory cell can be speeded up. Further, the speeding up of the write operation for the non-volatile memory cell can be made compatible with high reliability of data retention.

What is claimed is:

1. A semiconductor integrated circuit comprising:
    a plurality of electrically erasable and programmable non-volatile memory cells each of which has one of an erase threshold voltage region corresponding to an erase state and a write threshold voltage region corresponding to a write state; and
    a control circuit which controls to apply a first pulse-shaped voltage to a memory cell of said plurality of non-volatile memory cells in a first write operation mode, and a second pulse-shaped voltage to a memory cell of said plurality of non-volatile memory cells in a second write operation mode, wherein a threshold voltage of said memory cell in said plurality of non-volatile memory cells changes to a first write threshold voltage region from said erase threshold voltage region in accordance with said first write operation mode, and a threshold voltage of said memory cell in said plurality of non-volatile memory cells changes to a second write threshold voltage region from said erase threshold voltage region in accordance with said second write operation,
    wherein each of said first and said second write operation modes is set by data or a command which is applied to said control circuit, and
    wherein the amount of change in threshold voltage of the memory cell applied with said first pulse-shaped voltage is larger than the amount of change in threshold voltage of the memory cell applied with said second pulse-shaped voltage.

2. A semiconductor integrated circuit according to claim 1, wherein said control circuit has a rewrite control circuit, and wherein a width of said second write threshold voltage region formed by said first write operating mode is narrower than a width of said second write threshold voltage region formed by said second write operating mode by said rewrite control circuit.

3. A semiconductor integrated circuit according to claim 1, further comprising a verify level generating circuit which generates a first write verify level in said first write operation mode and which generates a second write verify level in said second write operation mode, wherein said first write verify level is higher than said second write verify level.

4. A semiconductor integrated circuit according to claim 3, wherein the data written in said first write operation mode is binary data and the data written in said second write operation mode is multivalued data.

5. A semiconductor integrated circuit according to claim 4, wherein said rewrite control means rewrites binary data written in said first write operation mode to multivalued data in said second write operation mode.

6. A semiconductor integrated circuit according to claim 5, wherein a first memory mat in which data is written in said first write operation mode, and a second memory mat in which data is written in said second write operation mode, are respectively provided in separate form.

7. A semiconductor integrated circuit according to claim 3, wherein a first memory mat in which data is written in said first write operation mode, and a second memory mat in which data is written in said second write operation mode, are respectively provided in separate form.

8. A semiconductor integrated circuit according to claim 7, further including a trimming circuit capable of trimming the minimum value of said each pulse-shaped voltage.

9. A semiconductor integrated circuit according to claim 8, wherein said trimming circuit is further capable of trimming the rate of gradual increase in said each pulse-shaped voltage.

10. A semiconductor integrated circuit according to claim 1, wherein the data written in said first write operation mode is binary data and the data written in said second write operation mode is multivalued data.

11. A semiconductor integrated circuit according to claim 10, wherein said rewrite control means rewrites binary data written in said first write operation mode to multivalued data in said second write operation mode.

12. A semiconductor integrated circuit according to claim 11, wherein a first memory mat in which data is written in said first write operation mode, and a second memory mat in which data is written in said second write operation mode, are respectively provided in separate form.

13. A semiconductor integrated circuit according to claim 11, further including a trimming circuit capable of trimming the minimum value of the pulse width of said each pulse-shaped voltage.

14. A semiconductor integrated circuit according to claim 13, wherein said trimming circuit is further capable of trimming the rate of gradual increase in pulse width of said each pulse-shaped voltage.

15. A semiconductor integrated circuit according to claim 1, wherein a first memory mat in which data is written in said first write operation mode, and a second memory mat in which data is written in said second write operation mode, are respectively provided in separate form.

16. A semiconductor integrated circuit according to claim 1, wherein, upon said first and second write operation modes, said control circuits fixes values of pulse-shaped voltages and varies the amount of change in threshold voltage according to the difference between pulse widths of the pulse-shaped voltages.

17. A semiconductor integrated circuit according to claim 1, wherein, upon said first and second write operation modes, said control circuit fixes pulse widths of pulse-shaped voltages and varies the amount of change in threshold voltage according to the difference between values of the pulse-shaped voltages.

18. A semiconductor integrated circuit comprising:
    a plurality of electrically erasable and programmable non-volatile memory cells; and
    control means for supplying a pulse-shaped voltage to said each non-volatile memory cell until a threshold voltage of said non-volatile memory cell having a first threshold voltage is changed to a second threshold voltage;
    said control means controlling the second threshold voltage to a voltage lying within a range lower than or equal to a power source voltage and higher than or equal to one half the power source voltage.

19. A semiconductor integrated circuit according to claim 18, wherein said control means sets the amount of change in threshold voltage per pulse-shaped voltage to above 0.4V.

20. A semiconductor integrated circuit according to claim 18, wherein said control means sets the amount of change in threshold voltage per pulse-shaped voltage to above one third the difference between the first threshold voltage and the second threshold voltage.

21. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage;

said control means controlling the second threshold voltage to a voltage lying within a range from below 3.3V to above 2V when a power source voltage is in the neighborhood of 3.3V.

22. A semiconductor integrated circuit according to claim 21, wherein said control means sets the amount of change in threshold voltage per pulse-shaped voltage to above 0.4V.

23. A semiconductor integrated circuit according to claim 21, wherein said control means sets the amount of change in threshold voltage per pulse-shaped voltage to above one third the difference between the first threshold voltage and the second threshold voltage.

24. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage; and wherein a control voltage for turning on a non-selected non-volatile memory cell is supplied to the non-selected non-volatile memory cell upon an read operation, said control means controlling the second threshold voltage so as to reach a voltage lying within a range in which the difference between the second threshold voltage and the control voltage is lower than or equal to the control voltage and is higher than or equal to one half a power source voltage.

25. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage; and wherein a control voltage for turning on a non-selected non-volatile memory cell is supplied to the non-selected non-volatile memory cell upon a read operation, said control means controlling the second threshold voltage so as to reach a voltage lying within a range in which the difference between the second threshold voltage and the control voltage is lower than or equal to 3.3V and is higher than or equal to 2V.

26. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage;

said control means having a first operating mode in which the amount of change in threshold voltage of said non-volatile memory cell, which varies each time said pulse-shaped voltage is applied thereto, is larger than the amount of change in threshold voltage of said non-volatile memory cell in a second operating mode;

wherein said control means has rewrite control means for rewriting data written in said first operating mode in said second operating mode.

27. A semiconductor integrated circuit according to claim 26, wherein a first memory mat in which data is written in said first operating mode, and a second memory mat in which data is written in said second operating mode, are respectively provided in separate form.

28. A semiconductor integrated circuit according to claim 27, further including trimming means capable of trimming the minimum value of said each pulse-shaped voltage.

29. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage;

said control means having a first operating mode in which the amount of change in threshold voltage of said non-volatile memory cell, which varies each time said pulse-shaped voltage is applied thereto, is larger than the amount of change in threshold voltage of said non-volatile memory cell in a second operating mode;

wherein a second threshold voltage of said memory cell which is obtained by said first operating mode is higher than or equal to a second threshold voltage of said memory cell which is obtained by said second operating mode, wherein the data written in said first operating mode is binary data and the data written in said second operating mode is multivalued data.

30. A semiconductor integrated circuit according to claim 29, wherein said control means has rewrite control means which rewrites binary data written in said first operating mode to multivalued data in said second operating mode.

31. A semiconductor integrated circuit according to claim 30, wherein a first memory mat in which data is written in said first operating mode, and a second memory mat in which data is written in said second operating mode, are respectively provided in separate form.

32. A semiconductor integrated circuit according to claim 31, wherein said trimming means is further capable of trimming the rate of gradual increase in pulse width of said each pulse-shaped voltage.

33. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage;

said control means having a first operating mode in which the amount of change in threshold voltage of said non-volatile memory cell, which varies each time said pulse-shaped voltage is applied thereto, is larger than the amount of change in threshold voltage of said non-volatile memory cell in a second operating mode;

wherein a level to be written into said memory cell in said first operating mode is higher than or equal to that in said second operating mode;

wherein the data written in said first operating mode is binary data and the data written in said second operating mode is multivalued data.

34. A semiconductor integrated circuit according to claim 33, wherein said control means has rewrite control means which rewrites binary data written in said first operating mode to multivalued data in said second operating mode.

35. A semiconductor integrated circuit according to claim 34, wherein a first memory mat in which data is written in said first operating mode, and a second memory mat in which data is written in said second operating mode, are respectively provided in separate form.

36. A semiconductor integrated circuit according to claim 34, further including trimming means capable of trimming the minimum value of the pulse width of said each pulse-shaped voltage.

37. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage;

said control means having a first operating mode in which the amount of change in threshold voltage of said non-volatile memory cell, which varies each time said pulse-shaped voltage is applied thereto, is larger than the amount of change in threshold voltage of said non-volatile memory cell in a second operating mode;

wherein a first memory mat in which data is written in said first operating mode, and a second memory mat in which data is written in said second operating mode, are respectively provided in separate form.

38. A semiconductor integrated circuit according to claim 37, wherein said trimming means is further capable of trimming the rate of gradual increase in said each pulse-shaped voltage.

39. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage;

said control means having a first operating mode in which the amount of change in threshold voltage of said non-volatile memory cell, which varies each time said pulse-shaped voltage is applied thereto, is larger than the amount of change in threshold voltage of said non-volatile memory cell in a second operating mode;

wherein, upon said first and second operating modes, said control means fixes values of pulse-shaped voltages and varies the amount of change in threshold voltage according to the difference between pulse widths of the pulse-shaped voltages.

40. A semiconductor integrated circuit comprising:

a plurality of electrically erasable and programmable non-volatile memory cells; and control means for supplying a pulse-shaped voltage to said each non-volatile memory cell until a threshold voltage of said non-volatile memory cell having a first threshold voltage is changed to a second threshold voltage;

said control means having a first operating mode in which the amount of change in threshold voltage of said non-volatile memory cell, which varies each time said pulse-shaped voltage is applied thereto, is larger than the amount of change in threshold voltage of said non-volatile memory cell in a second operating mode;

wherein, upon said first and second operating modes, said control means fixes pulse widths of pulse-shaped voltages and varies the amount of change in threshold voltage according to the difference between values of the pulse-shaped voltages.

* * * * *